US006791187B2

(12) United States Patent
Ema et al.

(10) Patent No.: US 6,791,187 B2
(45) Date of Patent: Sep. 14, 2004

(54) SEMICONDUCTOR STORAGE DEVICE AND METHOD FOR FABRICATING THE SAME

(75) Inventors: Taiji Ema, Kawasaki (JP); Tohru Anezaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/166,620

(22) Filed: Jun. 12, 2002

(65) Prior Publication Data

US 2002/0153614 A1 Oct. 24, 2002

Related U.S. Application Data

(62) Division of application No. 09/637,256, filed on Aug. 14, 2000, which is a division of application No. 09/037,068, filed on Mar. 9, 1998, now Pat. No. 6,395,599, which is a division of application No. 08/592,481, filed on Jan. 26, 1996, now Pat. No. 5,874,756.

(30) Foreign Application Priority Data

Jan. 31, 1995 (JP) .............................................. 7-13748
Nov. 29, 1995 (JP) .............................................. 7-310737

(51) Int. Cl.[7] .......................... H01L 23/48; H01L 23/52; H01L 29/40
(52) U.S. Cl. ...................... 257/750; 257/758; 257/763
(58) Field of Search ................................ 257/750–764; 438/618–628

(56) References Cited

U.S. PATENT DOCUMENTS

| 4,840,923 | A | 6/1989 | Flagello et al. |
| 4,974,040 | A | 11/1990 | Taguchi et al. |
| 5,036,370 | A | 7/1991 | Miyago et al. |
| 5,061,985 | A | 10/1991 | Meguro et al. |
| 5,150,276 | A | 9/1992 | Gonzalez |
| 5,150,278 | A | 9/1992 | Gonzallez et al. .......... 257/296 |

(List continued on next page.)

FOREIGN PATENT DOCUMENTS

| JP | 58-115859 | 7/1983 |
| JP | 3-155663 | 7/1991 |
| JP | 3-167874 | 7/1991 |
| JP | 5-218332 | 8/1993 |
| JP | 6-97190 | 4/1994 |
| JP | 61-176148 | 8/1996 |
| JP | 9-36325 | 2/1997 |

OTHER PUBLICATIONS

1993 VMIC Conference, pp 15–21 and pp 28–34.
1994 VMIC Conference, pp 22–28.
1995 VMIC Conference, pp 491–497.
1993 IEEE, IEDM, pp 817–820.
1994 IEEE, IEDM, pp 927–930 and pp 635–638.
1995 IEEE, IEDM, pp 903–914 and pp 111–114.
Tomihisa Mizuno et al.; IEEE Transactions on Electron Devices, vol. 38, No. 3, pp 584–591; Mar. 1991 (Abstract only).
B. Luther et al.; "Planar Copper–Polyimide Back End of the Line"; Proceedings of 10th International VMIC; pp. 15–21; Jun. 1993.

(List continued on next page.)

*Primary Examiner*—Cuong Nguyen
(74) *Attorney, Agent, or Firm*—Westerman, Hattori, Daniels & Adrian, LLP

(57) ABSTRACT

A semiconductor device includes a semiconductor substrate; an insulating laminate formed over the semiconductor substrate, and including a lower part and a higher part formed over the lower part; a first conductor formed in the higher part of the insulating laminate, an insulator, having an etching characteristic different from the lower part and the higher part of the insulating laminate, formed between the lower part of the insulating laminate and the first conductor, a first contact hole formed through the higher part of the insulating laminate, penetrating inside peripheral edges of the first conductor, reaching the insulator; and a second conductor filled in the first contact hole and electrically connected to the first conductor at its side wall exposed in the first contact hole.

24 Claims, 60 Drawing Sheets

U.S. PATENT DOCUMENTS

| | | | |
|---|---|---|---|
| 5,196,910 A | | 3/1993 | Moriuchi et al. ............ 257/296 |
| 5,204,286 A | * | 4/1993 | Doan ......................... 438/618 |
| 5,281,549 A | | 1/1994 | Fazan et al. ................. 438/256 |
| 5,292,677 A | | 3/1994 | Dennison .................... 438/396 |
| 5,302,551 A | | 4/1994 | Iranmanesh et al. |
| 5,324,681 A | | 6/1994 | Lowrey et al. ............. 438/256 |
| 5,346,844 A | | 9/1994 | Cho et al. |
| 5,389,568 A | | 2/1995 | Yun |
| 5,414,655 A | | 5/1995 | Ozaki et al. |
| 5,479,054 A | * | 12/1995 | Tottori ....................... 257/752 |
| 5,561,311 A | | 10/1996 | Hamamoto et al. |
| 5,573,965 A | | 11/1996 | Chen et al. |
| 5,605,857 A | | 2/1997 | Jost et al. ................... 438/253 |
| 5,612,254 A | | 3/1997 | Mu et al. |
| 5,623,164 A | | 4/1997 | Auer et al. |
| 5,661,344 A | | 8/1997 | Havemann et al. |
| 5,689,126 A | | 11/1997 | Takaishi |
| 5,732,009 A | | 3/1998 | Tadaki et al. |
| 5,760,429 A | * | 6/1998 | Yano et al. ................. 257/758 |
| 5,793,076 A | | 8/1998 | Fazan et al. |
| 5,874,756 A | | 2/1999 | Ema et al. |
| 6,150,689 A | | 11/2000 | Narui et al. |

OTHER PUBLICATIONS

B. M. Somero et al.; "A Modular in–situ Integration Scheme for Deep Submicron", Proceedings of 10$^{th}$ International VMIC; pp. 28–34; Jun. 1993.

M. F. Chisholm et al.; "A High Performance 0.5 um Five–Level Metal Process With Extendibility of Sub–Half Micron"; pp. 22–28; Jun. 1994.

M. Rutten et al.; "Pattern Density Effects in Tungsten CMP"; Proceedings of 12$^{th}$ International VMIC; pp. 491–497; Jun. 1995.

I. Naiki et al.; "Center Wordline Cell: A New Symmetric Layout Cell For 64 Mb SRAM"; Technical Digest of IEDM; pp. 817–820; Dec. 1993.

T. Kaga et al.; "A 0.29–um2 MIM–Crown Cell and Process Technologies for 1–Giogabit DRAMs"; Technical Digest of IEDM; pp. 927–929; Dec. 1994.

H. K. Kang et al.; "Highly Manufacturable Process Technology for Reliable 256 Mbit and 1 Gbit DRAMs"; Technical Digest of IEDM; pp. 635–638; Dec. 1994.

Y. Ohji et al.; "Ta2O5 Capacitors Dielectric Material for Giga–bit DRAMs"; Technical Digest of IEDM; pp. 111–114; Dec. 1995.

Y. Nishioka et al.; "Giga–bit Scale DRAM Cell with New Simple Ru/(Ba,Sr)TiO3/Ru Stacked Capacitors Using X–ray Lithography"; Technical Digest of IEDM; pp. 903–906; Dec. 1995.

K. P. Lee et al.; "A Process Technology for 1 Giga–bit DRAM"; Technical Digest of IEDM; pp. 907–910; Dec. 1995.

J. K. Park et al.; "Isolation Merged Bit Line Cell (IMBC) for 1Gb DRAM and Beyond"; Technical Digest of IEDM; pp. 911–914; Dec. 1995.

\* cited by examiner

MEMORY CELL REGION | PERIPHERAL CIRCUIT REGION

SEMICONDUCTOR STORAGE DEVICE AND METHOD FOR FABRICATING THE SAME

This application is a divisional of prior application Ser. No. 09/637,256 filed Aug. 14, 2000, which is a divisional of application Ser. No. 09/037,068, filed on Mar. 9, 1998 now U.S. Pat. No. 6,395,599, which is a divisional of application Ser. No. 08/592,481, filed on Jan. 26, 1996 now U.S. Pat. No. 5,874,756.

BACKGROUND OF THE INVENTION

The present invention relates to a semiconductor storage device, more specifically to a semiconductor storage device structure which enables highly-integrated DRAMs (Dynamic Random Access Memories) to be fabricated within tiny cell areas and by a small number of fabrication steps, and a method for fabricating the semiconductor storage device structure.

A DRAM is a semiconductor storage device which can be formed of one transistor and one capacitor. Various structures of the DRAM and various methods for fabricating the DRAM have been conventionally studied to fabricate semiconductor storage devices of higher density and higher integration.

FIG. 59 shows a sectional view of the semiconductor storage device described in Japanese Patent Laid-Open Publication No. 176148/1986.

Source diffused layers 24 and drain diffused layers 26 are formed on a semiconductor substrate 10 independent of each other. Gate electrodes 20 are formed, through gate oxide films 16, on parts of the semiconductor substrate 10 between the respective source diffused layers 24 and the respective drain diffused layers 26. Memory cell transistors thus comprising the gate electrodes 20, the source diffused layers 24 and the drain diffused layers 26 are constituted.

On the semiconductor substrate 10 with the memory cell transistors formed thereon there are formed inter-layer insulation film 36 having through-holes 38 which are opened on the drain diffused layers 26 and through-holes 40 which are opened on the source diffused layers 24.

Cylindrical capacitor storage electrodes 46 of polycrystalline silicon are formed on the inside walls of the through-holes 40 and have their bottoms connected to the source diffused layers 24.

Capacitor dielectric films 48 are formed on the inside walls and upper surfaces of the capacitor storage electrodes 46, and parts of the upper surfaces of the source diffused layers 24 exposed inside the through-holes 40.

Capacitor opposed electrodes 54 are formed in the through-holes 40 with the capacitor storage electrodes 46 and the capacitor dielectric films 48 formed thereon, and on the inter-layer insulation film 36. Capacitors thus comprising the capacitor storage electrodes 46, the capacitor dielectric films 48 and the capacitor opposed electrodes 54 are formed.

Polycrystalline silicon is buried in the through-holes 38 and is connected to bit lines 62 through an inter-layer insulation film 53 formed on the capacitor opposed electrodes 54.

Furthermore, a metal wiring layer (not shown) is formed on the top of the bit lines through an inter-layer insulation film (not shown), and a DRAM comprising one-transistor and one-capacitor memory cells is formed.

FIG. 60 shows a sectional view of another semiconductor storage device.

Source diffused layers 24 and drain diffused layers 26 are formed on a semiconductor substrate 10 independent of each other. Gate electrodes 20 are formed, through gate oxide films 16, on parts of the semiconductor substrate 10 between the source diffused layers 24 and the drain diffused layers 26. Memory cell transistors thus comprising the gate electrodes 20, the source diffused layers 24 and the drain diffused layers 26 are constituted.

On the semiconductor substrate 10 with the memory cell transistors formed thereon, there are formed inter-layer insulation film 102 having through-holes 98 which are opened on the drain diffused layers 26 and through-holes 100 which are opened on the source diffused layers 24. Insulation films 42 are formed on the gate electrodes 20, covering the same. Exposed parts of the insulation films 42 in the through-holes 98, 100 are defined by the insulation films 42.

An inter-layer insulation film 36 is formed on the inter-layer insulation film 102. Capacitor storage electrodes 46 of polycrystalline silicon are formed on the inside walls and the bottoms of through-holes 40 formed in the inter-layer insulation film 36. The capacitor storage electrodes 46 are connected to the source diffused layers 24 through polycrystalline silicon films 104 buried in the through-holes 100.

Capacitor dielectric films 48 are formed on the inside surfaces and the upper surfaces of the capacitor storage electrodes 46. Capacitor opposed electrodes 54 are formed in the through-holes 40 with the capacitor storage electrodes 46 and the capacitor dielectric films 48 formed thereon, and on the inter-layer insulation film 36. Capacitors thus comprising the capacitor storage electrodes 46, the capacitor dielectric films 48 and the capacitor opposed electrodes 54 are formed.

Polycrystalline silicon films 106 are buried in the through-holes 98 and are connected to bit lines 62 formed on the capacitor opposed electrodes 54 through the inter-layer insulation film 53.

A metal wiring layer (not shown) is formed on the bit lines through an inter-layer insulation film (not shown), and a DRAM comprising one-transistor and one-capacitor memory cells is formed.

To form DRAM cells, usually 9 lithography steps are necessary for the LOCOS isolation, the formation of the gate electrodes (word lines), the bit line contact holes, the bit lines, the through-holes for the capacitor storage electrodes, the capacitor storage electrodes, the capacitor opposed electrodes, the through-holes for the metal wiring, and the metal wiring.

In lithography steps, an alignment allowance for the gate electrodes and the bit line contact holes, an alignment allowance for the gate electrodes and the through-holes, and an alignment allowance for the through-holes and the bit lines are necessary, which makes the memory cell area accordingly larger.

To improve this disadvantage, the semiconductor storage device described in Japanese Patent Laid-Open Publication No. 176148/1986 uses the above-described structure, so that the capacitor storage electrodes are formed by self-alignment with the through-holes, whereby the lithography steps are decreased by one step.

In the semiconductor storage device of FIG. 60, the capacitor storage electrodes are formed by self-alignment, and in addition thereto the through-holes 98, 100 are formed by self-alignment with the gate electrodes, whereby no alignment allowances for the gate electrodes and the through-holes for the bit line contact and for the gate electrodes and the through-holes for the capacitor storage electrodes are necessary. This can accordingly decrease the memory cell area.

The fabrication of a semiconductor storage device which can be highly integrated by a smaller number of lithography steps and with smaller alignment allowances has been thus proposed.

In the semiconductor storage device described in the specification of Japanese Patent Laid-Open Publication No. 176148/1986, a polycrystalline silicon film is deposited to form the capacitor storage electrodes 46, concurrently being buried in the through-holes 38, whereby the above-described structure is formed. The reason for completely filling the through-holes is as follows.

As disclosed in the specification, the bit lines 62 are made of aluminium (Al) and they thus are the uppermost wiring layer. In addition, to contact the Al to the source-drains or the gate electrodes for peripheral circuits, it is necessary that the insulation film is etched by a larger thickness than a thickness of the bit line contact. The inter-layer insulation film 36 of the bit line contact, however, has no trace of etching, and it is presumed that the peripheral circuit through-holes as well as the through-holes 38 are completely filled with polycrystalline silicon.

The peripheral circuit through-holes are thus completely filled because a contact resistance of a peripheral circuit greatly affects efficiency of operation speed of the circuit, and preferably the through-holes are completely filled to reduce the contact resistance as much as possible. Accordingly, it is necessary to completely fill the bit line contact through-holes concurrently with filling the peripheral circuit through-holes.

In the semiconductor storage device disclosed in Japanese Patent Laid-Open Publication No. 176148/1986, the polycrystalline silicon film buried in the peripheral circuit through-holes must be thicker than a through-hole diameter. This is because since the capacitor storage electrodes 46 are concurrently formed of the polycrystalline silicon, the polycrystalline silicon film of an excessive thickness will decrease an inside wall area of the through-holes 40, with a result of a decreased cell capacitance.

When the through-holes 38, 40 are formed, an alignment allowance for the gate electrodes 20 must be taken into consideration. This increases a cell area and decreases a capacitor forming part.

In the semiconductor storage device of FIG. 60, as described above, the self-alignment contact is formed, and in forming the through-holes 98, 100 it is not necessary to consider an alignment allowance for aligning the through-holes 98, 100 with the gate electrode 20. The through-holes 40 and the bit line contact hole 58 are formed separately from each other, and the bit line contact holes 58 are not filled with polycrystalline silicon. Accordingly, a capacitance does not decrease, as is described in the semiconductor storage device described in Japanese Patent Laid-Open Publication No. 176148/1986.

In the semiconductor storage device of FIG. 60, polycrystalline silicon is buried in the through-holes 98, 100 to connect the source diffused layers 24 to the capacitor storage electrodes 46, and the drain diffused layers 26 to the bit lines 62, and an extra lithography step of opening the filled through-holes 98, 100 is needed. In comparison with the semiconductor storage device described in Japanese Patent Laid-Open Publication No. 176148/1986, one lithography step is added.

SUMMARY OF THE INVENTION

An object of the present invention is to provide a semiconductor storage device and a method for fabricating the same which can decrease a memory cell area by decreasing an alignment allowance in lithography steps, and can decrease a number of the lithography steps.

Another object of the present invention is to provide a semiconductor storage device and a method for fabricating the same which can facilitate etching the contact hole for the capacitor storage electrode, and can decrease a number of fabrication steps.

The above-described objects are achieved by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a first insulation film covering an upper surface and side surfaces of the gate electrode; a second insulation film covering a top of the memory cell transistor and having a first through-hole opened on the first diffused layer and a second through-hole opened on the second diffused layer formed in; a capacitor having a capacitor storage electrode formed on inside walls and a bottom of the first through-hole and connected to the first diffused layer, a capacitor dielectric film formed covering the capacitor storage electrode, and a capacitor opposed electrode formed covering at least a part of the capacitor dielectric film; and a first contact conducting film formed on inside walls and a bottom of the second through-hole and connected to the second diffused layer; a third insulation film formed on the memory cell and having a bit line contact hole formed in; and a bit line formed on the third insulation film and connected to the first contact conducting film of the memory cell through the bit line contact hole. This structure of the semiconductor storage device makes it unnecessary to secure an alignment allowance for alignment of the first through-hole opened on the first diffused layer and the second through-hole opened on the second diffused layer with the gate electrode, which permits the semiconductor storage device to have small memory cell area. It is not necessary to bury the first contact conducting film completely in the second through-hole, which makes it unnecessary to excessively increase the thickness of the capacitor storage electrode, and decrease of the capacitance can be prevented.

The above-described objects are achieved also by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a first insulation film covering an upper surface and side surfaces of the gate electrode; a second insulation film covering a top of the memory cell transistor and having a first through-hole opened on the first diffused layer and a second through-hole opened on the second diffused layer formed in; a first buried conductor buried on a bottom of the first through-hole and connected to the first diffused layer; a second buried conductor buried on a bottom of the second through-hole and connected to the second diffused layer; and a capacitor having a capacitor storage electrode formed on inside walls of the first through-hole and an upper surface of the first buried conductor and connected to the first diffused layer through the first buried conductor, a capacitor dielectric film formed covering the capacitor storage electrode, and a capacitor opposed electrode formed covering at least a part of the capacitor dielectric film; and a first contact conducting film formed on inside walls of the second through-hole and an upper surface of the second buried conductor and connected to the second diffused layer through the second buried conductor; a third insulation film formed on the memory cell and having a bit line contact hole formed in; and a bit line formed on the third insulation film and connected to the first contact conducting film of the memory cell through the bit line contact hole. In this structure of the semiconductor storage device, in forming the through-holes, etc. having high aspect ratios, buried conductors of low resistance are beforehand formed in the region contacting the semiconductor substrate to form an ohmic contact. This ensures contact characteristics at the bottoms of the through-holes even in a case that the through-holes have a higher aspect ratio as the device are higher integrated.

The above-described objects can be achieved also by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a second insulation film covering a top of the memory cell transistor, and having a first through-hole opened on the first diffused layer, a second through-hole opened on the second diffused layer and an opening having a larger opening diameter than the first through-hole and formed in a region spaced from the semiconductor substrate, surrounding the first through-hole; a capacitor having a capacitor storage electrode formed on inside walls and a bottom of the opening and on inside walls and a bottom of the first through-hole, a capacitor dielectric film formed covering the capacitor storage electrode, and a capacitor opposed electrode, covering at least a part of the capacitor dielectric film; and a first contact conducting film formed on inside walls and a bottom of the second through-hole and connected to the second diffused layer; a third insulation film formed on the memory cell and having a bit line contact hole formed in; and a bit line formed on the third insulation film and connected to the first contact conductor film of the memory cell through the bit line contact hole. This structure of the semiconductor storage device makes it possible to make the opening diameter of the through-holes very small without decrease of a capacitance, whereby short-circuit between the bit lines and the word lines due to dust staying in the through-holes can be prevented.

In the above-described semiconductor storage device, it is preferable that the capacitor storage electrode has a first columnar conductor formed in the first through-hole, spaced from the inside walls of the first through-hole; and the first contact conducting film has a second columnar conductor formed in the second through-hole, spaced from the inside walls of the second through-hole. The first columnar conductor also functions as the capacitor storage electrodes, whereby the capacitance can be drastically increased. The wiring between the second diffused layer and the bit line is formed of the first contact conducting film and the second columnar conductor, whereby the wiring resistance of the wiring between the second diffused layer to the bit line can be decreased.

In the above-described semiconductor storage device, it is preferable that the second insulation film in a region contacting the first insulation film is formed of a material having etching characteristics different from those of the first insulation film. In this structure of the semiconductor storage device, the first insulation film can be used as an etching stopper in opening the through-holes, and the openings on the substrate can be formed by self-alignment. Accordingly, it is not necessary to ensure an alignment allowance with the gate electrode in forming the through-holes. The semiconductor storage device can have a small memory cell area.

In the above-described semiconductor storage device, it is preferable that the first insulation film is silicon nitride film; and the material having etching characteristics different from those of the first insulation film is silicon oxide film or impurity-doped silicon oxide film.

In the above-described semiconductor storage device, it is preferable that the capacitor storage electrode further includes a columnar conductor projected in a column-shape in the opening out of the first through-hole, whereby the capacitor storage electrode has an increased area by that of the columnar conductor, and an increased capacitance can be obtained.

In the above-described semiconductor storage device, it is preferable that the device further comprises a sidewall insulation film formed on the inside walls of the bit line contact hole; and the bit line is insulated with respect to the capacitor opposed electrode by the sidewall insulation film. The structure of the semiconductor storage device permits the lithography step of forming the capacitor opposed electrode and the lithography step of forming the bit line contact hole to be concurrently conducted.

In the above-described semiconductor storage device, it is preferable that the device further comprises a peripheral circuit transistor formed on the semiconductor substrate on a periphery of a memory cell region where the memory cell is formed, and a wiring layer formed on the second insulation film and formed of the same conducting layer as the bit line; and the wiring layer is directly connected to a gate electrode, a first diffused layer or a second diffused layer of the peripheral circuit transistor. This structure of the semiconductor storage device permits the above-described semiconductor storage device to be fabricated without sacrificing operational speeds of peripheral circuits.

In the above-described semiconductor storage device, it is preferable that the device further comprises a peripheral circuit transistor formed on the semiconductor substrate on a periphery of the memory cell region where the memory cell is formed, a fourth insulation film formed on the bit line, and a wiring layer formed on the fourth insulation film; and in which the wiring layer is directly connected to a gate electrode, a first diffused layer or a second diffused layer of the peripheral circuit transistor. This structure of the semiconductor storage device permits the semiconductor storage device to be fabricated without adding to the number of steps of the fabrication and without sacrificing operational speeds of peripheral circuits.

In the above-described semiconductor storage device, it is preferable that the wiring layer is directly connected to the gate electrode, the first diffused layer or the second diffused layer of the peripheral circuit transistor, the capacitor opposed electrode, or the bit line. This structure of the semiconductor storage device permits the semiconductor storage device to be fabricated without adding to the number of steps of the fabrication and without sacrificing operational speeds of peripheral circuits.

In the above-described semiconductor storage device, it is preferable that the device further comprises an etching protection pattern provided directly below the bit line in a region where the bit line and the wiring layer are connected to each other and having the same structure of a laminated film of the capacitor opposed electrode and the third insulation film. This structure of the semiconductor storage device allows the deep through-holes formed in the peripheral circuit region and the shallow through-holes formed on the bit lines or the capacitor opposed electrodes to be concurrently opened without generating short-circuits between the bit line and the semiconductor substrate.

In the above-described semiconductor storage device, it is preferable that the device further comprises a peripheral circuit transistor formed on the semiconductor substrate on a periphery of the memory cell region where the memory cell is formed, and a wiring layer formed on the third insulation film and formed of the same conducting layer as the bit line; and in which the capacitor opposed electrode and the third insulation film are formed extended in a region where the peripheral circuit transistor is formed, and the wiring layer is directly connected to a gate electrode, a first diffused layer or a second diffused layer of the peripheral circuit transistor. This structure of the semiconductor storage device makes it possible to form the wiring layers of peripheral circuits without adding to the number of fabrication steps.

In the above-described semiconductor storage device, it is preferable that the device further comprises a peripheral circuit transistor formed on the semiconductor substrate on a periphery of the memory cell region where the memory cell is formed, and a second contact conductor film formed on inside walls and a bottom of a third through-hole formed in the second insulation film on a gate electrode, a first diffused layer or a second diffused layer of the peripheral circuit transistor; and in which the gate electrode, the first diffused layer or the second diffused layer of the peripheral circuit transistors are connected, through the second contact conducting film, to a wiring layer formed on the second insulation film. This structure of the semiconductor storage device makes it possible to fabricate the above-described semiconductor storage device without adding to the number of fabrication steps.

In the above-described semiconductor storage device, it is preferable that the device further comprises a third buried conductor formed on a bottom of the third through-hole; and in which the second contact conducting film is connected to the gate electrode, the first diffused layer or the second diffused layer of the peripheral circuit transistor through the third buried conductor. In this structure of the semiconductor storage device, in forming the through-holes, etc. having high aspect ratios, buried conductors of low resistance are beforehand formed in the region contacting the semiconductor substrate to form an ohmic contact. This ensures good contact characteristics at the bottoms of the through-holes even in a case that the through-holes have a higher aspect ratio as the device becomes more higher integrated.

In the above-described semiconductor storage device, it is preferable that the second insulation film is a laminated film of a plurality of insulation materials having different etching characteristics from each other. This structure of the semiconductor storage device makes it easy to open the through-holes even when the through-holes have a high aspect ratio.

In the above-described semiconductor storage device, it is preferable that the laminated film comprises a silicon nitride film, and silicon oxide films sandwiching the silicon nitride film.

In the above-described semiconductor storage device, it is preferable that the laminated film comprises a silicon nitride film laid on a silicon oxide film.

The above-described objects can be achieved also by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a first insulation film covering an upper surface and side surfaces of the gate electrode; a second insulation film covering a top of the memory cell transistor and having a first through-hole opened on the first diffused layer; and a capacitor having a capacitor storage electrode having contact formed on inside walls and a bottom of the first through-hole and connected to the first diffused layer and having a projection formed projecting on the second insulation film and connected to the contact, a capacitor dielectric film formed covering the capacitor storage electrode, and a capacitor opposed electrode formed covering at least a part of the capacitor dielectric film. This structure of the semiconductor storage device permits constituting the capacitor with the inside walls and the outside walls of the projection, which can increase the capacitance.

In the above-described semiconductor storage device, it is preferable that the device further comprises a third insulation film formed on the memory cell and having bit line contact hole reaching the second diffused layer through the second insulation film formed in; and a bit line formed on the third insulation film and connected to the second diffused layer of the memory cell through the bit line contact hole.

In the above-described semiconductor storage device, it is preferable that a second through-hole is formed in the second insulation film and is opened on the second diffused layer; and which further comprises a contact conducting film formed on inside walls and a bottom of the second through-hole and connected to the second diffused layer, and a bit line formed on the memory cell through the third insulation film and connected to the contact conducting film.

In the above-described semiconductor storage device, it is preferable that the second insulation film comprises a silicon nitride film and a silicon oxide film; the silicon nitride film is formed on the gate electrode; the silicon oxide film is formed on the silicon nitride film; and the third insulation film comprises a silicon oxide film. This structure of the semiconductor storage device makes it easy to form the projection, and capacitance deviations can be reduced.

In the above-described semiconductor storage device, it is preferable that the first contact conducting film, the second contact conducting film or the capacitor storage electrode are formed of a conducting material which contacts n-silicon and p-silicon. This structure of the semiconductor storage device can improve contact characteristics with the silicon substrate as the semiconductor substrate.

In the above-described semiconductor storage device, it is preferable that the bit line contact hole is elongated in the direction of the bit line. This structure of the semiconductor storage device allows the bit lines and the word lines to be arranged in minimum process dimensions. The semiconductor storage device can have a small memory cell area.

In the above-described semiconductor storage device, it is preferable that the bit line has a film thickness which is below half a gap between the bit lines. This structure of the semiconductor storage device allows capacity coupling between the bit lines to be reduced.

The above-described objects can be achieved also by a semiconductor storage device comprising: a plurality of bit lines arranged parallel with each other; a plurality of word lines arranged parallel with each other and intersecting said plurality of bit lines; sense amplifiers disposed on one end of the respective bit lines; decoders disposed on one end of the respective word lines; and above-described memory cells respectively disposed at intersections of the bit lines and the word lines; said plural sense amplifiers being divided into two groups, the groups of the sense amplifiers being disposed respectively on opposed sides of a memory cell region where the memory cells are formed; said plural decoders being divided into two groups, the groups of the decoders being disposed respectively on opposed sides of the memory cell region where the memory cells are formed This structure of the semiconductor storage device allows a peripheral circuit to be connected to the bit lines and the word lines to be arranged with minimum processing dimensions.

The above-described objects can be achieved also by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a second insulation film covering a top of the memory cell transistor and having a first through-hole opened on the first diffused layer and a second through-hole opened on the second diffused layer; a buried conductor buried in the first through-hole: and a capacitor having a capacitor storage electrode formed on the second insulation film and connected to the first diffused layer through the buried conductor, a capacitor dielectric film formed covering the capacitor storage electrode and a capacitor opposed electrode formed covering at least a part of the capacitor dielectric film; and a bit line formed on the second insulation film and connected to the second diffused layer through the second through-hole; the buried conductor and the bit line being formed of the same conducting layer. This structure of the semiconductor storage device can reduce the etching time for opening the through-holes for contact with the capacitor storage electrode, whereby the exposure of the bit line in the etching can be prevented.

In the above-described semiconductor storage device, it is preferable that the buried conductor is formed on sidewalls and a bottom of the first through-hole.

In the above-described semiconductor storage device, it is preferable that the first through-hole and the second through-hole are formed spaced outward from the gate electrode.

In the above-described semiconductor storage device, is preferable that an upper surface and side surfaces of the bit line are covered with a first insulation film which functions as an etching stopper with respect to a third insulation film formed on the bit line. This structure of the semiconductor storage device can reduce damage to the bit line in opening the through-hole for contact with the capacitor storage electrode.

In the above-described semiconductor storage device, it is preferable that the third insulation film has a third through-hole formed in, the buried conductor being exposed in the third through-hole; and the capacitor dielectric film is formed on sidewalls and a bottom of the third through-hole. This structure of the semiconductor storage device can reduce the height difference between the peripheral circuit region and the memory cell region, which permits the design rule of the wiring layers formed thereabove to be reduced.

The above-described objects can be achieved also by a semiconductor storage device comprising: a memory cell including: a memory cell transistor having a first diffused layer and a second diffused layer formed in a semiconductor substrate, and a gate electrode formed through a gate insulation film on the semiconductor substrate between the first diffused layer and the second diffused layer; a first insulation film covering a top of the memory cell transistor and having a first through-hole opened on the first diffused layer and a second through-hole opened on the second diffused layer; a buried conductor buried in the first through-hole: and a capacitor having a capacitor storage electrode formed on the first insulation film and connected to the first diffused layer through the buried conductor, a capacitor dielectric film formed covering the capacitor storage electrode and a capacitor opposed electrode formed covering at least a part of the capacitor dielectric film; and a bit line formed on the first insulation film and connected to the second diffused layer through the second through-hole; the buried conductor and the bit line being formed of the same conducting layer. This structure of the semiconductor storage device can reduce the etching time for opening the through-holes for contact with the capacitor storage electrode, whereby the exposure of the bit line in the etching can be prevented.

In the above-described semiconductor storage device, it is preferable that the buried conductor is formed on sidewalls and a bottom of the first through-hole.

In the above-described semiconductor storage device, it is preferable that the first through-hole and the second through-hole are formed spaced outward from the gate electrode.

In the above-described semiconductor storage device, is preferable that an upper surface and side surfaces of the bit line are covered with an insulation film which functions as an etching stopper with respect to a second insulation film formed on the bit line. This structure of the semiconductor storage device can reduce damage to the bit line in opening the through-hole for contact with the capacitor storage electrode.

In the above-described semiconductor storage device, it is preferable that the second insulation film has a third through-hole formed in, the buried conductor being exposed in the third through-hole; and the capacitor dielectric film is formed on sidewalls and a bottom of the third through-hole. This structure of the semiconductor storage device can reduce the height difference between the peripheral circuit region and the memory cell region, which permits the design rule of the wiring layers formed thereabove to be reduced.

The above-described objects can be achieved also by a method for fabricating a semiconductor storage device comprising: a gate electrode forming step of depositing a first conducting film and a first insulation film the latter on the former on a semiconductor substrate and then patterning the first conducting film and the first insulation film to form gate electrodes formed of the first conducting film and having upper surfaces covered with the first insulation film; a diffused layer forming step of doping the semiconductor substrate with an impurity with the gate electrodes as a mask to form first diffused layers and second diffused layers; a first sidewall insulation film forming step of forming first sidewall insulation films on sidewalls of the gate electrodes; a first insulation film forming step of forming a second insulation film having first through-holes and second through-holes formed in, the first through-holes being opened on the first diffused layer, the second through-holes being opened on the second diffused layer; a second conducting film depositing step of depositing a second conducting film on the semiconductor substrate having the second insulation film formed on; a conducting film removing step of removing the second conducting film on the second insulation film, leaving the second conducting film in the first through-holes and the second through-holes to form capacitor storage electrodes of the second conducting film in the first through-holes and first contact conducting films of the second conducting film formed in the second through-holes; and a capacitor opposed electrode forming step of depositing a third insulation film to be capacitor dielectric films and a third conducting film to be capacitor opposed electrodes on the semiconductor substrate with the capacitor storage electrodes and the first contact conducting film and then patterning the third conducting film to form the capacitor opposed electrodes. The method for fabricating a semiconductor storage device enables the semiconductor storage device having a small memory cell area to be fabricated without increasing the electric resistance between the bit lines and the second diffused layers and without decreasing the capacitance.

In the above-described method for fabricating a semiconductor storage device, it is preferable that in the capacitor opposed electrode forming step, a fourth insulation film deposited on the third conducting film and the third conducting film are patterned to form the capacitor opposed electrodes and bit line contact holes opened on the second through-holes; and which further comprises a second sidewall insulation film forming step of depositing a fifth insulation film after the capacitor opposed electrode forming step and anisotropically etching the fifth insulation film for second sidewall insulation films on inside walls of the bit line contact holes while concurrently therewith removing the third insulation films on bottoms of the bit line contact holes; and a bit line forming step of forming bit lines formed on the fourth insulation film and connected to the first contact conducting film exposed in the bit line contact holes. This method permits the lithography step of forming the capacitor opposed electrodes and the lithography step of forming the bit line contact holes to be simultaneously conducted.

The above-described objects can be achieved also by a method for fabricating a semiconductor storage device comprising: a gate electrode forming step of depositing a first conducting film and a first insulation film the latter on the former on a semiconductor substrate and then patterning the first conducting film and the first insulation film to form first gate electrodes of the first conducting film having upper surfaces covered with the first insulation film in a first region for memory cell transistors to be formed in and second gate electrodes of the first conducting film having upper surfaces covered with the first insulation film in a second region for peripheral circuit transistors to be formed in; a diffused layer forming step of doping the semiconductor substrate with an impurity with the gate electrodes as a mask to form in the first region first diffused layers and second diffused layers of the memory cell transistors and in the second region first diffused layers and second diffused layers of the peripheral circuit transistors; a first sidewall insulation film forming step of forming first sidewall insulation films on sidewalls of the gate electrodes; a first insulation film forming step of forming a second insulation film having first through-holes and second through-holes formed in, the first through-holes being opened on the first diffused layer of the memory cell transistors, the second through-holes being opened on the second diffused layers of the memory cell transistors; a second conducting film depositing step of depositing a second conducting film on the semiconductor substrate having the second insulation film formed on; a conducting film removing step of removing the second conducting film on the second insulation film, leaving the second conducting film in the first through-holes and the second through-holes to form capacitor storage electrodes of the second conducting film formed in the first through-holes and the first contact conducting film of the second conducting film formed in the second through-holes; a bit line contact hole forming step of depositing a third insulation film to be capacitor dielectric films, a third conducting film to be capacitor opposed electrodes and a fourth insulation film on the capacitor storage electrodes and the first contact conducting film and then patterning the fourth insulation film and the third conducting film to form the capacitor opposed electrodes and bit line contact holes opened on the second through-holes; a second sidewall insulation film forming step of depositing a fifth insulation film on the fourth insulation film with the bit line contact holes and then anisotropically etching the fifth insulation film to form second sidewall insulation films on inside walls of the bit line contact holes while concurrently therewith removing the third insulation film on bottoms of the bit line contact holes; a second through-hole forming step of forming third through-holes opened on the fourth insulation film on the capacitor opposed electrodes and fourth through-holes formed in the second insulation film opened on the first diffused layers or the second diffused layers of the peripheral circuit transistors, or the second gate electrodes; and a wiring layer forming step of forming bit lines connected to the first contact conducting film exposed in the bit line contact holes, first wiring layers connected to the capacitor opposed electrodes through the third through-hole and second wiring layers connected to the peripheral circuit transistors through the fourth through-holes. This method allows the semiconductor storage device to be fabricated without sacrificing operational speeds of peripheral circuits.

In the above-described method for fabricating a semiconductor storage device, it is preferable that the method further comprises: after the second sidewall insulation film forming step, a bit line forming step of forming bit lines connected to the contact conducting film exposed in the bit line contact holes, a second insulation film forming step of forming a sixth insulation film on the semiconductor substrate with the bit line formed thereon; and in which in the second through-hole forming step, third through-holes reaching the capacitor opposed electrodes are formed in the sixth insulation film and the fourth insulation film, and fourth through-holes reaching the first diffused layers or the second diffused layers of the peripheral circuit transistors, or the second gate electrodes are formed in the sixth insulation film and the second insulation film; and in the wiring layer forming step, first wiring layers connected to the capacitor opposed electrodes through the third through-holes, and second wiring layers connected to the peripheral circuit transistors through the fourth through-holes are formed. This method can fabricate the semiconductor storage device without adding to the number of fabrication steps and sacrificing operational speeds peripheral circuits.

In the above-described method for fabricating a semiconductor storage device, it is preferable that in the second through-hole forming step, when fifth through-holes for connecting the bit lines and the wiring layers are formed, in the bit line contact hole forming step, an etching protection pattern of the laminated film of the third conducting film and the fourth insulation film is formed on the second insulation film in a region where contact holes for connecting the bit lines and the wiring layers are to be formed. This method can prevent etching of the second insulation film directly below the bit lines even in opening the deep through-holes in the peripheral circuit region, whereby short-circuit between the bit lines and the semiconductor substrate can be prevented.

The above-described objects can be achieved also by a method for fabricating a semiconductor storage device comprising: a gate electrode forming step of depositing a first conducting film and a first insulation film the latter on the former on a semiconductor substrate and then patterning the first conducting film and the first insulation film to form first gate electrodes of the first conducting film having upper surfaces covered with the first insulation film in a first region where memory cell transistors are to be formed and second gate electrodes having upper surfaces covered with the first insulation film in a second region where peripheral circuit transistors are to be formed; a diffused layer forming step of doping the semiconductor substrate with an impurity with the gate electrodes as a mask to form first diffused layers and second diffused layers of the memory cell transistors in the first region and first diffused layers and second diffused layers of the peripheral circuit transistors in the second region; a first sidewall insulation film forming step of forming first sidewall insulation films on sidewalls of the gate electrodes; a first insulation film forming step of forming a second insulation film having first through-holes and second through-holes formed in, the first through-holes being opened on the first diffused layers of the memory cell transistors, the second through-holes being opened on the second diffused layers of the memory cell transistors; a second conducting film depositing step of depositing a second conducting film on the semiconductor substrate having the second insulation film formed on; a conducting film removing step of removing the second conducting film on the second insulation film, leaving the second conducting film in the first through-holes and the second through-holes to form capacitor storage electrodes of the second conducting film formed in the first through-holes and first contact conducting film of the second conducting film formed in the second through-holes; a bit line contact hole forming step of depositing a third insulation film to be capacitor dielectric films, a third conducting film to be capacitor opposed electrodes and a fourth insulation film on the capacitor storage electrodes and the first contact conducting film and then patterning the fourth insulation film and the third conducting film to form the capacitor opposed electrodes and bit line contact holes opened on the second through-holes and to open third through-holes onto the third insulation film which are to be opened on the first diffused layers or the second diffused layers of the peripheral circuit transistors or the second gate electrodes; and a second through-hole forming step of selectively forming a photo-resist covering the bit line contact holes and then etching the third insulation film in the third through-holes and the second insulation film to form the third through-holes extending to the first diffused layers or the second diffused layers of the peripheral circuit transistors or the second gate electrodes. This method requires no subtle alignment in opening the through-holes in the peripheral circuit region, which simplifies the lithography steps.

In the above-described method for fabricating a semiconductor storage device, it is preferable that the bit line contact hole forming step, the third insulation film to be capacitor dielectric films, the third conducting film to be capacitor opposed electrodes, the fourth insulation film and a mask film functioning as an etching stopper are successively deposited on the capacitor storage electrodes and the second conducting film, and then the mask film, the fourth insulation film and the third conducting film are patterned, to form the capacitor opposed electrodes and bit line contact holes opened on the second through-holes, and to open onto the third insulation film the third through-holes which are to be opened on the first diffused layers or the second diffused layers of the peripheral circuit transistors or the second gate electrodes; and in the second through-hole forming step, a photo-resist for covering the bit line contact holes is selectively formed, and then with the mask film and the photo-resist as an etching mask, the third insulation film in the third through-holes and the second insulation film are etched to form the third through-holes extending to the first diffused layers or the second diffused layers of the peripheral circuit transistors or the second gate electrodes. This method can simplify the lithography steps.

In the above-described method for fabricating a semiconductor storage device, it is preferable that the mask film is silicon film.

The above-described objects can be achieved also by a method for fabricating a semiconductor storage device comprising: a gate electrode forming step of depositing a first conducting film and a first insulation film the latter on the former on a semiconductor substrate and then patterning the first conducting film and the first insulation film to form first gate electrodes of the first conducting film having upper surfaces covered with the first insulation films in a first region where memory cell transistors are to be formed and to form second gate electrodes of the first conducting film having upper surfaces covered with the first insulation film in a second region where peripheral circuit transistors are to be formed; a diffused layer forming step of doping the semiconductor substrate with an impurity with the gate electrodes as a mask to form first diffused layers and second diffused layers of the memory cell transistors in the first region and to form first diffused layers and second diffused layers of the peripheral circuit transistors in the second region; a first sidewall insulation film forming step of forming first sidewall insulation films on sidewalls of the gate electrodes; a first insulation film forming step of forming a second insulation film having first-through holes, second through-holes, and third through-holes formed in, the first through-holes being opened on the first diffused layers of the memory cell transistors, the second through-holes being opened on the second diffused layers of the memory cell transistors and the third through-holes opened on the first diffused layer or the second diffused layers of the peripheral circuit transistors or the second gate electrodes; a second conducting film depositing step of depositing a second conducting film on the semiconductor substrate having the second insulation film formed on; a conducting film removing step of removing the second conducting film on the second insulation film, leaving the second conducting film in the first through-holes, the second through-holes and the third through-holes to form capacitor storage electrodes of the second conducting film formed in the first through-holes, first contact conducting films of the second conducting film formed in the second through-holes and second contact conducting films of the second conducting film formed in the third through-holes; a bit line contact hole forming step of depositing a third insulation film to be capacitor dielectric films, a third conducting film to be capacitor opposed electrodes and a fourth insulation film on the semiconductor substrate with the capacitor storage electrodes, the first contact conducting films and the second contact conducting films formed on and then patterning the fourth insulation film and the third conducting film to form the capacitor opposed electrodes and bit line contact holes opened on the second through-holes; a second sidewall insulation film forming step of depositing a fifth insulation film on the fourth insulation film with the bit line contact holes formed in and then anisotropically etching the fifth insulation film to form second sidewall insulation films on inside walls of the bit line contact holes while concurrently therewith removing the third insulation film on bottoms of the bit line contact holes; and a wiring layer forming step of forming bit lines connected to the first contact conducting films exposed in the bit line contact holes and wiring layers connected to the second contact conducting films formed in the third through-holes. This method can fabricate the semiconductor storage device without adding to the number of fabrication steps.

In the above-described method for fabricating a semiconductor storage device, it is preferable that in the capacitor opposed electrode forming step, a third conducting film is buried in the first through-holes or the second through-holes to planarize a surface of the third conducting film. This method can simultaneously conduct the lithography step of forming the capacitor opposed electrodes and the lithography step of forming the bit line contact holes.

In the above-described method for fabricating a semiconductor storage device, it is preferable that the method further comprises: after the second conducting film depositing step, a third sidewall insulation film forming step of depositing a seventh insulation film and anisotropically etching the seventh insulation film to form third sidewall insulation films on inside walls of the first through-holes and the second through-holes with the second conducting film formed thereon, and a fourth conducting film depositing step of depositing a fourth conducting film to fill the first through-holes and the second through-holes having the third sidewall insulation films formed on; and further comprising: after the conducting film removing step, a columnar conductor forming step of removing the third sidewall insulation film to form first columnar conductors of the fourth conducting film in the first through-holes and second columnar conductors of the fourth conducting film in the second through-holes, in the conducting film removing step, the fourth conducting film, the second conducting film and the second insulation film are removed until surfaces of the third sidewall insulation films are exposed. This method can fabricate the first columnar conductors so as to function as the capacitor storage electrodes and the second columnar conductors so as to function as the wiring between the second diffused layers and the bit lines, whereby the capacitance can be drastically increased and the wiring resistance of the wiring between the second diffused layers-the bit lines can be decreased. This method can also prevent, in polishing the second conducting film, the polishing agent, etc. from intruding into the through-holes, whereby resultant low yields can be precluded.

In the above-described method for fabricating a semiconductor storage device, it is preferable that in the first insulation film forming step, a second insulation film is deposited and then is polished to planarize a surface of the second insulation film before the through-holes are formed. This method can improve the global planarization on the second insulation film, whereby the depth of focus for opening the through-holes can be small, and micronized patterns can be made.

In the above-described method for fabricating a semiconductor storage device, it is preferable that in the conducting film removing step, a surface of the semiconductor substrate is polished to remove the second conducting film on the second insulation film. This method can easily form the capacitor storage electrodes and the contact conducting films having the through-holes whose configurations are aligned.

In the above-described method for fabricating a semiconductor storage device, it is preferable that in the first insulation film forming step, a second insulation film is formed of a laminated film of a plurality of insulation materials having different etching characteristics from each other, and the insulation materials are etched one by one to open the through-holes. This method can easily open through-holes having high aspect ratios.

In the above-described method for fabricating a semiconductor storage device, it is preferable that the method further comprises: after the second conducting film depositing step, a photo-resist application step of applying a photo-resist to the second conducting film to fill the first through-holes, the second through-holes or the third through-holes; and after the conducting film removing step, a photo-resist releasing step of releasing the photo-resist buried in the through-holes, the second through-holes or the third through-holes,in the conducting film removing step, the second conducting film and the photo-resist on the second insulation film are removed, leaving the second conducting film and the photo-resist in the first through-holes, the second through-holes or the third through-holes. This method can prevent, in polishing the second conducting film, the polishing agent, etc. from intruding into the through-holes, whereby resultant low yields can be precluded.

In the above-described method for fabricating a semiconductor storage device, it is preferable that the method further comprises: after the second conducting film depositing step, an insulation film depositing step of depositing a eighth insulation film having etching characteristics different from those of the second insulation film to fill the first through-holes the second through-holes or the third through-holes; after the conducting film removing step, an insulation film removing step of removing the eighth insulation film buried in the first through-holes, the second through-holes or the third through-holes, in the conducting film removing step, a second conducting film and the eighth insulation film on the second insulation film are removed, leaving the second conducting film and the eighth insulation film in the first through-holes, the second through-holes and third through-holes. This method can prevent, in polishing the second conducting film, the polishing agent, etc. from intruding into the through-holes, whereby resultant low yields can be precluded.

In the above-described method for fabricating a semiconductor storage device, it is preferable that the second insulation film is a laminated film having an insulation film having on a surface thereof etching characteristics different from those of the eighth insulation film. This method makes it possible to selectively remove, after the polishing, only the insulation film buried in the through-holes.

In the above-described method for fabricating a semiconductor storage device, it is preferable that the method further comprises: after the second conducting film depositing step, an insulation film depositing step of depositing a eighth insulation film having etching characteristics substantially the same as those of the second insulation film to fill the first through-holes, the second through-holes or the third through-holes; and after the conducting film removing step, an insulation film removing step of removing the eighth insulation film buried in first through-holes, the second through-holes or the third through-holes, leaving the second conducting film and the eighth insulation film in the first through-holes, the second through-hole or the third through-holes. This method can prevent, in polishing the second conducting film, the polishing agent, etc. from intruding into the through-holes, whereby resultant low yields can be precluded.

In the above-described method for fabricating a semiconductor storage device, it is preferable that the second insulation film is a laminated film of an insulation film having substantially the same etching characteristics as those of the eighth insulation film deposited on an insulation film having etching characteristics different from those of the eighth insulation film, in the insulation film removing step a eighth insulation film and the insulation film having substantially the same etching characteristics are removed. This method makes it possible to selectively remove, in the insulation film removing step, the eighth insulation film and the insulation film having substantially the same etching characteristics as the eighth insulation film.

The above-described objects can be achieved also by a method for fabricating a semiconductor storage device comprising: a gate electrode forming step of depositing a first conducting film and a first insulation film the latter on the former on a semiconductor substrate and then patterning the first conducting film and the first insulation film to form first gate electrodes of the first conducting film having upper surfaces covered with the first insulation film in a first region where memory cell transistors are to be formed, and second gate electrodes of the first conducting film having upper surfaces covered with the first insulation film in a second region where peripheral circuit transistors are to be formed; a diffused layer forming step of doping the semiconductor substrate with an impurity with the gate electrodes as a mask to form first diffused layers and second diffused layers of the memory cell transistors in the first region, and first diffused layers and second diffused layers of the peripheral circuit transistors in the second region; a first sidewall insulation film forming step of forming first sidewall insulation films on sidewalls of the gate electrodes; a first insulation film forming step of depositing a second insulation film on the semiconductor substrate with the first sidewall insulation films and then planarizing a surface of the second insulation film; a third insulation film forming step of forming a third insulation film having etching characteristics different from those of the second insulation film on the planarized second insulation film; a through-hole forming step of patterning the second insulation film and the third insulation film to open first through-holes to be opened on the first diffused layers, second through-holes to be opened on the second diffused layers, and third through-holes to be opened on the first diffused layers or the second diffused layers of the peripheral circuit transistors, or the second gate electrodes; a second conducting film depositing step of depositing a second conducting film having the through-holes formed in on the semiconductor substrate; a buried conductor forming step of polishing a surface of the second conducting film until the third insulation film is exposed on a surface to form first buried conductors buried in the first through-holes, second buried conductors buried in the second through-holes and third buried conductors buried in the third through-holes; a third insulation film forming step of forming a fourth insulation film with fourth through-holes opened on the first buried conductors, fifth through-holes opened on the second buried conductors and sixth holes opened on the third buried conductors; a third conducting film depositing step of depositing a third conducting film on the semiconductor substrate with the fourth insulation film formed; and a conducting film removing step of removing the third conducting film on the fourth insulation film, leaving the second conducting film in the fourth through-holes, the fifth through-holes and the sixth through-holes to form capacitor storage electrodes of the third conducting film in the fourth through-holes, first contact conducting film of the third conducting film formed in the fifth through-holes and second contact conducting film of the third conducting film formed in the sixth contact holes. This method can secure good contact characteristics at the bottoms of the through-holes even in the case that the through-holes have higher aspect ratios with higher device integration.

In the above-described method for fabricating a semiconductor storage device, it is preferable that in the conducting film removing step, a surface of the semiconductor substrate is polished to remove the third conducting film on a surface of the fourth insulation film. This method can form the buried conductors simultaneously with planarization of the insulation film.

In the above-described method for fabricating a semiconductor storage device, it is preferable that the first sidewall insulation films and the first insulation film function as an etching stopper for forming the through-holes; and the through-holes are formed by self-alignment with the first insulation film and the first sidewall insulation films. This method can easily expose the first diffused layers and the second diffused layers on the bottoms of the through-holes.

The above-described objects can be achieved also by a method for fabricating a semiconductor storage device comprising: a gate electrode forming step of depositing and patterning a first conducting film on a semiconductor substrate to form gate electrodes of the first conducting film; a diffused layer forming step of doping the semiconductor substrate with an impurity with the gate electrodes as a mask to form first diffused layers and second diffused layers; a first insulation film forming step of forming a first insulation film having first through-holes and second through-holes formed in, the first through-holes opened on the first diffused layers and the second through-holes opened on the second diffused layers; an opening forming step of forming openings in the first insulation film, surrounding the first through-holes, the opening having a larger diameter than the first through-holes and not reaching the semiconductor substrate; a second conducting film depositing step of depositing a second conducting film on the semiconductor substrate having the first insulation film formed on; a conducting film removing step of removing the second conducting film on the first insulation film, leaving the second conducting film in the second through-holes and the openings to form capacitor storage electrodes of the second conducting film formed in the openings and first contact conducting film of the second conducting film formed in the second through-holes; and a capacitor opposed electrodes forming step of depositing a second insulation film to be capacitor dielectric films and a third conducting film to be capacitor opposed electrodes on the semiconductor substrate with the capacitor storage electrodes and the first contact conducting film formed on and then patterning the third conducting film to form the capacitor opposed electrodes. This method can space the gate electrodes and the through-holes from each other, whereby short-circuit between the bit lines and the word lines due to dust, etc. generated in the fabrication steps can be precluded. The openings for forming the capacitor are provided in addition to the small-diameter through-holes, which prevent capacitance decrease.

In the above-described method for fabricating a semiconductor storage device, it is preferable that the method further comprises: after the first insulation film forming step, a fourth conducting film depositing step of depositing a fourth conducting film to fill the first through-holes and the second through-holes, in the openings forming step the openings being formed leaving columnar conductors of the fourth conducting film buried in the first through-holes in the openings in a projecting state. This method can prevent the semiconductor substrate exposed in the first through-holes in forming the openings from being damaged. The capacitor dielectric films are formed surrounding the columnar conductors, which increases capacitances.

In the above-described method for fabricating a semiconductor storage device, it is preferable that in the first insulation film forming step the first through-holes and the second through-holes are simultaneously formed.

In the above-described method for fabricating a semiconductor storage device, it is preferable that in the first insulation film forming step, the first insulation film is formed of a laminated film of two or more than two layers having etching characteristics different from each other; in the opening forming step, the openings are opened to an interface between the laminated film having different etching characteristics from each other. This method can control a depth of the openings with good reproducibility, which decreases deviations of the capacitance.

The above-described objects can be achieved also by a method for fabricating a semiconductor storage device comprising: a gate electrode forming step of depositing and patterning a first conducting film on a semiconductor substrate to form gate electrodes of the first conducting film; a diffused layer forming step of doping the semiconductor substrate with an impurity with the gate electrodes as a mask to form first diffused layers and second diffused layers; a first insulation film forming step of forming a first insulation film with first through-holes and second through-holes formed in, the first through-holes being opened on the first diffused layers and the second through-holes being opened on the second diffused layers; a second conducting film depositing step of depositing a second conducting film on the semiconductor substrate having the first insulation film formed on; a second conducting film patterning step of patterning the second conducting film to form bit lines connected to the second diffused layers through the first through-holes and buried conductors buried in the second-through-holes; and a capacitor forming step of forming capacitors including capacitor storage electrodes connected to the first diffused layers through the buried conductors, capacitor dielectric films covering the capacitor storage electrodes and capacitor opposed electrodes covering at least a part of the capacitor dielectric films. This method can connect the capacitor storage electrodes with the first diffused layers through the buried conductors buried at the same time that the bit lines have been formed, in the second through-holes formed concurrently with formation of the first through-holes for contact with the bit lines. Accordingly, the etching time for forming the through-holes for contact with the capacitor storage electrodes can be decreased without addition of a new step, whereby the insulation film on the bit lines is kept, in the etching, from being etched and exposed.

In the above-described method for fabricating a semiconductor storage device, it is preferable that the method further comprises: after the second conducting film depositing step, a second insulation film depositing step of depositing a second insulation film on the second conducting film; after the second conducting film patterning step, a sidewall insulation film forming step of forming sidewall insulation films on sidewalls of the bit lines,in the second conducting film patterning step, the second insulation film and the second conducting film are processed in the same pattern. In this method, simultaneously therewith the buried conductors are exposed on the surface. Accordingly, it is unnecessary to form the through-holes for contact with the capacitor storage electrodes, using a masking step. That is, one masking step can be omitted.

In the above-described method for fabricating a semiconductor storage device, it is preferable that the method further comprises: after the second conducting film patterning step, a second insulation film forming step of forming a second insulation film with openings formed on the buried conductors, wherein in the capacitor forming step, the capacitor storage electrodes are selectively formed in sidewalls and bottoms of the openings. The design rule of the wiring layers formed above can be designed with precision.

In the above-described method for fabricating a semiconductor storage device, it is preferable that the first insulation film forming step is characterized by including: a first insulation film depositing step of depositing a first insulation film on the semiconductor substrate; an etching stopper film forming step of forming an etching stopper film with openings in a region for the first through-holes to be formed in and a region for the second through-holes to be formed in and having etching characteristics different from those of the first insulation film; a sidewall forming step of forming sidewalls having etching characteristics different from those of the first insulation film on sidewalls of the etching stopper film; and a through-hole opening step of etching the first insulation film with the etching stopper film and the sidewalls as a mask etching the first insulation film to form the first insulation film with the first through-holes and the second through-holes formed in. This method permits the through-holes to have an opening diameter below a resolution limit of an exposing device.

In the above-described method for fabricating a semiconductor storage device, it is preferable that in the first insulation film forming step, the first insulation film is deposited on the semiconductor film and then etching the first insulation film by electron beam lithography with a patterned photo-resist as a mask to open the first through-holes and the second through-holes. This method permits the first through-holes and the second through holes to have an opening diameter of below a resolution limit of the usual exposing device.

DETAILED DESCRIPTION OF THE INVENTION

First Embodiment

The semiconductor storage device and the method for fabricating the same according to a first embodiment of the present invention will be explained with reference to FIGS. 1 to 7.

Figure 1:
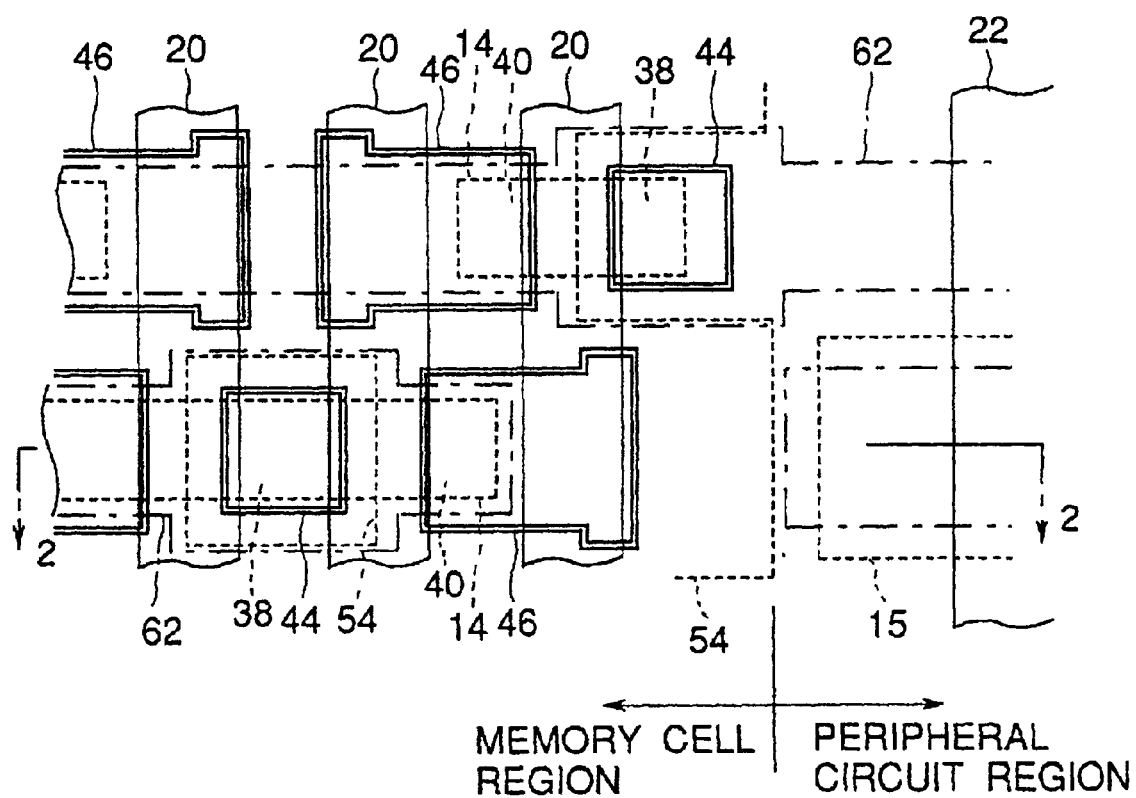
FIG. 1 is a plan view of the semiconductor storage device according to a first embodiment of the present invention explaining a structure thereof.
Figure 2:
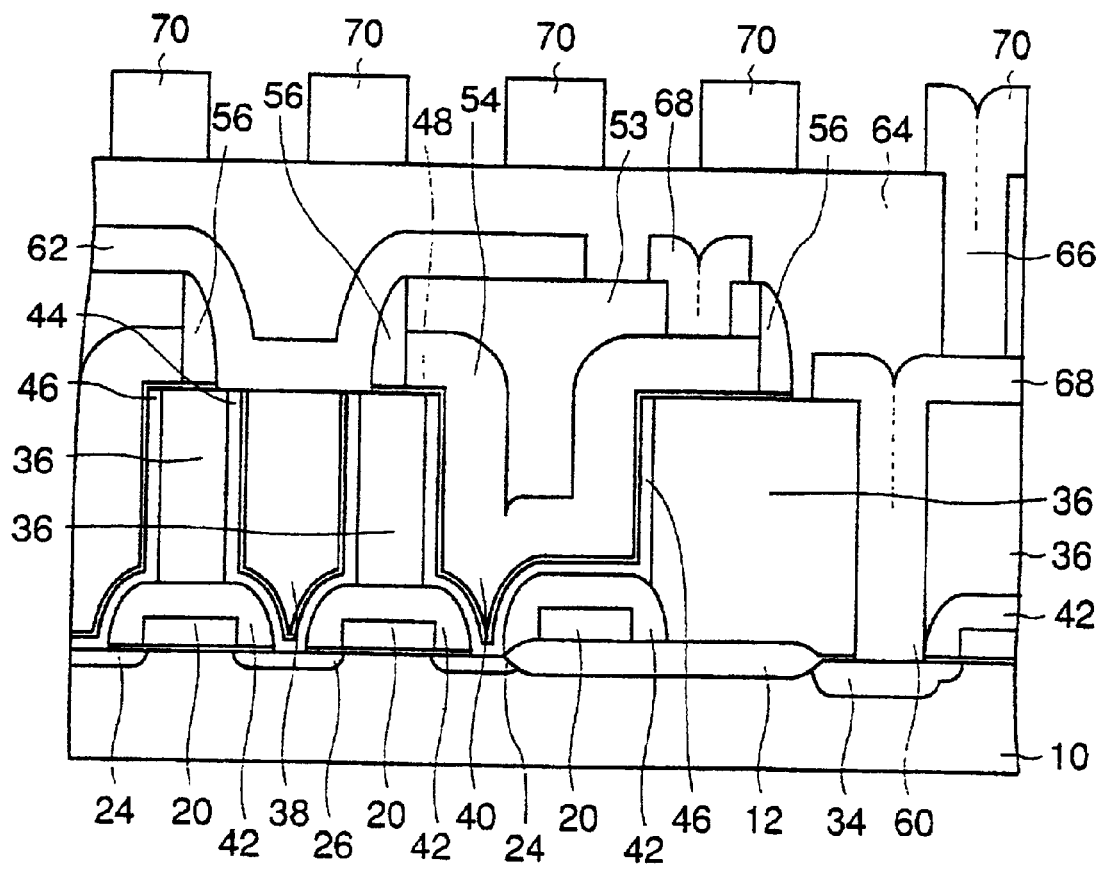
FIG. 2 is a diagrammatic sectional view of the semiconductor storage device according to the first embodiment explaining the structure thereof.

FIG. 1 is a plan view of the semiconductor storage device according to the present embodiment showing the structure of the device. FIG. 2 is a diagrammatic sectional view of the semiconductor storage device of FIG. 1 along the line A–A'. FIGS. 3A–3D, 4A–4B, 5A–5B, and 6 are sectional views of the semiconductor storage device according to the present embodiment in the steps of the method for fabricating the same. FIG. 7 is a diagrammatic sectional view of the semiconductor storage device according to a variation of the present embodiment.

First, the structure of the semiconductor storage device according to the present embodiment will be explained with reference to FIGS. 1 and 2.

Device regions 14, 15 are defined on a silicon substrate 10 by a device isolation film 12. Source diffused layers 24 and drain diffused layers 26 are formed in the device region 14 independent of each other. Gate electrodes 20 are formed through gate oxide films 16 on parts of the semiconductor substrate 10 between the source diffused layers 24 and the drain diffused layers 26. Thus, memory cell transistors comprising the gate electrodes 20, the source diffused layers 24 and the drain diffused layers 26 are constituted.

The gate electrodes 20 are arranged perpendicular to the device region 14 and constitute word lines which function as gate electrodes of the memory cell transistors of rest plural memory cells.

On the semiconductor substrate 10 with the memory cell transistors formed thereon, there is formed an inter-layer insulation film 36 with through-holes 38 opened on the drain diffused layers 26 and through-holes 40 opened on the source diffused layers 24. Insulation films 42 are formed on the gate electrodes 20 by self-alignment, covering the gate electrodes 20. The through-holes 38, 40 are formed by self-alignment with respect to the insulation films 42.

Capacitor storage electrodes 46 of polycrystalline silicon are formed on the inside walls of the through-holes 40 and the source-diffused layers 24, and are connected to the source diffused layers 24 at the bottoms of the through-holes 40. Capacitor dielectric films 48 are formed on the inside surfaces and the upper surfaces of the capacitor storage electrodes 46. Capacitor opposed electrodes 54 are formed in the through-holes 40 with the capacitor storage electrodes 46 and the capacitor dielectric films 48 formed in, and on the inter-layer insulation film 36. Capacitors thus comprising the capacitor storage electrodes 46, the capacitor dielectric films 48 and the capacitor opposed electrodes 54 are constituted.

Contact conducting films 44 of polycrystalline silicon are formed on the inside walls of the through-holes 38 and are connected to bit lines 52 which are arranged perpendicular to word lines through the inter-layer insulation film 53 formed on the capacitor opposed electrodes 54.

Wiring layers 70 are formed above the bit lines 62 through an inter-layer insulation film 64, and a DRAM comprising one-transistor and one-capacitor memory cells is constituted.

On the other hand, in the device region 15 for peripheral circuit region neighboring the memory cell region there are formed source diffused layers (not shown) and drain diffused layers 34 independent of each other. Gate electrodes 22 are formed through gate oxide films 16 on parts of the semiconductor substrate 10 between the source diffused layers and the drain diffused layers 34. Thus, peripheral device transistors comprising the gate electrodes 22, the source diffused layers and the drain diffused layers 34 are constituted.

Through-holes 60 are formed in the inter-layer insulation film 36 on the drain diffused layers 34 and is connected to wiring layers 70 formed on the inter-layer insulation film 64 through wiring layers 68 buried in the through-holes 60.

Then, the method for fabricating the semiconductor storage device according to the present embodiment will be explained.

Figure 3A:
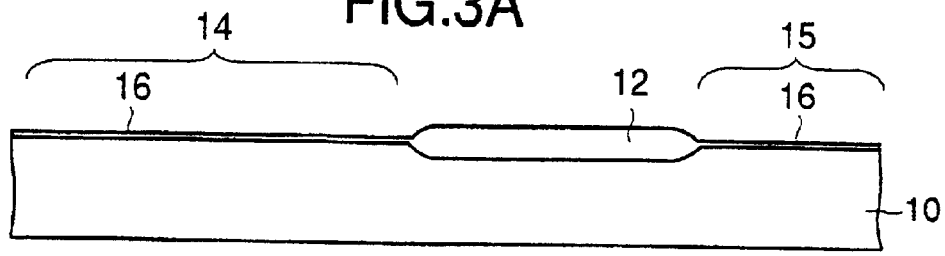
FIGS. 3A–3D are sectional views of the semiconductor storage device according to the first embodiment in steps of a method for fabricating the semiconductor storage device (Part 1).

The device isolation film 12 is formed in an about 300 nm-thickness on the major surface of a p-silicon substrate 10 by, e.g., the usual LOCOS to define the device regions 14, 15. Then, gate oxide films 16 are formed in an about 10 nm-thickness on the device region 14, 15 by thermal oxidation (FIG. 3A).

Subsequently, an about 150 nm-thick polycrystalline silicon film containing a high concentration of phosphorus (P), and an about 200 nm-thick silicon nitride film are successively formed. Then, the silicon nitride film and the polycrystalline silicon film are concurrently patterned by the usual lithography and the etching.

Thus, the gate electrodes 20, 22 having the upper surfaces covered with the silicon nitride films 18 are formed.

Figure 3B:
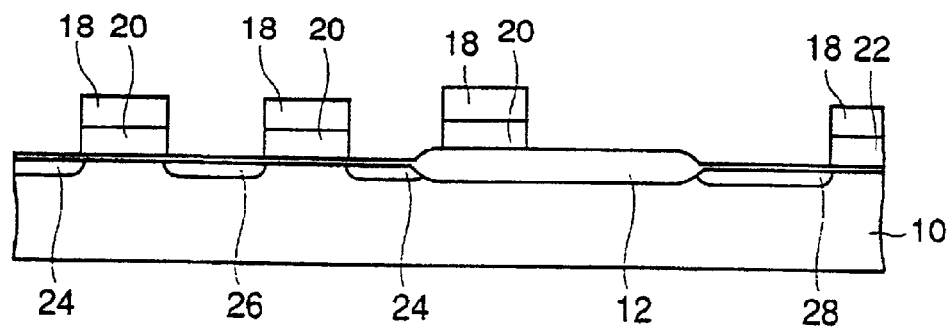

Then, with the silicon nitride films 18 and the gate electrodes 20, 22 as a mask, the source diffused layers 24 and the drain diffused layers 26 of the memory central transistors, and the low-concentration diffused layers 28 of the peripheral circuit transistors are formed by implanting, for example, P ions under the conditions of a 40 keV acceleration energy and a $2\times10^{13}$ ions cm$^{-2}$ dose. The low-concentration diffused layers 28 are to be n$^-$ layers of the LDD (lightly doped drain) structure (FIG. 3B).

Then, an about 100 nm-thick silicon nitride film is formed by CVD and then is subjected to anisotropic etching by the use of CHF$_3$/H$_2$ gas to form by self-alignment the sidewall nitride films 30 of the silicon nitride film on the sidewalls of the patterned silicon nitride films 18 and gate electrodes 20, 22. Thus, the sidewalls and the upper surfaces of the gate electrodes 20, 22 are covered with the silicon nitride films 18 and the sidewall nitride films 30. The silicon nitride films 18 and the sidewall nitride films 30 covering the gate electrodes 20, 22 are hereinafter collectively called insulation films 42 for the convenience of the explanation.

Figure 3C:
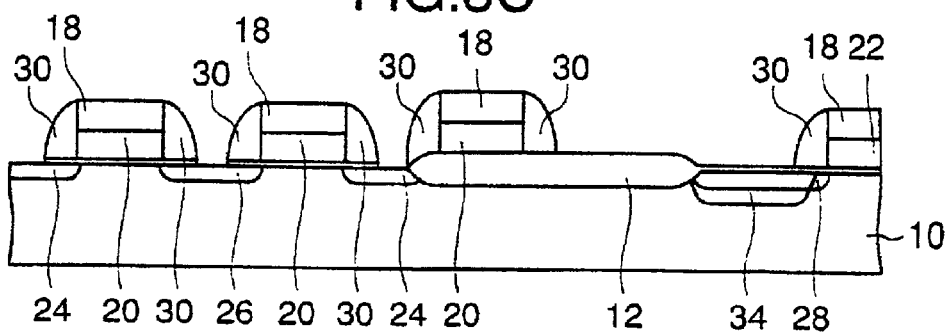

Subsequently, the source diffused layers and the drain diffused layers 34 of n-transistors for peripheral circuits are formed by selectively implanting in the n-transistor region for peripheral circuits, for example, arsenic (As) ions under the conditions of a 40 keV acceleration energy and a $4\times10^{15}$ ions cm$^{-2}$ dose. Thus, peripheral circuit transistors having the LDD structure are formed (FIG. 3C).

Then, an about 2 μm thick silicon oxide film is deposited by CVD, and the surface of the silicon oxide film is polished by CMP (Chemical Mechanical Polishing) and planarized. A polishing amount which can remove a step between the gate electrodes 20, 22 and the device isolation film 12 are sufficient. In the present embodiment, the polishing amount is 500 nm.

The surface may be planarized by depositing a laminated film of a silicon oxide film and a BPSG film in place of the silicon oxide film and reflowing the BPSG film, but CMP is more preferable in view of the global planarization.

Figure 3D:
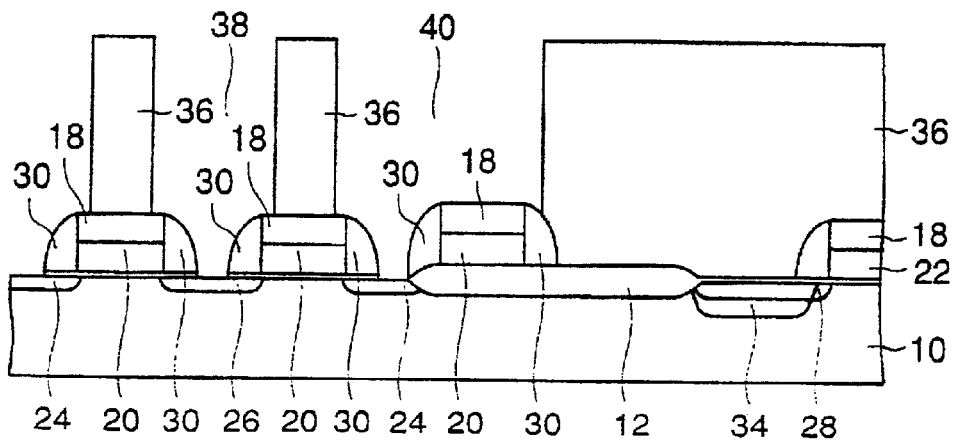

Then, a photoresist is patterned by the usual lithography, and then the silicon oxide film is etched by the use of an etching gas, such as C$_2$F$_6$ or others. Then, the photoresist is removed to form an inter-layer insulation film 36 in which are formed the through-holes 38 opened on the drain diffused layers 26 of the memory cell transistors and the through-holes 40 opened on the source diffused layers 24 of the memory cell transistors (FIG. 3D).

In this etching, selectivity of the etching must be sufficiently secured between the silicon oxide film and the silicon nitride film to stop the etching of the inter-layer insulation film 36 at the insulation film 42.

The drain diffused layers 26 and the source diffused layer 24 are exposed on the bottoms of the thus-formed through-holes 38, 40. The regions where the drain diffused layers 26 and the source diffused layers 24 are to be exposed are formed by self-alignment with the insulation film 42. It is not necessary to take into consideration an alignment allowance for aligning the through-holes 38, 40 with the gate electrodes 20 in the lithography. Accordingly, a memory cell area can be decreased by the alignment allowance.

The depth of the through-holes 40 is an important parameter for determining the cell capacitance. In the present embodiment, a depth of the through-holes 40 is about 1.5 μm. When a size of the opening of the through-holes 40 is 0.3×0.6 μm for example, a sum of a bottom areas of the through-holes 40 and a sidewall area thereof is [0.3×0.6+ 1.5×(0.3+0.6)×2] μm$^2$, i.e., about 2.88 μm$^2$ can be secured. Accordingly, by forming the capacitor dielectric film of a 4.5 nm thickness in terms of an oxide film, a sufficient capacitor of an about 22 fF capacity can be formed.

Figure 4A:
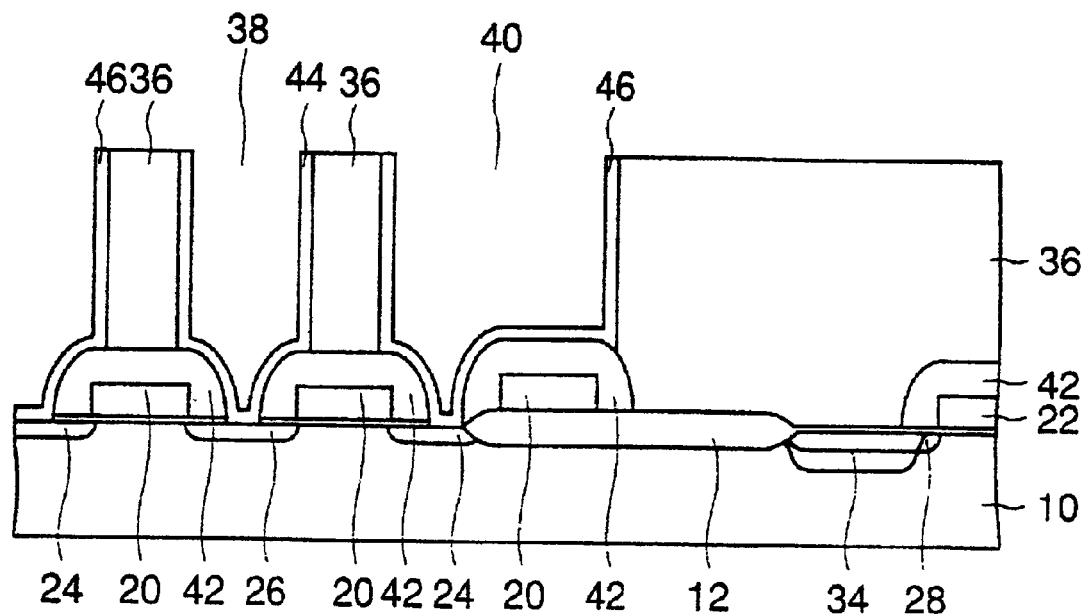
FIGS. 4A and 4B are sectional views of the semiconductor storage device according to the first embodiment in steps of a method for fabricating the semiconductor storage device (Part 2).

Subsequently, a polycrystalline silicon film containing a high P concentration is formed in an about 50 nm thickness by CVD, and then the polycrystalline silicon film on the inter-layer insulation film 36 is completely removed by CMP, whereby the contact conducting films 44 and the capacitor storage electrodes 46 are formed by self-alignment respectively in the through-holes 38 and in the through-holes 40 (FIG. 4A).

The deposition of the inter-layer insulation film 36 is not immediately followed by the planarization by CMP but may be planarized collectively together with the contact conducting films 44 and the capacitor storage electrodes 46 concurrently with the formation thereof, whereby one step of the polishing by CMP can be decreased.

The capacitor storage electrode 46 and the contact conducting film 44 may be formed of polycrystalline silicon film whose surface is corrugated (e.g., H. Watanabe, Ext. Abstract of 22nd SSDM, p. 869 (1990)), whereby a surface area of the capacitor storage electrode 46 is increased about twice a surface area formed by the usual method. Even in a case where a depth of the through-holes 40 is as shallow as about a half a depth of the through-holes 40, about 0.8 μm, the same capacitance can be secured.

Next, a silicon nitride film of an about 5 nm-thickness is formed by CVD, and then the surface of the silicon nitride film is oxidized in a wet atmosphere of 800° C. to form the capacitor dielectric film 48 of an about 4.5 nm-thickness in terms of an oxide film.

Figure 4B:
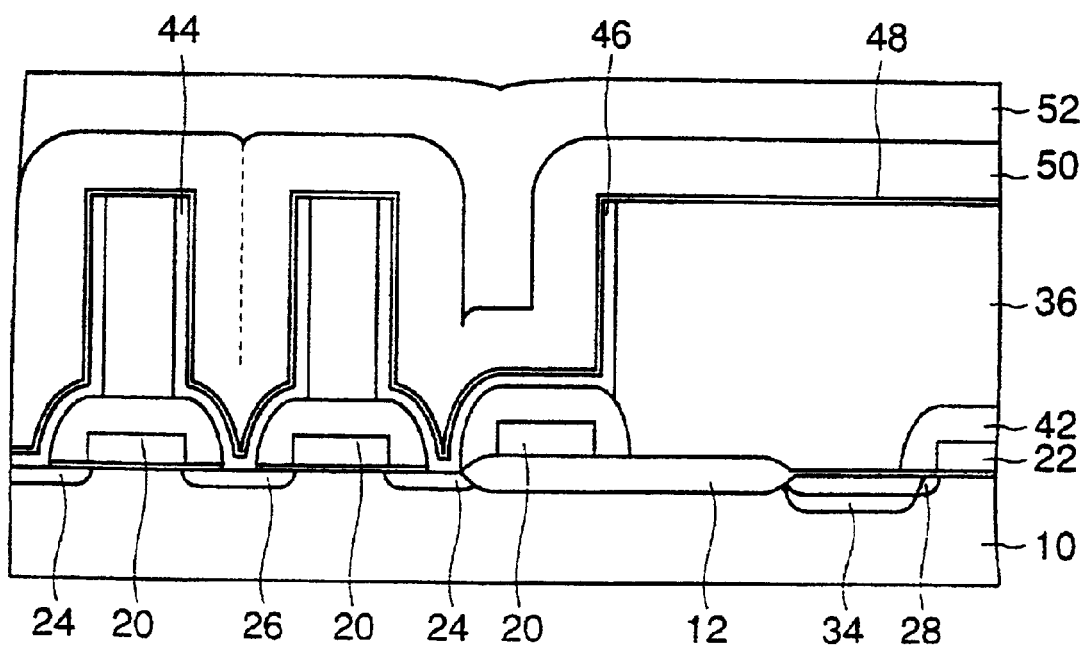

Then, the polycrystalline silicon film 50 of an about 150 nm-thickness containing a high concentration of P, and a BPSG film 52 of an about 200 nm-thickness is successively formed, and then the surface of the BPSG film 52 is planarized by reflow or CMP. At this time, the through-holes 38 are completely filled with the polycrystalline silicon film 50 (FIG. 4B).

Subsequently, the BPSG film 52 and the polycrystalline silicon film 50 are patterned together by the usual lithography step and etching step to form the capacitor opposed electrodes 54.

Then, an about 100 nm-thick silicon oxide film is deposited by CVD, and the entire surface is subjected to anisotropic etching to form the sidewall oxide films 56 on the sidewalls of the capacitor opposed electrodes 46, and to remove the capacitor dielectric film 48 on the through-holes 38.

Figure 5A:
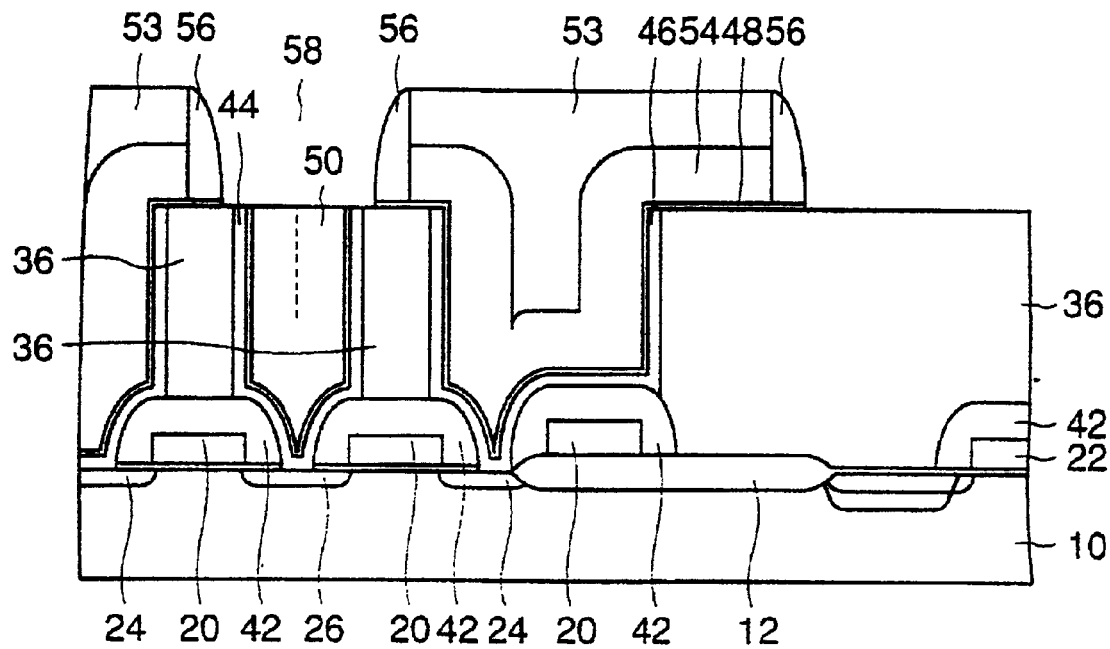
FIGS. 5A and 5B are sectional views of the semiconductor storage device according to the first embodiment in steps of a method for fabricating the semiconductor storage device (Part 3).

Thus, the capacitor opposed electrodes 54 are covered with the inter-layer insulation film 53 constituted by the sidewall oxide films 56 and the BPSG films, and the openings formed on the through-holes 38 can be used as the bit line contact holes 58. That is, the sidewall oxide films 48 are formed while the bit line contact holes 58 can be formed by self-alignment (FIG. 5A).

Figure 5B:
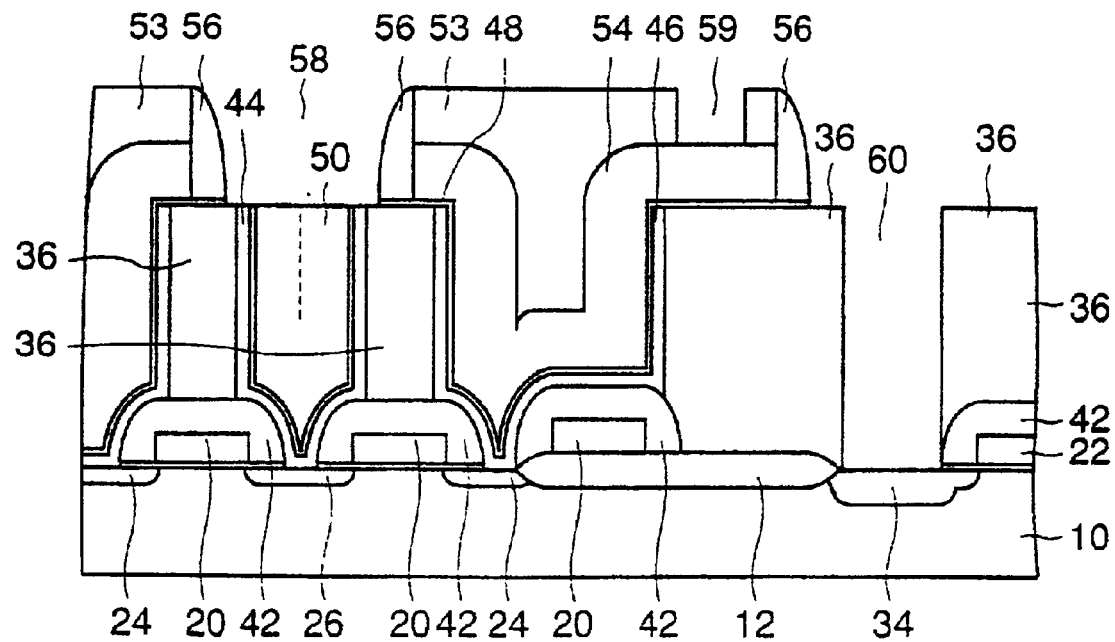

Then, the contact holes 59 for the capacitor opposed electrodes 54, and the through-holes 60 for the peripheral circuit transistors, etc. are opened by the usual lithography step and etching step (FIG. 5B).

Subsequently, an about 50 nm-thick titanium (Ti) film, and an about 50 nm-thick TiN film and an about 200 nm-thick tungsten (W) film are successively formed respectively by collimated sputtering and by CVD. Then, the laminated film of the W/TiN/Ti film is patterned by the usual lithography step and etching step to form the bit lines 62 and the wiring layers 68.

Then, the inter-layer insulation film 64 of an about 1 $\mu$m-thick silicon oxide film is deposited by CVD, and the surface of the inter-layer insulation film 64 is planarized by CMP or others as required. Then, via holes 66 are opened.

Then, a W film is deposited by CVD and patterned to form the wiring layers 70. The wiring layers 70 may be of aluminium (Al) deposited by sputtering.

Figure 6:
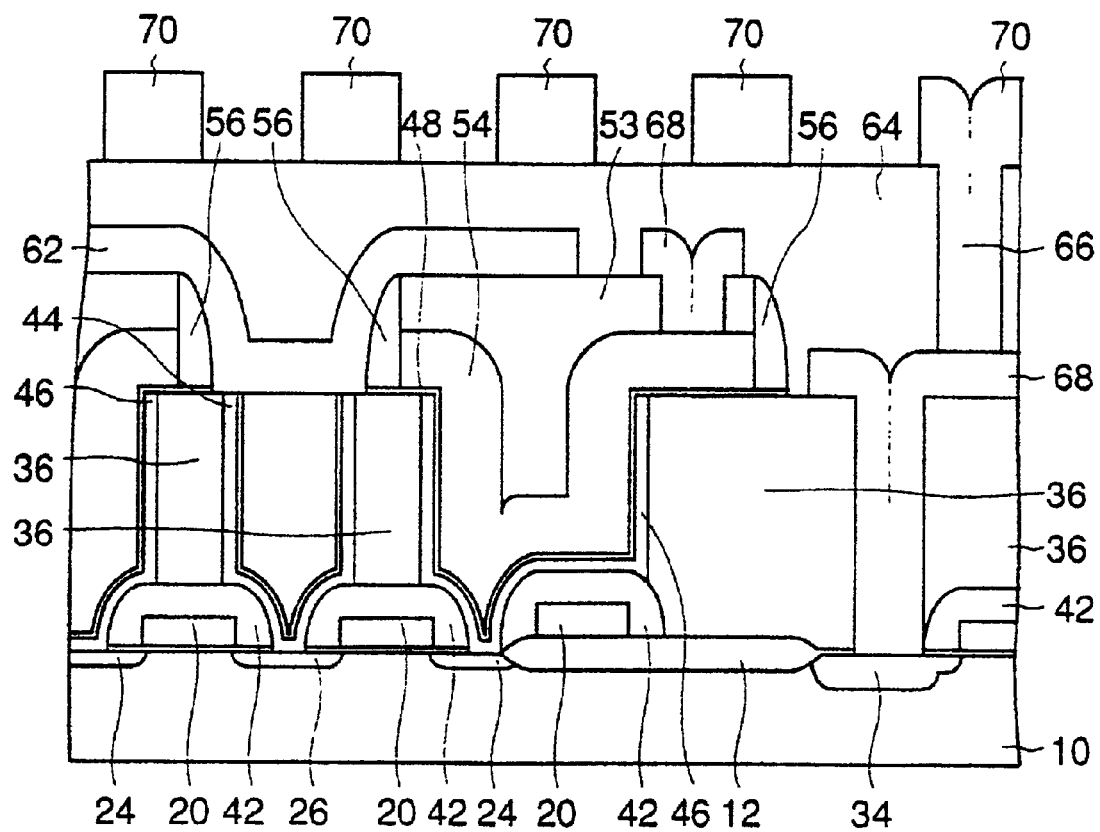
FIG. 6 is a sectional view of the semiconductor storage device according to the first embodiment in steps of a method for fabricating the semiconductor storage device (Part 4).
Figure 7:
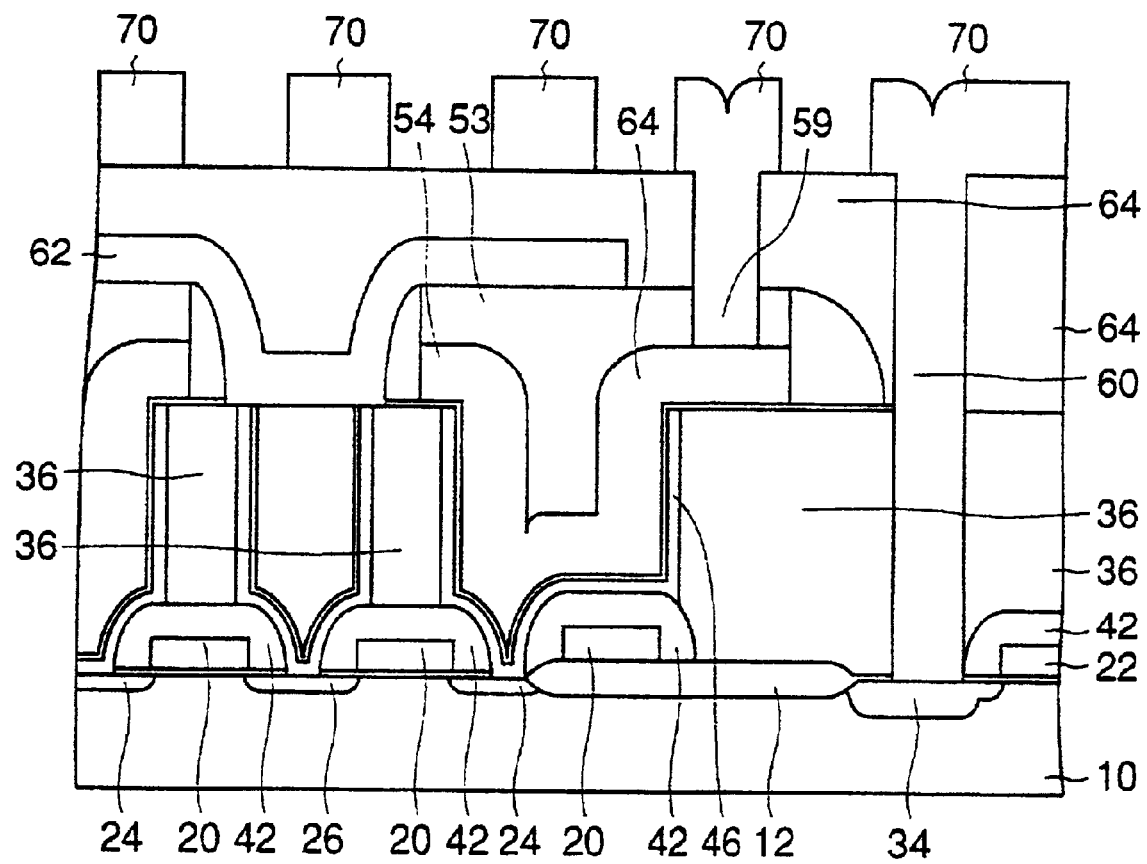
FIG. 7 is a diagrammatic sectional view of the semiconductor storage device according to one variation of the first embodiment of the present invention explaining a structure thereof.

Thus, a DRAM comprising one-transistor and one-capacitor memory cells is formed (FIG. 6).

Figure 60:
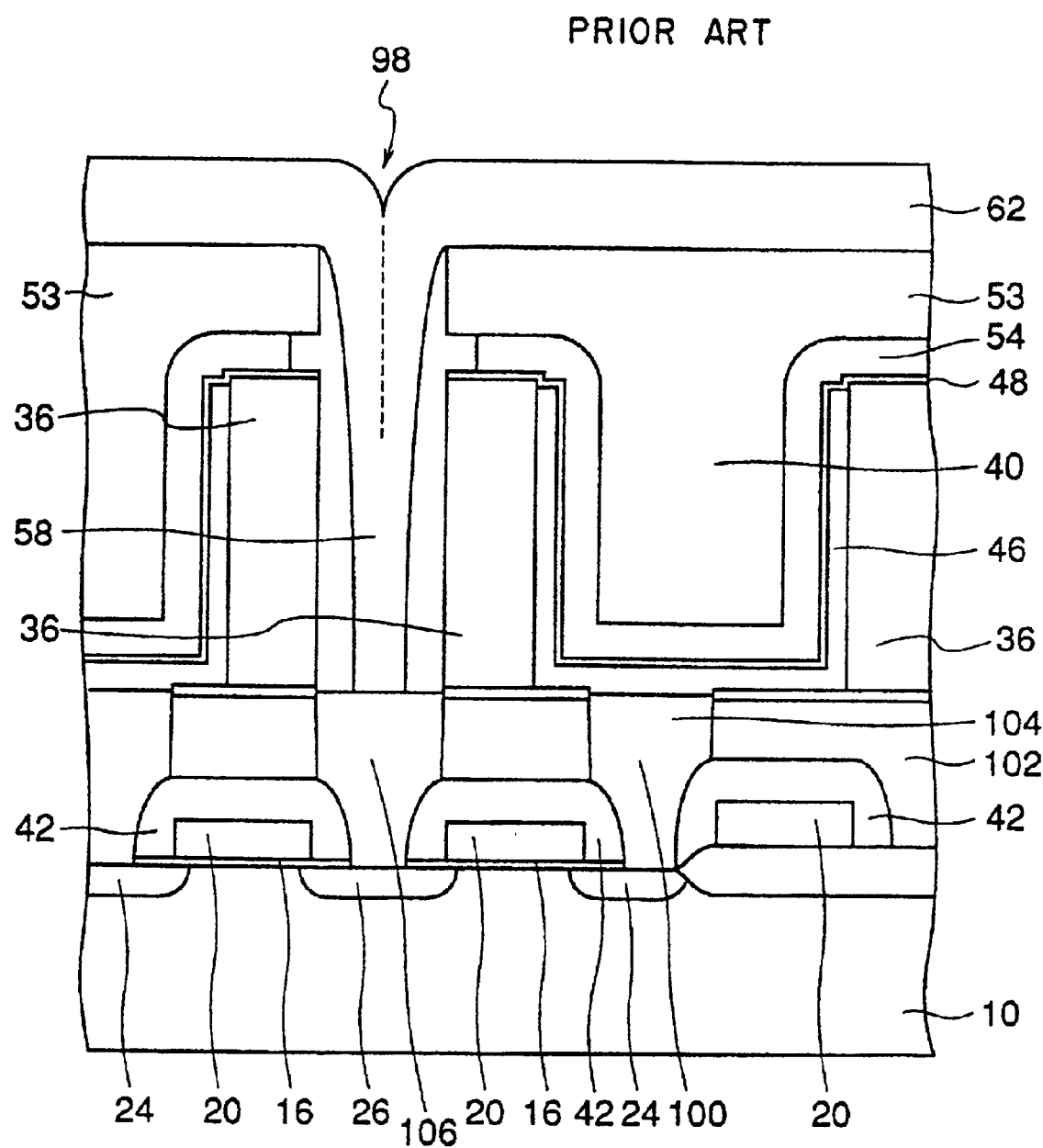
FIG. 60 is a diagrammatic sectional view of a conventional semiconductor storage device explaining a structure thereof (Part 2).

As described above, according to the present embodiment, lithography steps which require precise patterning are totally 8 for defining the device isolation region, formation of the gate electrodes, opening the through-holes for the capacitor storage electrodes and the bit line contact through-holes, formation of the capacitor opposed electrodes, opening the peripheral circuit through-holes, and formation of the bit lines, the via holes, and the wiring layers. In comparison with the conventional example of FIG. 60, lithography steps can be decreased by one step.

Figure 59:
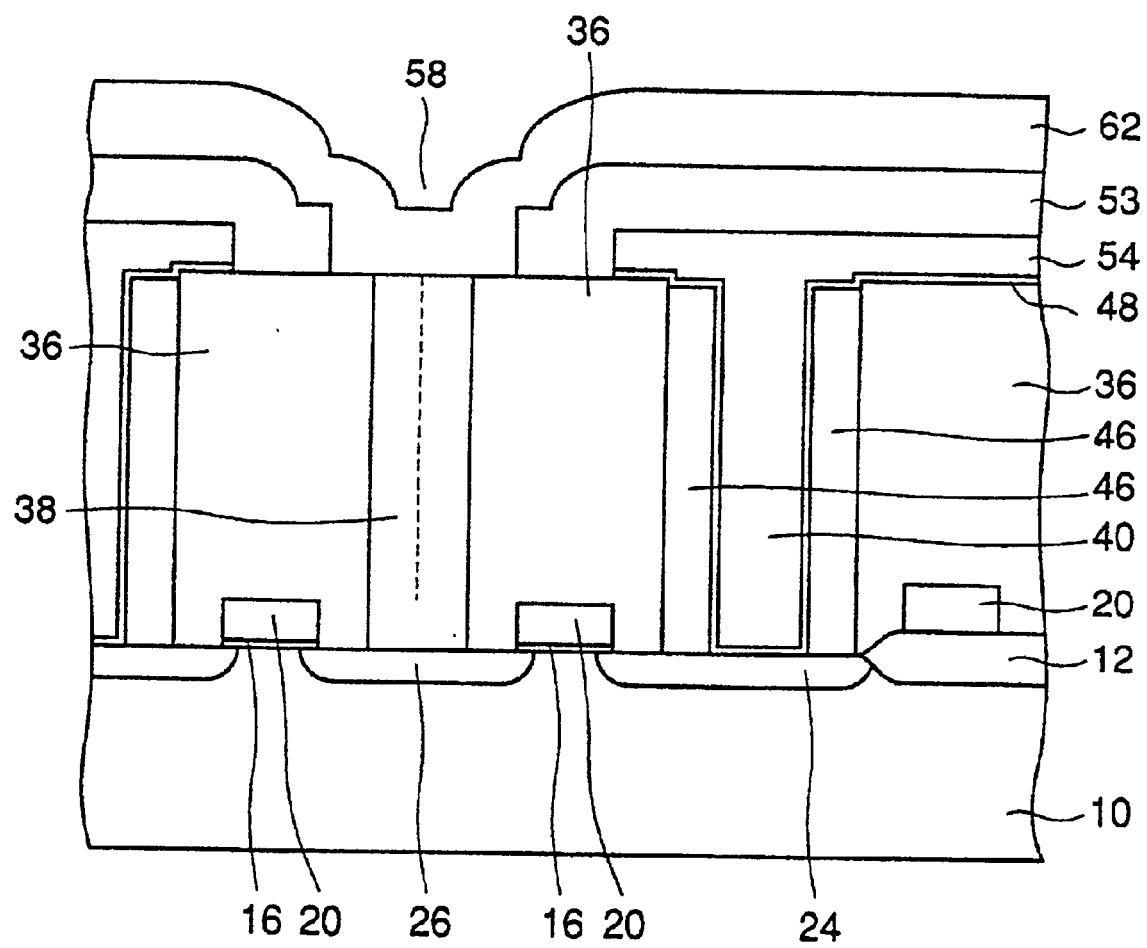
FIG. 59 is a diagrammatic sectional view of a conventional semiconductor storage device explaining a structure thereof (Part 1).

In comparison with the conventional example of FIG. 59, the present embodiment has the same number of lithography steps as the example, but the formation of the through-holes for the capacitor storage electrodes and the bit line contact through-holes by self-alignment with the gate electrodes can decrease alignment allowances.

The formation of the bit line contact through-holes and the through-holes for the capacitor storage electrodes by self-alignment with the insulation films formed around the gate electrodes by self-alignment makes alignment allowances unnecessary, which makes memory cell areas accordingly smaller.

The capacitor storage electrodes and the bit line contact conducting films are formed at the same time, but the wiring layers buried in the peripheral circuit through-holes and the capacitor storage electrode are formed separately from each other, whereby capacities of the capacitor are not substantially sacrificed.

In the peripheral circuit region of the present embodiment, the wiring layers 70 in the via holes 66 are formed through the wiring layers 68 in the through-holes 60. To this end another lithography step is necessary to form the peripheral through-holes 60, but the structure of FIG. 7 permits this lithography step to be omitted.

In this case, after the through-holes 59 for the capacitor opposed electrodes 54, the peripheral circuit through-holes 60 are opened after the inter-layer insulation film 64 is formed, and the wiring layers 70 are directly in contact with the capacitor opposed electrodes 54 and the source-drain diffused layers 34 of the peripheral circuit transistors.

Second Embodiment

The semiconductor storage device according to a second embodiment of the present invention, and the method for fabricating the same will be explained with reference to FIGS. 8 to 14. Common members of the semiconductor storage device and the method for fabricating the same according to the present embodiment with those of the first embodiment are represented by common reference numerals to simplify or not to repeat their explanation.

Figure 8:
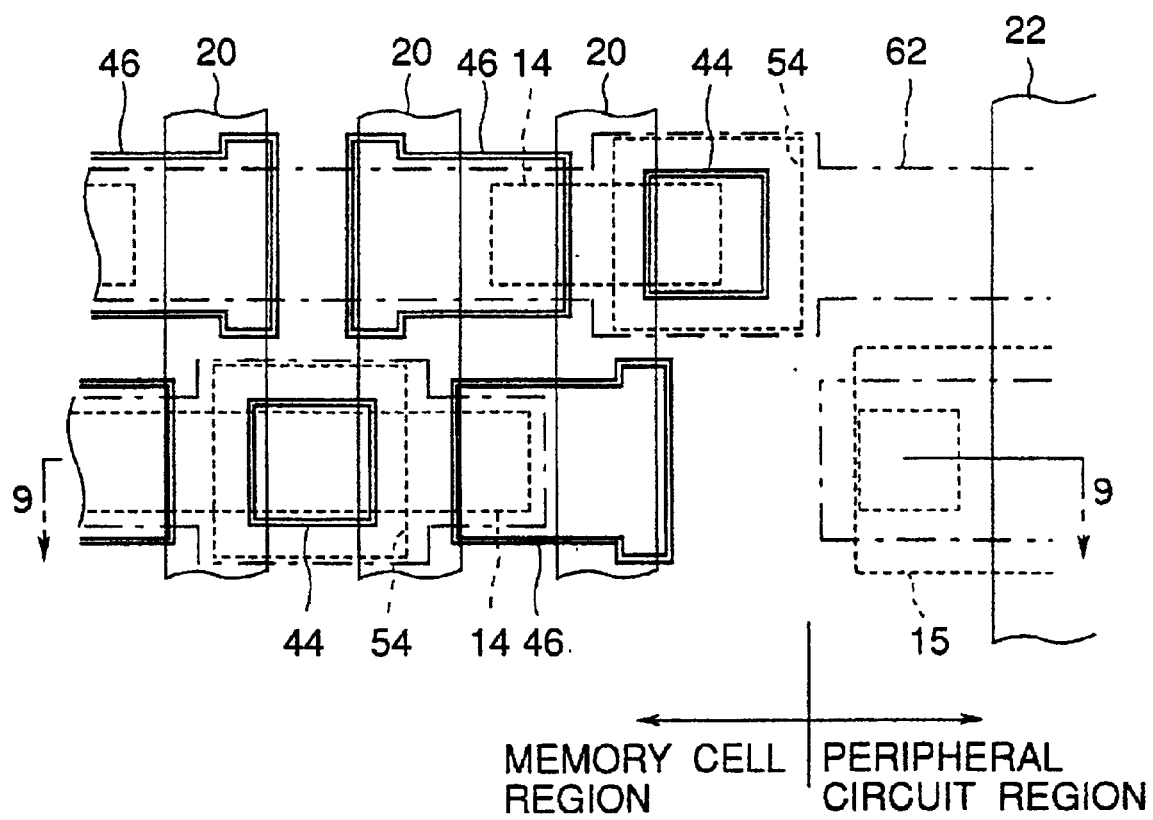
FIG. 8 is a plan view of the semiconductor storage device according to a second embodiment of the present invention explaining a structure thereof.
Figure 9:
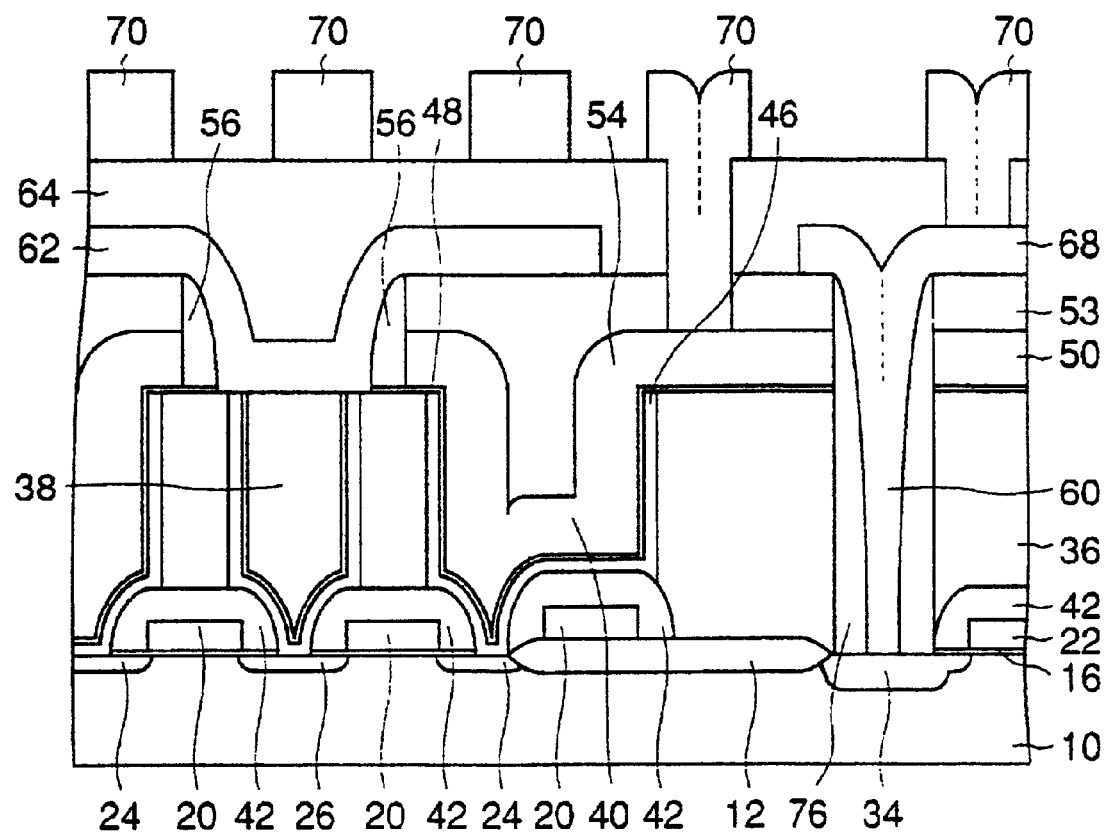
FIG. 9 is a diagrammatic sectional view of the semiconductor storage device according to the second embodiment of the present invention explaining the structure thereof.

FIG. 8 is a plan view of the semiconductor storage device according to the present embodiment. FIG. 9 is a diagrammatic sectional view of the semiconductor storage device of FIG. 8 along the line A–A'. FIGS. 10A–10D, 11A–11B, 12A–12B, and 13A–13B are sectional views of the semiconductor storage device according to the present embodiment in the steps of the method for fabricating the same, which explain the fabrication method. FIG. 14 is sectional views of one variation of the semiconductor storage device in steps of the method for fabricating the same, which explain the fabrication method.

The semiconductor storage device according to the variation of the first embodiment shown in FIG. 7 simplifies the fabrication steps by burying the peripheral circuit through-holes 60 by the wiring layers 70. A depth of the through-holes 60 sometimes is even about 3 $\mu$m, and in such case it is difficult to completely bury the through-holes.

Taking this into consideration, the semiconductor storage device and the method for fabricating the same according to the present embodiment can simplify the fabrication steps.

First, the structure of the semiconductor storage device according to the present embodiment will be explained.

Device regions 14, 15 are defined on a silicon substrate 10 by a device isolation film 12. In the device regions 14 there are formed source diffused layers 24 and drain diffused layers 26 independent of each other. Gate electrodes 20 are formed through gate oxide films 16 on parts of the semiconductor substrate 10 between the source diffused layers 24 and the drain diffused layers 26. Thus, memory cell transistors comprising the gate electrodes 20, the source diffused layers 24 and the drain diffused layers 26 are constituted.

On the semiconductor substrate 10 with the memory cell transistors formed thereon, there is formed inter-layer insulation film 36 with through-holes 38 and through-holes 40 opened respectively on the drain diffused layers 26 and the source diffused layers 24. Insulation films 42 are formed on the gate electrodes 20, covering the same. The through-holes 38 and the through-holes 40 are opened by self-alignment with the insulation films 42.

Capacitor storage electrodes 46 of polycrystalline silicon are formed on the inside walls of the through-holes 40 and the source diffused layers 24 and connected to the source diffused layers 24 at the bottoms of the through-holes 40. Capacitor dielectric films 48 are formed on the inside surfaces and the top surfaces of the capacitor storage electrodes 46. Capacitor opposed electrodes 54 are formed in the through-holes 40 with the capacitor storage electrodes 46 and the capacitor dielectric films 48 formed in, and on the inter-layer insulation film 36. Capacitors are constituted by the capacitor storage electrodes 46, the capacitor dielectric films 48 and the capacitor opposed electrodes 54.

Contact conducting films 44 of polycrystalline silicon are formed on the inside walls of the through-holes 38 and connected to bit lines 62 arranged normal to word lines through the inter-layer insulation film 53 formed on the capacitor opposed electrodes 54.

Wiring layers 70 are formed above the bit lines 62 through an inter-layer insulation film 64. Thus, a DRAM comprising one-transistor and 1-capacitor memory cells is constituted.

On the other hand, in the peripheral circuit region neighboring the device region 15 there are formed source diffused layers (not shown) and drain diffused layers 34 independent of each other. Gate electrodes 22 are formed on parts of the semiconductor substrate 10 between the source diffused layers and the drain diffused layers 34 through gate oxide films 16. Thus, peripheral circuit transistors are constituted by the gate electrodes 22, the source diffused layers and the drain diffused layers 34 are constituted.

Through-holes 60 are formed in inter-insulation films 36 formed on the drain diffused layers 34 and are connected to wiring layers 70 on an inter-layer insulation film 64 through a wiring layer 68 buried in the through-holes 60.

A difference of the semiconductor storage device according to the present embodiment from that according to the first embodiment is that, in the present embodiment, the polycrystalline silicon films 50 forming the capacitor opposed electrodes 54, and the inter-layer insulation film 53 on the capacitor opposed electrode 54 are extended to the peripheral circuit region.

A merit of forming the capacitor opposed electrodes 54 and the inter-layer insulation film 53 in such arrangement is primarily to simplify the fabrication process. Next, the method for fabricating the semiconductor storage device according to the present embodiment will be explained, and this arrangement will be detailed.

Figure 10A:
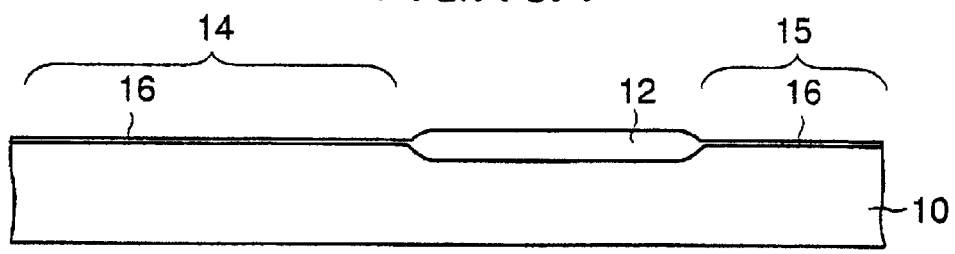
FIGS. 10A–10D are sectional views of the semiconductor storage device according to the second embodiment in steps of a method for fabricating the semiconductor storage device (Part 1).

A device isolation film 12 of an about 300 nm-thickness are formed on the major surface of a p-silicon substrate 10 by, e.g., the usual LOCOS to define the device regions 14, 15. Then, the gate oxide films 16 of an about 10 nm-thickness are formed in the device regions 14, 15 by thermal oxidation (FIG. 10A).

Subsequently, a polycrystalline silicon film containing a high concentration of P and a silicon nitride film are successively formed by CVD respectively in an about 150 nm-thickness and an about 200 nm-thickness. Then, the silicon nitride film and the polycrystalline silicon film are concurrently patterned by the usual lithography. Thus, the gate electrodes 20, 22 having top surfaces covered with the silicon nitride films 18 are formed.

Figure 10B:
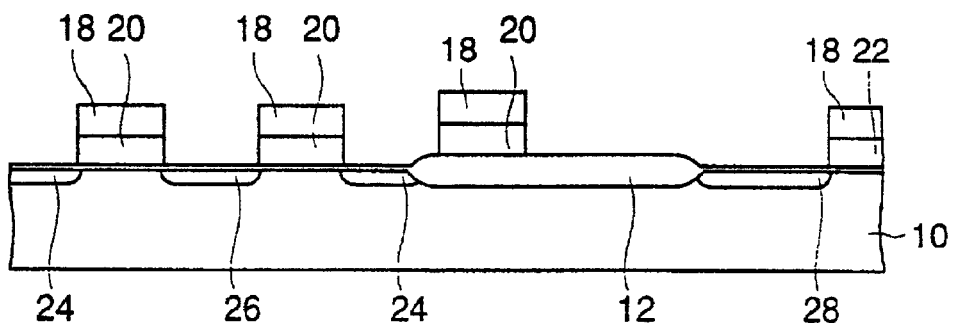

Then, with the silicon nitride films 18 and the gate electrodes 20, 22 as a mask, the source diffused layers 24 and the drain diffused layers 26 of the memory cell transistors, and the low-concentration diffused layers 28 of the peripheral circuit transistors are formed by implanting, for example, P ions under the conditions of a 40 keV acceleration energy and a $2 \times 10^{13}$ ions $cm^{-2}$ dose (FIG. 10B).

Subsequently, an about 100 nm-thick silicon nitride film is formed by CVD and subjected to anisotropic etching by the use of $CHF_3/H_2$ gas, and the sidewall nitride films 30 are formed by self-alignment on the sidewalls of the patterned silicon nitride films 18 and gate electrodes 20, 22. Thus, the top surfaces and the sidewalls of the gate electrodes 20, 22 are covered with the silicon nitride films 18 and the sidewall nitride films 30.

Figure 10C:
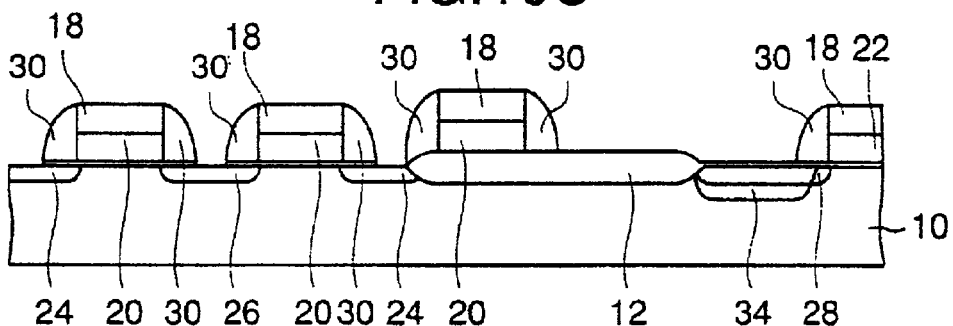

Subsequently, As ions, for example, are selectively implanted in the peripheral circuit n-transistor region, by the usual lithography, under the conditions of a 40 keV acceleration energy and a $4 \times 10^{15}$ ions $cm^{-2}$ to form the source diffused layers and the drain diffused layers 34 of the peripheral circuit n-transistors. Thus, peripheral circuit transistors of the LDD structure are formed (FIG. 10C).

Then, silicon oxide film is deposited in an about 2 μm-thickness by CVD and the surface of the silicon oxide film is polished by CMP for planarization. An amount polished by the CMP which removes a step between the gate electrodes 20, 22 and the device isolation film 12 is sufficient, and is 500 nm in the present embodiment.

Figure 10D:
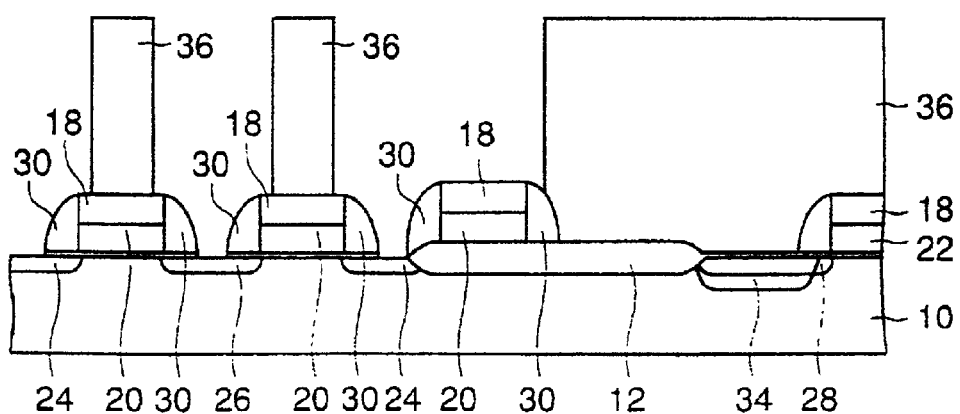

Then, after a photoresist is patterned by the usual lithography, the silicon oxide film is etched, using an etching gas, such as $C_2F_6$ or others. Then, the photoresist is removed, and the inter-layer insulation film 36 with the through-holes 38 opened on the drain diffused layers 26 of the memory cell transistors and the through-holes 40 opened on the source diffused layers 24 of the memory cell transistors formed in is formed (FIG. 10D).

Figure 11A:
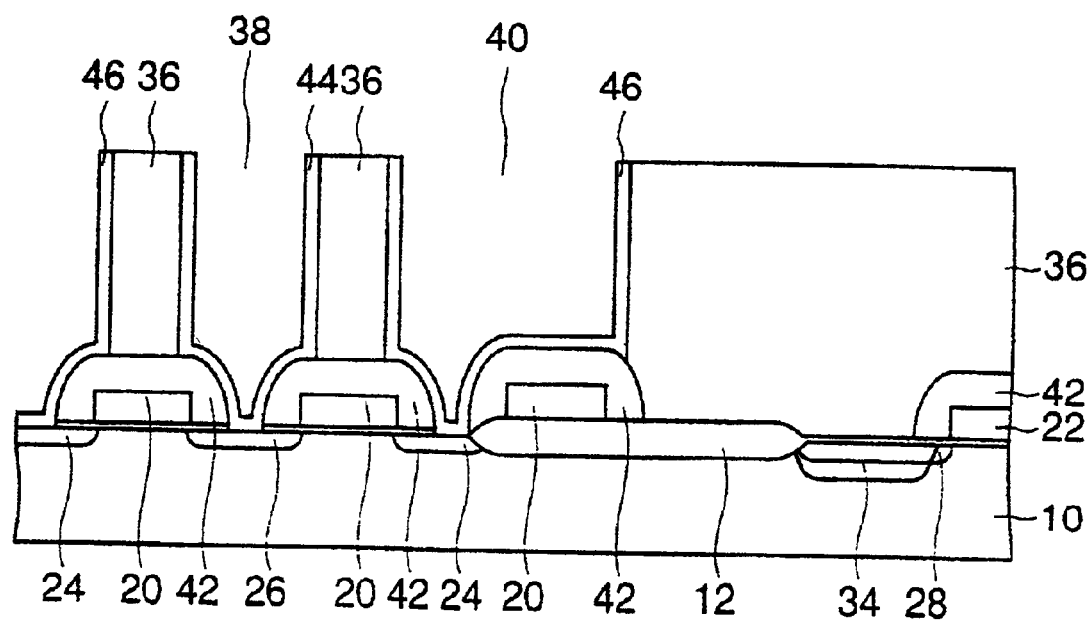
FIGS. 11A and 11B are sectional views of the semiconductor storage device according to the second embodiment in steps of a method for fabricating the semiconductor storage device (Part 2).

Subsequently, a polycrystalline silicon film containing a high concentration of P is formed in an about 50 nm thickness by CVD, and parts of the polycrystalline silicon film on the inter-layer insulation film 36 are completely removed. Thus, the contact conducting films 44 in the through-holes 38, and the capacitor storage electrodes 46 in the through-holes 40 are formed self-alignment (FIG. 11A).

Next, an about 5 nm-thick silicon nitride film is formed by CVD and then the surface of the silicon nitride film is oxidized in a wet atmosphere of 800° C. to form the capacitor dielectric films 48 of an about 4.5 nm-thickness in terms of an oxide film.

Figure 11B:
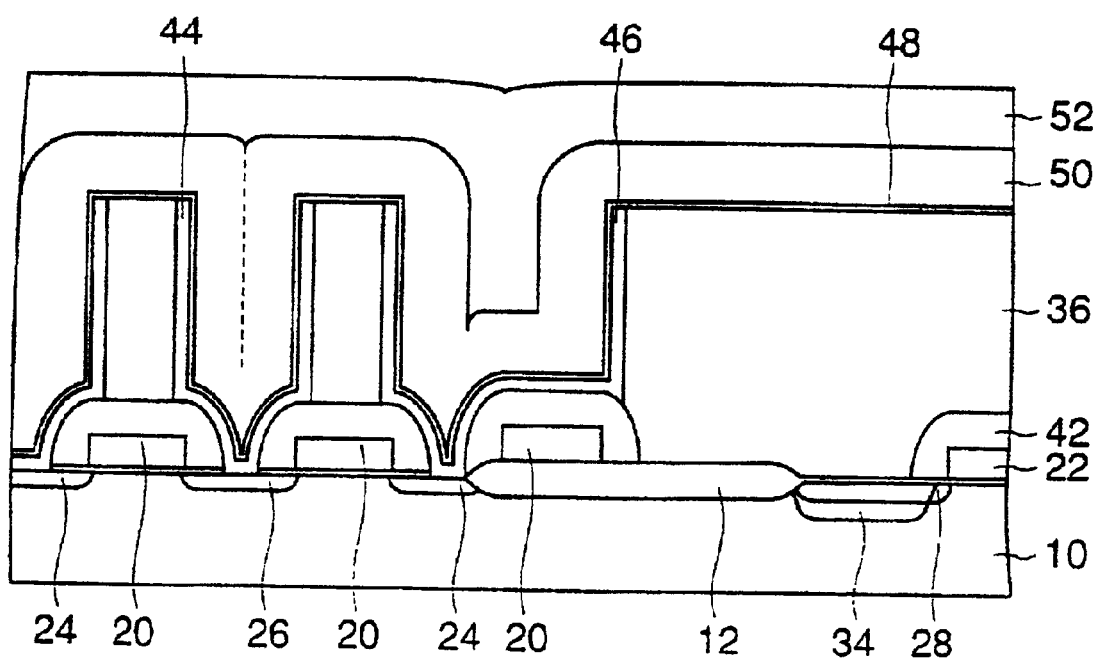

Then, an about 150 nm-thick polycrystalline silicon film 50 containing a high concentration of P, and an about 200 nm-thick of BPSG film 52 are successively formed, and then the surface of the BPSG film 52 is planarized by reflow or CMP. At this time, the through-holes 38 are completely filled by the polycrystalline silicon film 50 (FIG. 11B).

Figure 12A:
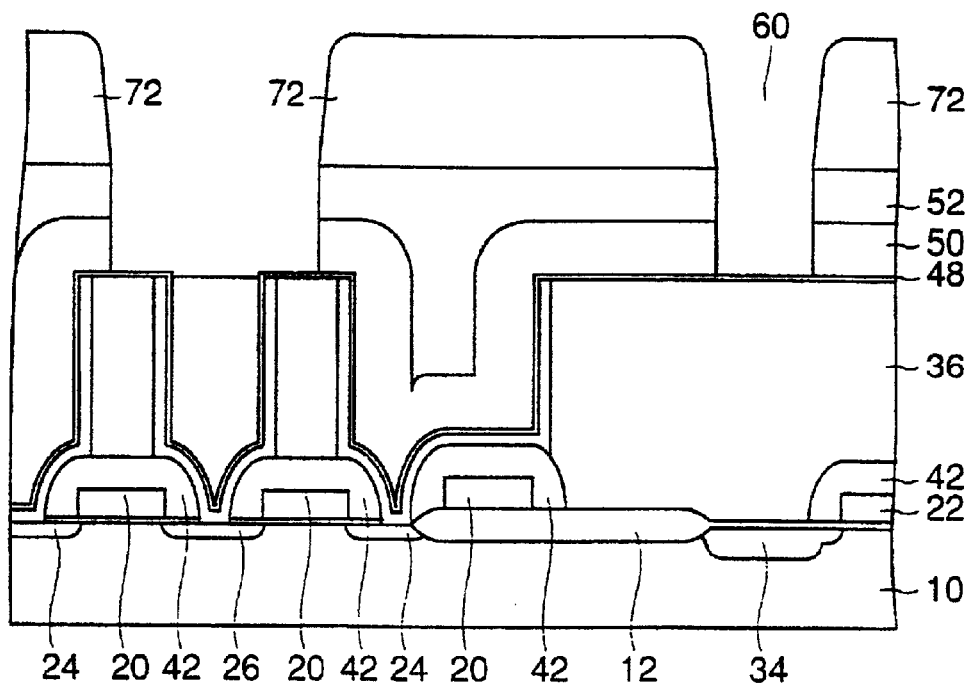
FIGS. 12A and 12B are sectional views of the semiconductor storage device according to the second embodiment in steps of a method for fabricating the semiconductor storage device (Part 3).

Subsequently, a photoresist 72 is patterned by the usual lithography, using a positive photoresist, and then the BPSG film 52 and the polycrystalline silicon film 50 are successively etched to formed the capacitor opposed electrodes 54. At this time, the polycrystalline silicon film 50 and the BPSG film 52 in the peripheral circuit region are opened down to the top of the capacitor dielectric films 48 only in the regions with the peripheral circuit through-holes 60 formed in (FIG. 12A).

Then, with the photoresist 72 left, a photoresist is patterned by the use of a negative photoresist to form a photoresist 74 for covering the memory cell region. In patterning of the photoresist 74, precise alignment is not necessary as long as the memory cell region can be covered, which drastically simplifies the lithography step.

The photoresist 74 is formed by the use of a negative photoresist for the prevention of an inconvenience that the lower photoresist 72 is peeled together. Accordingly, it is possible to cure the photoresist 72 by, e.g., UV immediately after the photoresist 72 is patterned, and then the patterning is conducted by the use of a positive resist.

Figure 12B:
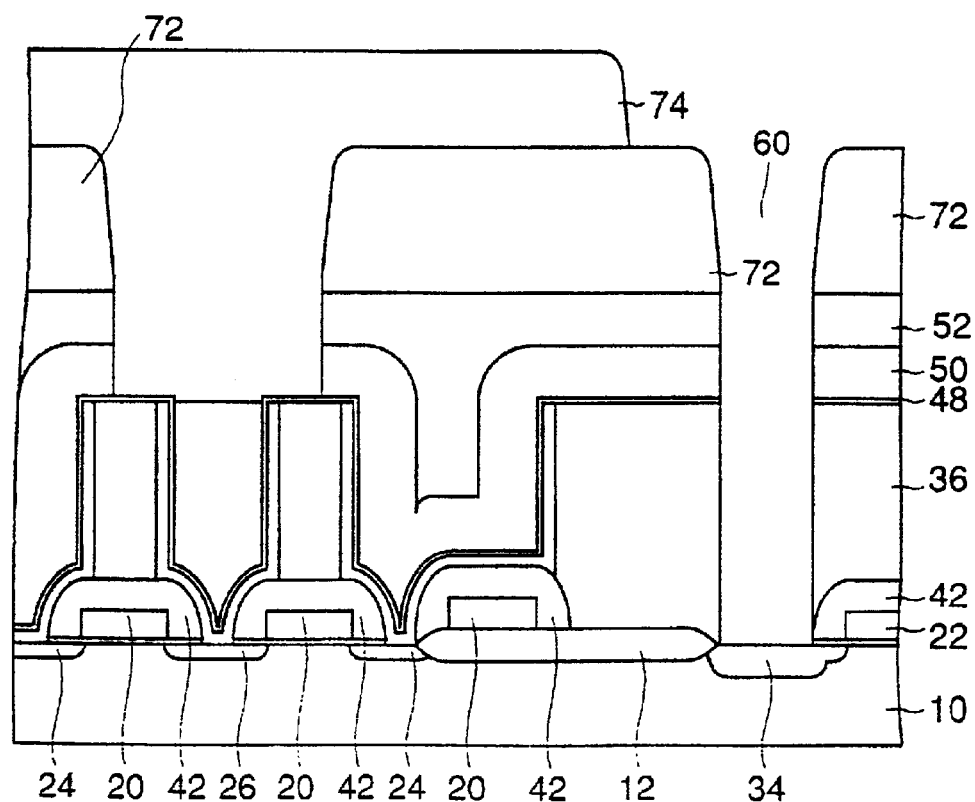

Subsequently, etching is conducted with the photoresists 72, 74 as a mask to completely open the through-holes 60 in the peripheral circuits (FIG. 12B).

After the photoresists 72, 74 have been removed, an about 100 nm-thick silicon oxide film is deposited, and the entire surface is subjected anisotropic etching, whereby the sidewall oxide films 56 are formed on the sidewalls of the capacitor opposed electrodes 46, and the sidewall oxide films 76 are formed on the inside walls of the through-holes 60. Simultaneously therewith the capacitor dielectric films 48 on the through-holes 38 are removed.

Figure 13A:
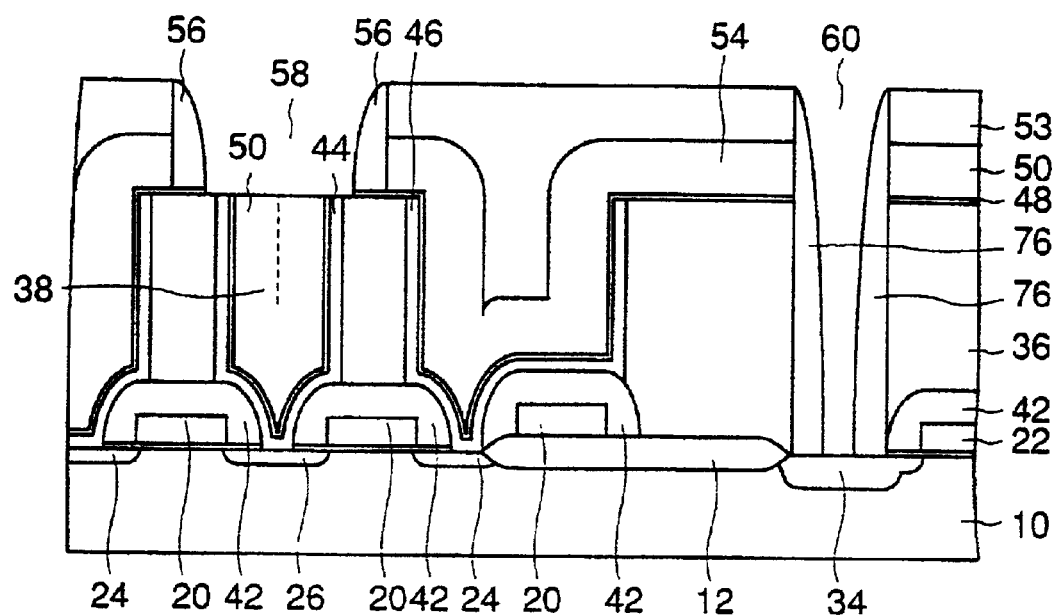
FIGS. 13A and 13B are sectional views of the semiconductor storage device according to the second embodiment in steps of a method for fabricating the semiconductor storage device (Part 4).

Thus, the capacitor opposed electrodes 54 are covered with the inter-layer insulation film 53 formed of the sidewall oxide films 56 and the BPSG films. so that the openings formed on the through-holes 38 can be used as the bit line contact holes 58. That is, the sidewall oxide films 56 are formed, and at the same time the bit line contact holes 58 are formed by self-alignment (FIG. 13A).

Then, successively an about 50 nm-thick Ti film is formed by collimated sputtering, and an about 50 nm-thick TiN film and an about 200 nm-thick W film are formed by CVD. Then, a laminated film of the W/TiN/Ti film is patterned to form the bit lines 62 and the wiring layer 68.

Then, the inter-layer insulation film 64 of an about 1 μm thick silicon oxide film is deposited by CVD, and the surface of the inter-layer insulation film 64 is planarized by CMP or other technique as required. Then, via holes 66 are opened.

Subsequently, a W film is deposited CVD and then patterned to form the wiring layers 70.

Figure 13B:
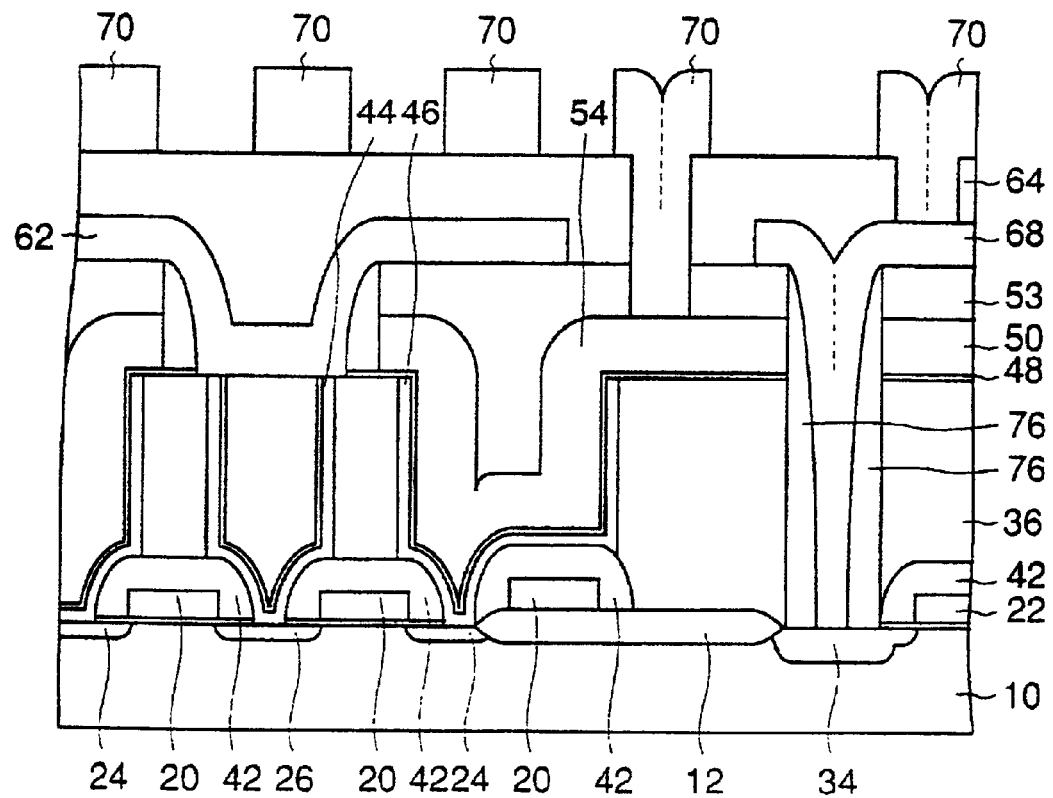

Thus, a DRAM comprising 1-transistor and 1-capacitor memory cells is formed (FIG. 13B).

As described above, according to the present embodiment, lithography steps necessary to form precise patterns in fabricating the semiconductor storage device are 7 steps for defining the device isolation region, forming the gate electrodes, opening the through-holes for the capacitor storage electrodes and the through-holes for the bit line contact, and forming the capacitor opposed electrodes, the bit lines, the via holes and the wiring layers. The lithography step simplified by the present embodiment is for opening the through-holes in the peripheral circuit region. In comparison with the conventional example of FIG. 60, the present embodiment can decrease lithography steps by one step and can simplify one lithography step.

In comparison with the conventional example of FIG. 59, as in the first embodiment, the alignment allowance between the through-holes for the capacitor storage electrodes and the through-holes for the bit line contact with the gate electrodes can be smaller.

In the above-described embodiment, in opening the through-holes in the peripheral circuit region, the photoresist 72 is formed; the through-holes are opened down to the top surface of the capacitor dielectric films 48, and then the photoresist 74 is formed without removing the photoresist 72; and the through-holes 60 are completely opened. the through-holes 60 may be opened by the following fabrication method.

A BPSG film is deposited as shown in FIG. 11B and then an about 100 nm-thick polycrystalline silicon film 78 is deposited by CVD.

Figure 14A:
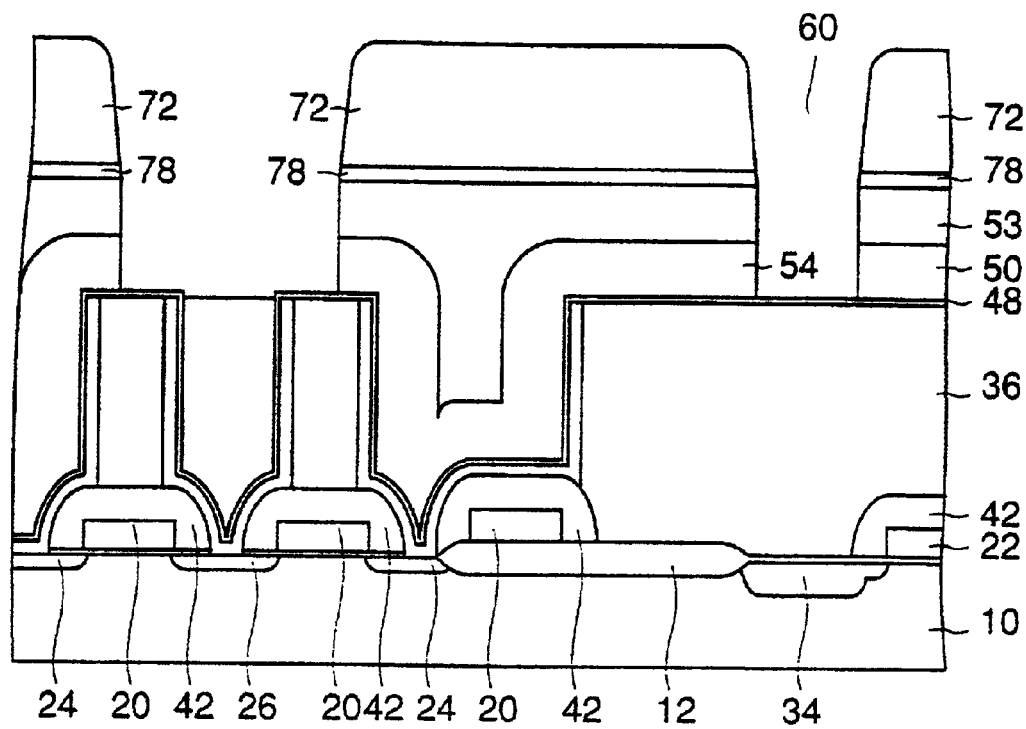
FIGS. 14A and 14B are diagrammatic sectional views of the semiconductor storage device according to one variation of the second embodiment of the present invention explaining a structure thereof.

Then, a photoresist 72 is patterned by the usual lithography, and next the polycrystalline silicon film 78, the BPSG film 52 and the polycrystalline silicon film 50 are successively etched to form the capacitance-opposed electrodes 54. At this time, without removing the polycrystalline silicon film 50 and the BPSG film 52 in the peripheral circuit region, the polycrystalline silicon film 50 is opened down to the capacitor dielectric films 48 only in the regions of the peripheral circuit region for the through-holes 60 to be formed in (FIG. 14A).

After the photoresist 72 is removed, the photoresist 74 is again patterned by the usual lithography to cover the memory cell region with a photoresist 74.

Figure 14B:
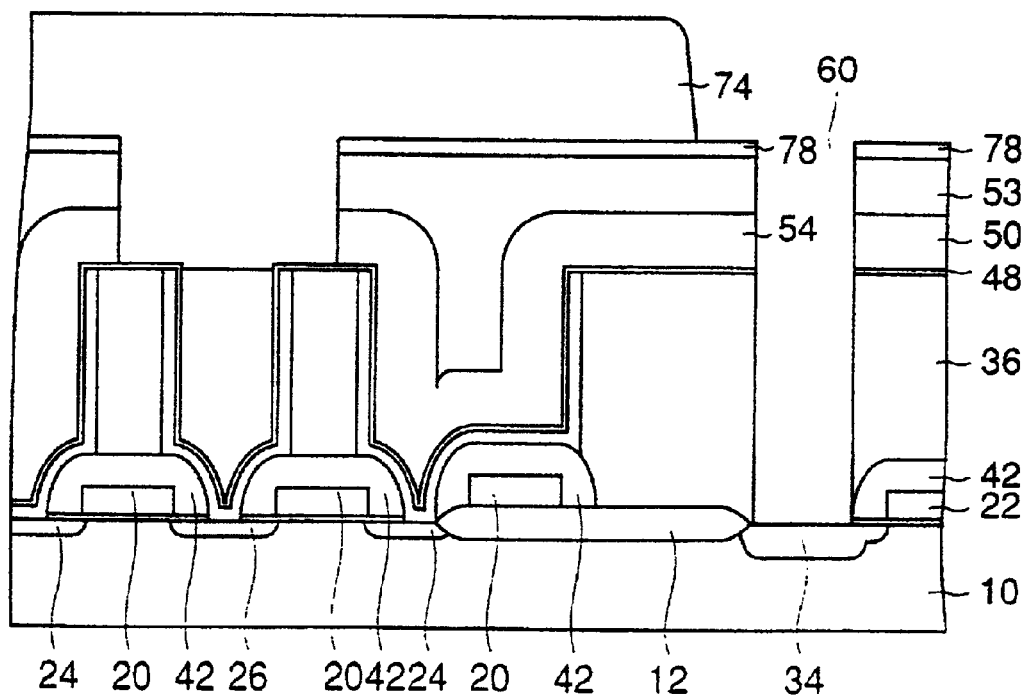

Subsequently, with the photoresist 74 as a mask, the capacitance dielectric film 48 and the inter-layer insulation film 36 are etched to completely open the through-holes 60. At this time, the inter-layer insulation film 53 is not etched in etching the through-holes 60 because of the polycrystalline silicon film 78 formed on the inter-layer insulation film 53. Thus, no subtle alignment precision is unnecessary in patterning the photoresist 74, which simplifies the lithography step (FIG. 14B).

The polycrystalline silicon film 78 remains after the through-holes 74 have been opened but causes no trouble if patterned together with the bit lines 62 formed thereon.

Third Embodiment

The semiconductor storage device according to a third embodiment of the present invention and the method for fabricating the same will be explained with reference to FIGS. 15 to 18. Common members of the semiconductor storage device and the method for fabricating the same according to the third embodiment with those according to the first and the second embodiments are represented by common reference numerals to simplify and not to repeat their explanation.

Figure 15:
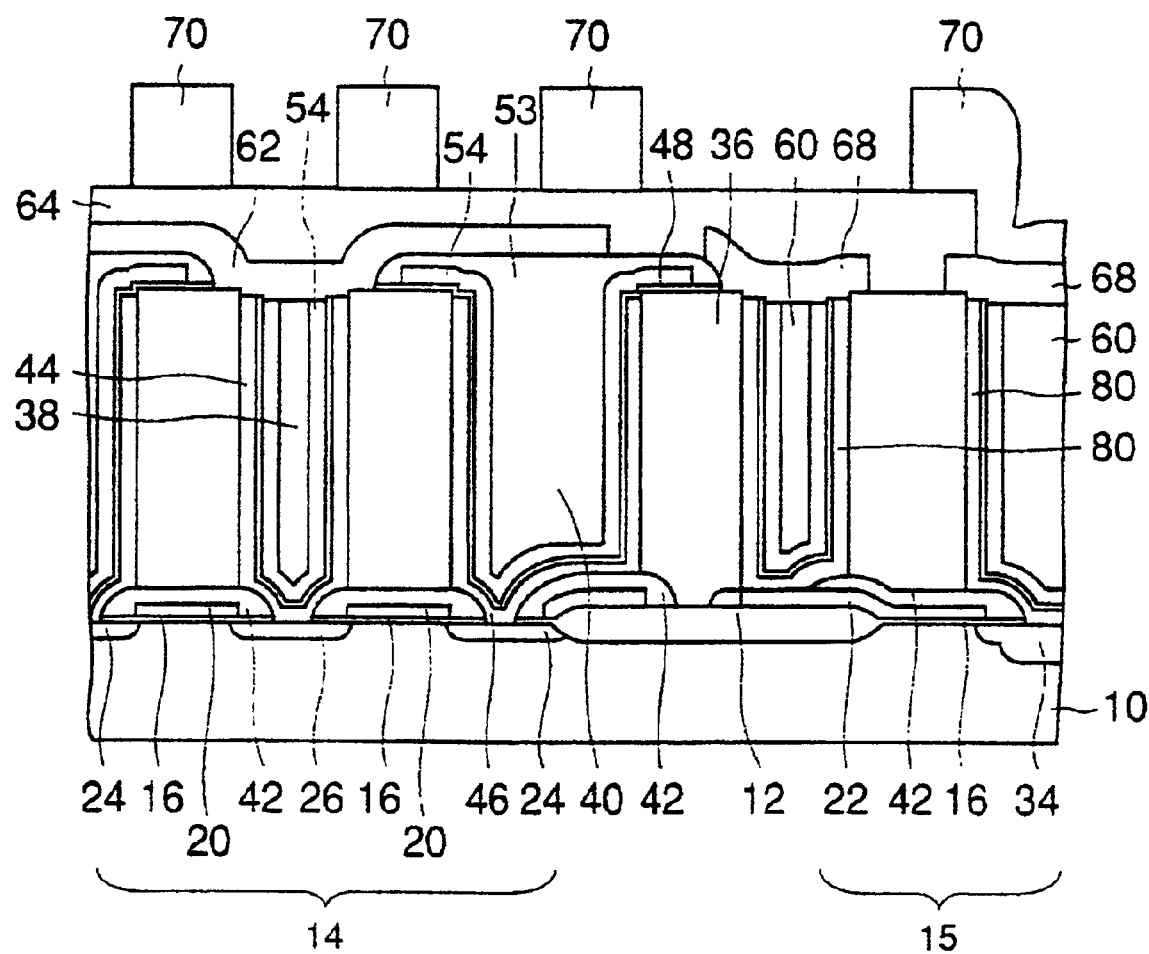
FIG. 15 is a diagrammatic sectional view of the semiconductor storage device according to a third embodiment of the present invention explaining the structure thereof.

FIG. 15 is a diagrammatic sectional view of the semiconductor storage device according to the present embodiment. FIGS. 16A–16C, 17A–17B, and 18A–18B are sectional views of the semiconductor storage device according to the present embodiment in the steps of the method for fabricating the same, which explain the fabrication method.

The present embodiment uses the same structure the bit line contact and the contact of the peripheral circuit region, whereby the method for fabricating the semiconductor storage device according to the first and the second embodiments can be further simplified.

First, the structure of the semiconductor storage device according to the present embodiment will be explained.

Device regions 14, 15 are defined on a silicon substrate 10 by a device isolation film 12. Source diffused layers 24 and the drain diffused layers 26 are formed independent of each other in the device region 14. Gate electrodes 20 are formed through gate oxide films 16 on parts of the semiconductor substrate 10 between the source diffused layers and the drain diffused layers 26. Thus, the gate electrodes 20, the source diffused layers 24 and the drain diffused layers 26 constitute memory cell transistors.

The gate electrodes 20 constitute word lines which function as gate electrodes of the memory cell transistors of other plural memory cells.

On the semiconductor substrate 10 with the memory cell transistors formed on there is formed an inter-layer insulation film 36 with through-holes 38 opened on the drain diffused layers 26 and through-holes 40 opened on the source diffused layers 24. Insulation films 42 is formed on the gate electrodes 20 by self-alignment, covering the gate electrodes 20, and the through-holes 38, 40 are formed by self-alignment with the insulation films 42.

Capacitor storage electrodes 46 of TiN film are formed on the inside walls of the through-holes 40 and on the source diffused layers 24 and are connected to the source diffused layers 24 at the bottoms of the through-holes 40. Capacitor dielectric films 48 are formed on the inside walls and the top surfaces of the capacitor storage electrodes 46. Capacitor opposed electrodes 54 are formed in the through-holes 40 with the capacitor storage electrodes 46 and the capacitor dielectric films 48 formed thereon, and on the inter-layer insulation film 36. Thus, the capacitor storage electrodes 46, the capacitor dielectric films 48 and the capacitor opposed electrodes 54 constitute capacitors.

Contact conducting films 44 of TiN film are formed on the inside walls of the through-holes 38 and are connected, through the inter-layer insulation film 53 formed on the capacitor opposed electrodes 54, to bit lines 62 arranged normal to word lines.

Wiring layers 70 are formed above the bit lines 62 through inter-layer insulation film 64. A DRAM comprising 1-transistor and 1-capacitor memory cells is constituted.

On the other hand, in the device region 15, peripheral circuit region neighboring the memory cell region, source diffused layers (not shown) and the drain diffused layers 34 are formed independent of each other. Gate electrodes 22 are formed through gate oxide films 16 on parts of the semiconductor substrate 10 between the source diffused layers and the drain diffused layers 34. Thus, peripheral circuit transistors comprising the gate electrodes 22, the source diffused layers and the drain diffused layers 34 are constituted.

Through-holes 60 are formed in the inter-layer insulation film 36 on the drain diffused layers 34, and the gate electrodes 22. Conducting films 80 of TiN film are formed on the inside walls and the bottom of the through-holes 60, and the drain diffused layers 34 and the gate electrodes 22 are connected to the wiring layers 68 through the conducting films 80.

Then, the method for fabricating the semiconductor storage device according to the present embodiment will be explained.

First, a device isolation film 12 of an about 300 nm-thickness are formed on the major surface of a p-silicon substrate by, e.g., the usual LOCOS to define the device regions 14, 15. Then, gate oxide film 16 of an about 10 nm thickness is formed in the device regions 14, 15 by thermal oxidation.

Subsequently, an about 150 nm-thick polycrystalline silicon film containing a high concentration of P and an about 200 nm-thick silicon nitride film are successively formed by CVD and then part of the silicon nitride film in the peripheral circuit region is removed by the usual lithography. This region is to be a gate contact 82 through which wiring of the gate electrodes 22 are to be led out.

A silicon nitride film and a polycrystalline silicon film are concurrently patterned by the usual lithography and etching to form the gate electrodes 20 of the memory cell transistors and the gate electrodes 22 for peripheral circuits.

The top surfaces of the thus-formed gate electrodes 20, 22 are covered with the silicon nitride films 18 except the gate contact 82 of the peripheral circuit region.

Figure 16A:
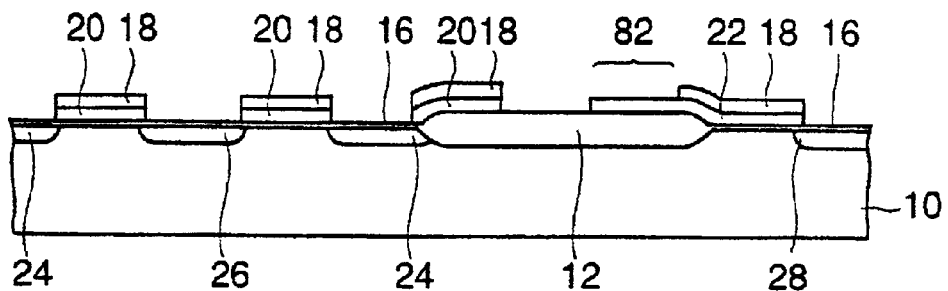
FIGS. 16A–16C are sectional views of the semiconductor storage device according to the third embodiment in steps of a method for fabricating the semiconductor storage device (Part 1).

Then, with the silicon nitride films 18 and the gate electrodes 20, 22 as a mask, the source diffused layers 24 and the drain diffused layers of the memory cell transistors, and the low concentration diffused layers 28 of the peripheral circuit transistors are formed by implanting, for example, P ions under the conditions of a 40 keV acceleration energy and a $2\times10^{13}$ ions $cm^{-2}$ dose. The low concentration diffused layers 28 are to be n⁻ layers of LDD structure (FIG. 16A).

Next, an about 100 nm-thick silicon nitride film is formed and then is subjected to anisotropic etching using $CHF_3/H_2$ gas to form by self-alignment sidewall nitride films 30 of the silicon nitride film on the sidewalls of the patterned silicon nitride films 18 and gate electrodes 20, 22, whereby the sidewalls and the top surfaces of the gate electrodes 20, 22 are covered with the silicon nitride films 18 and the sidewall nitride films 30. Hereinafter the silicon nitride films 18 and the sidewall nitride films 30 covering the gate electrodes 20, 22 will be collectively called an insulation film 42 for the convenience of explanation.

Figure 16B:
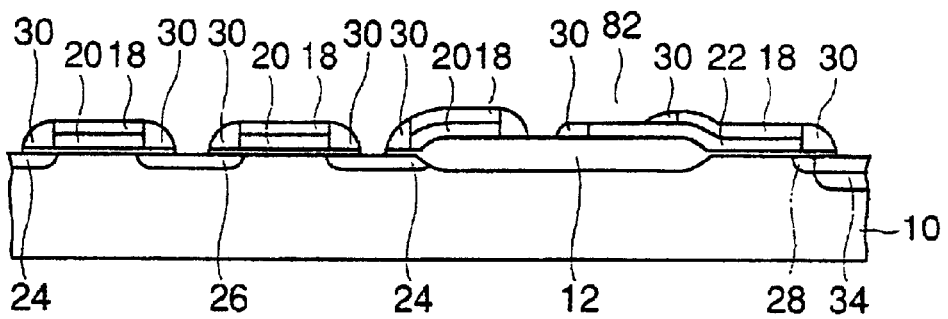

Subsequently, source diffused layers 32 and drain diffused layers 34 of the peripheral circuit n-transistors are formed by selectively implanting, by the usual lithography, in the peripheral circuit n-transistors, for example, As ions under the conditions of a 40 keV acceleration energy and a $4\times10^{15}$ ions $cm^{-2}$ dose. Thus, peripheral circuit transistors having an LDD structure are constituted (FIG. 16B).

Subsequently, a silicon oxide film is deposited in an about 2.5 $\mu$m by CVD, and the surface of the silicon oxide film is polished about 0.5 $\mu$m by CMP for planarization.

In place of the 2,5 $\mu$m-thick silicon oxide film, for example, a laminated film of a 50 nm-thick silicon oxide film and a 2 $\mu$m-thick BPSG film are deposited, and the surface of the laminated film may be planarized by reflowing the BPSG films for about 15 minutes at 850° C. in a nitrogen atmosphere.

Then, a photoresist is patterned by the usual lithography, and then the silicon oxide film is etched with an etching gas, such as $C_2F_6$ or others.

Figure 16C:
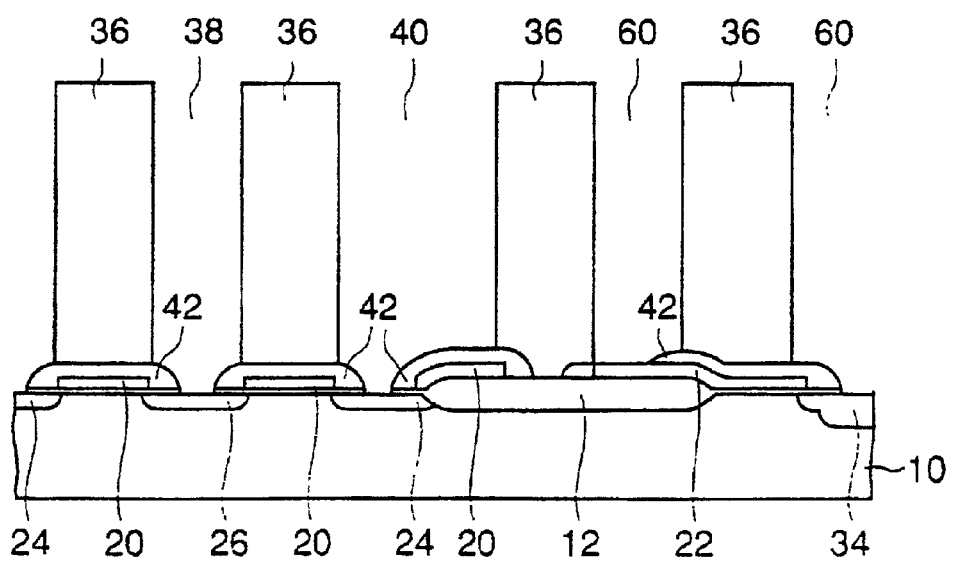

Next, the photoresist is removed, and inter-layer insulation film 36 with the through-holes 38 opened on the drain diffused layers 26 of the memory cell transistors, the through-holes 40 opened on the source diffused layers of the memory cell transistors and the through-holes 60 of the peripheral circuit region is formed (FIG. 16C).

The drain diffused layers 26 and the source diffused layers 24 are exposed on the bottoms of the thus-formed through-holes 38, 40. These exposed regions for the drain diffused layers 26 and the source diffused layers 24 exposed on are formed by self-alignment with the insulation film 42. Accordingly, no alignment allowance for the alignment with the gate electrodes 20 is necessary in patterning the through-holes 38, 40. A memory cell area can be accordingly reduced by an alignment allowance.

On the other hand, the gate electrodes 22 and the drain diffused layers 34 are exposed on the bottoms of the through-holes 60. The insulation films 42 on the gate electrodes 22 have been removed in the gate contact 82 for the through-hole 60 to be formed in, so that the through-hole 60 can be opened together with the through-holes 38, 40, whereby the gate electrodes 22 can be exposed in the through-holes 60.

Figure 17A:
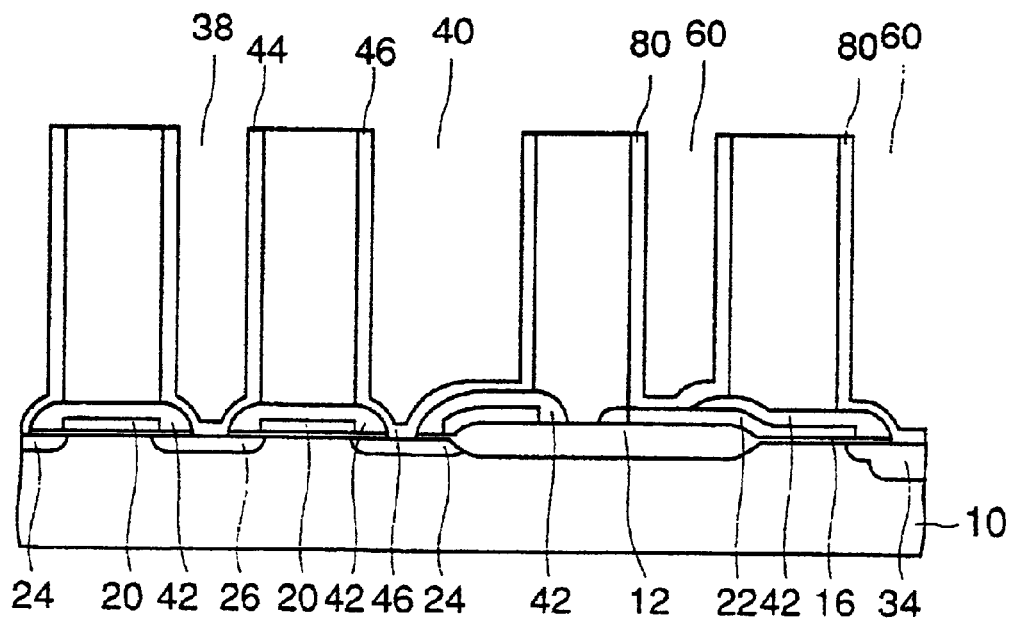
FIGS. 17A and 17B are sectional views of the semiconductor storage device according to the third embodiment in steps of a method for fabricating the semiconductor storage device (Part 2).

Subsequently, an about 10 nm-thick Ti film and an about 20 nm-thick TiN film are successively formed by CVD, and the TiN film and of Ti film on the inter-layer insulation film 36 are completely removed. Thus, the contact conducting films 44, the capacitor storage electrodes 46 and the conducting films 80 are formed by self-alignment respectively in the through-holes 38, the through-holes 40 and the through-holes 60 in the peripheral circuit region (FIG. 17A).

In forming the conducting films 80, it is possible that the Ti film is deposited mainly on the bottoms of the through-holes by collimated sputtering having more vertical sputtering component, and then the TiN film is grown by CVD.

In forming the contact conducting films 44, the capacitor storage electrodes 46 and the conducting films 80, it is possible that the photoresist is left in the through-holes 38, the through-holes 40 and the through-holes 60, and with the photoresist as a mask, the Ti film and the TiN film is etched off by using lithography in place of CMP.

The electric resistance of the conducting films 80 buried in the through-holes 60 of the peripheral circuit region is very important because the operation speed of a peripheral circuit depends on the electric resistance. An electric resistance of the conducting films 80 is sufficiently as low as about 75 Ω since a sheet resistance of the thus-formed conducting films 80 is about 30 Ω/□, a depth of the through-holes 60 is about 2 $\mu$m, and a circumferential edge length of the through-holes 60 is about 0.8 $\mu$m.

Then, an about 5 nm-thick silicon nitride film is formed by CVD at a low temperature of about 650° C. and then is thermally treated for 10 minutes in a 4 atmospheric pressure wet atmosphere of 700° C. to oxide the surface of the silicon nitride film and form the capacitor dielectric films 48.

This thermal treatment causes the Ti films of the bottoms of the through-holes 38, 40, 60 to have silicidation with the base source/drain diffused layers 24, 26, 32, 34 or the gate electrodes 22, and contact resistances of these connections are decreased.

The thermal treatment for forming the capacitor dielectric films 48 used, as described above, high pressure oxidation at the low temperature. This is because the high-pressure oxidation, which allows the thermal treatment temperature to be low, is preferable because when the TiN film reacts with the silicon nitride film in a high-temperature thermal treatment, there is a risk that the capacitor dielectric films 48 may lower its breakdown voltage.

Then, the polycrystalline silicon film 50 containing a high concentration of P and the silicon oxide film 52 are successively formed by CVD respectively in an about 150 nm thickness and an about 200 nm thickness. Thus, the through-holes 38, 40, 60 are filled.

Figure 17B:
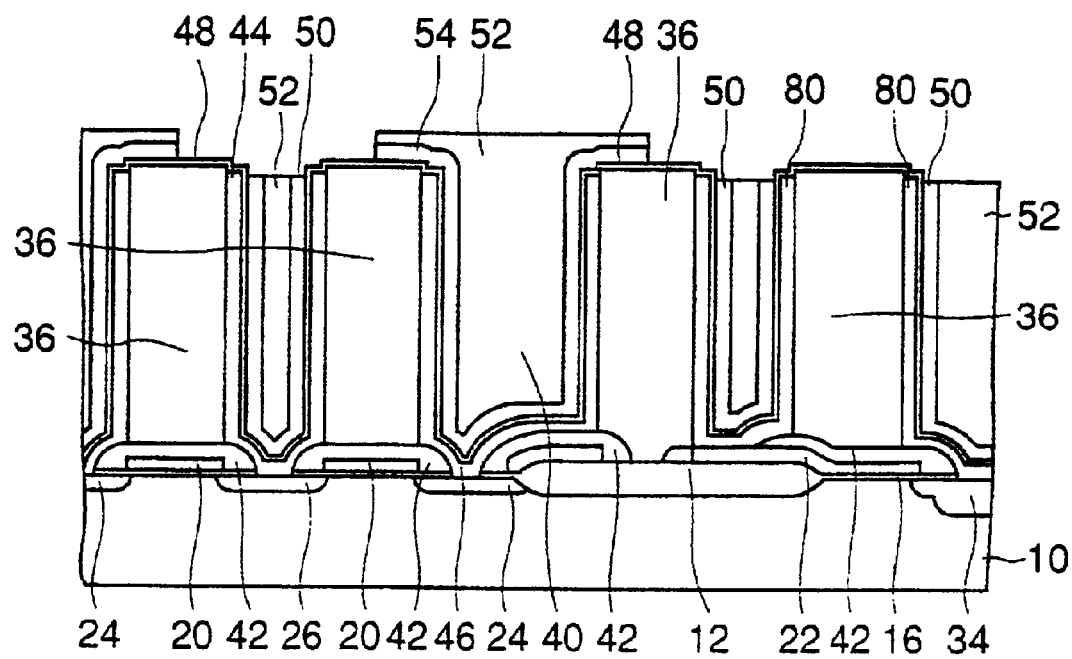

Subsequently, the silicon oxide film 52 and the polycrystalline silicon film 50 are together patterned by the usual lithography and etching to form the capacitor opposed electrodes 54 (FIG. 17B).

The silicon oxide film 52 and the polycrystalline silicon film 50 remain, buried in the through-holes 38, 60, but these films contribute only to planarization without troubles.

A material of the capacitor opposed electrodes 54 may be TiN film deposited by CVD, but in the present embodiment polycrystalline silicon film 50 is used because the dielectric films may be damaged in growing the TiN film using a chlorine-based reactive gas.

Then, an about 100 nm-thick silicon oxide film is deposited by CVD, and the entire surface is subjected to anisotropic etching to form the sidewall oxide films 56 on the sidewalls of the capacitor opposed electrodes 54, simultaneously removing the capacitor dielectric films 48 on the through-holes 38.

Figure 18A:
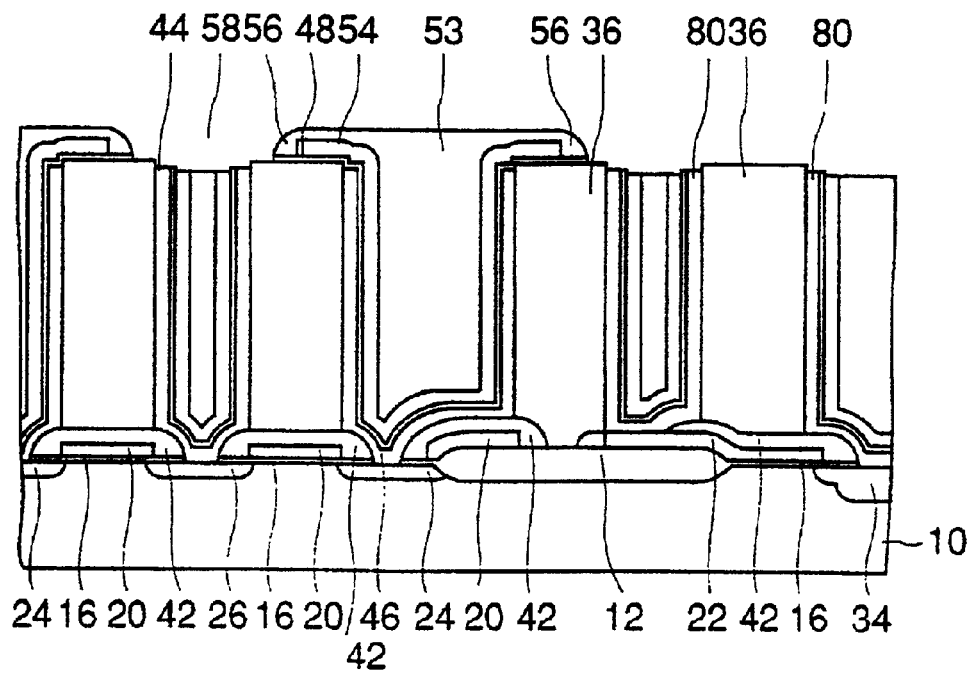
FIGS. 18A and 18B are sectional views of the semiconductor storage device according to the third embodiment in steps of a method for fabricating the semiconductor storage device (Part 3).

Thus, the capacitor opposed electrodes 54 are covered with the sidewall oxide films 56 and the inter-layer insulation film 53, so that the openings formed on the through-holes 38 can be used as bit line contact holes 58. That is, the bit line contact holes 58 can be self-aligned simultaneously with formation of the sidewall oxide films 56 (FIG. 18A).

Subsequently, an about 50 nm-thick Ti film is formed by collimated sputtering, and an about 50 nm-thick TiN film and an about 200 nm-thick W film are formed by CVD. Then, a laminated film of the W/TiN/Ti film is patterned to form the bit lines 62 and the wiring layers 68.

Next, the inter-layer insulation film 64 of an about 1 $\mu$m-thick silicon oxide film is deposited by CVD, and the surface of the film is planarized by CMP or others as required, and then the via hole 66 is opened.

Subsequently, a W film is deposited by CVD and then patterned to form the wiring layers 70.

Figure 18B:
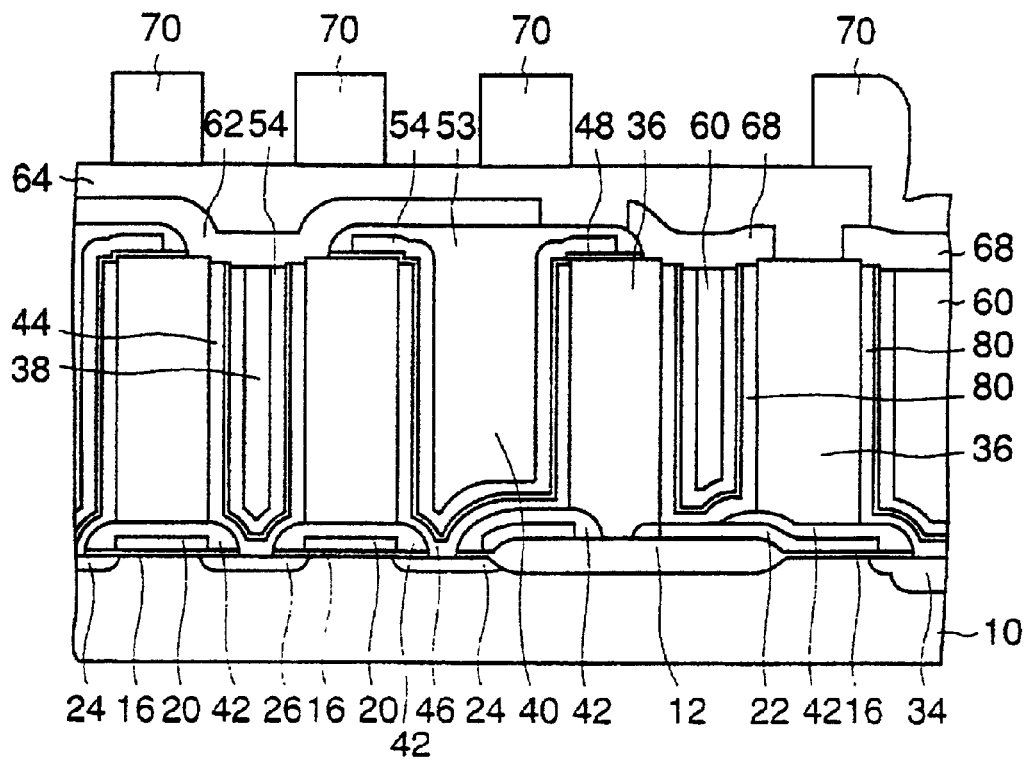

Thus, a DRAM comprising 1-transistor and 1-capacitor memory cells is constituted (FIG. 18B).

As described above, according to the present embodiment, the conducting films buried in the through-holes for connecting the bit lines and the memory cell transistors are formed of a material of low resistance, whereby the through-holes of the peripheral circuit region and those of the memory cell region can have the same structure. One lithography step can be omitted.

Accordingly, lithography steps which need precise patterning are for defining the device isolation region, forming the gate electrodes, opening the through-holes, and forming the capacitor opposed electrodes, the bit lines, the via hole, and the wiring layers, totally 7 steps. In comparison with the conventional example shown in FIG. 60, two lithography steps can be decreased.

In comparison with the conventional example of FIG. 59, one lithography step can be decreased, and furthermore, in the present embodiment, the through-holes for the capacitor storage electrodes and the through-holes for the bit line contact are formed by self-alignment with the gate electrodes. This makes it possible to decrease alignment allowances. This also makes it possible to decrease a thickness of the capacitor storage electrodes, whereby decreases of a capacitance can be prevented.

The semiconductor storage device according to the present embodiment includes the capacitor storage electrodes formed of TiN film, the capacitor dielectric film formed of SiN film, and the capacitor opposed electrodes formed of polycrystalline silicon film. As described, however, in, e.g., K. Koyama (Technical Digest IEDM 1992, p. 823 (1992)), H. Shinriki (IEEE Trans., Electron Devices, vol. 38, No. 3, p. 455 (1991)), the capacitor may be constituted by capacitor dielectric films of a high and intense dielectric film, such as $Ta_2O_5$ film, $(Ba_xSr_{1-x})TiO_3$ film or others, and the capacitor storage electrodes and the capacitor opposed electrodes may be formed of an electrode material, such as W or Pt, which are usable for the above-described dielectric films.

The capacitors are formed of such high and intense dielectric film, whereby sufficient capacitances can be secured even with reduced surface areas of the capacitor electrodes. In the case that among the highest dielectric constant one of the above-described materials is used, very effectively the through-holes can be shallowed up to about 0.2 $\mu$m.

In the above-described embodiment, the capacitor-storage electrodes and the capacitor opposed electrodes are formed of a laminated film of Ti film and TiN film but may be formed of any other material as long as it is a conducting film which can sufficiently lower the contact resistance.

Fourth Embodiment

The semiconductor storage device according to a fourth embodiment of the present invention and a method for fabricating the same will be explained with reference to FIGS. 19 to 21. Common members of the present embodiment with the semiconductor storage device and the method for fabricating the same according to the third embodiment shown in FIGS. 15 to 18 are represented by common reference numerals to simplify and not repeat their explanation.

Figure 19:
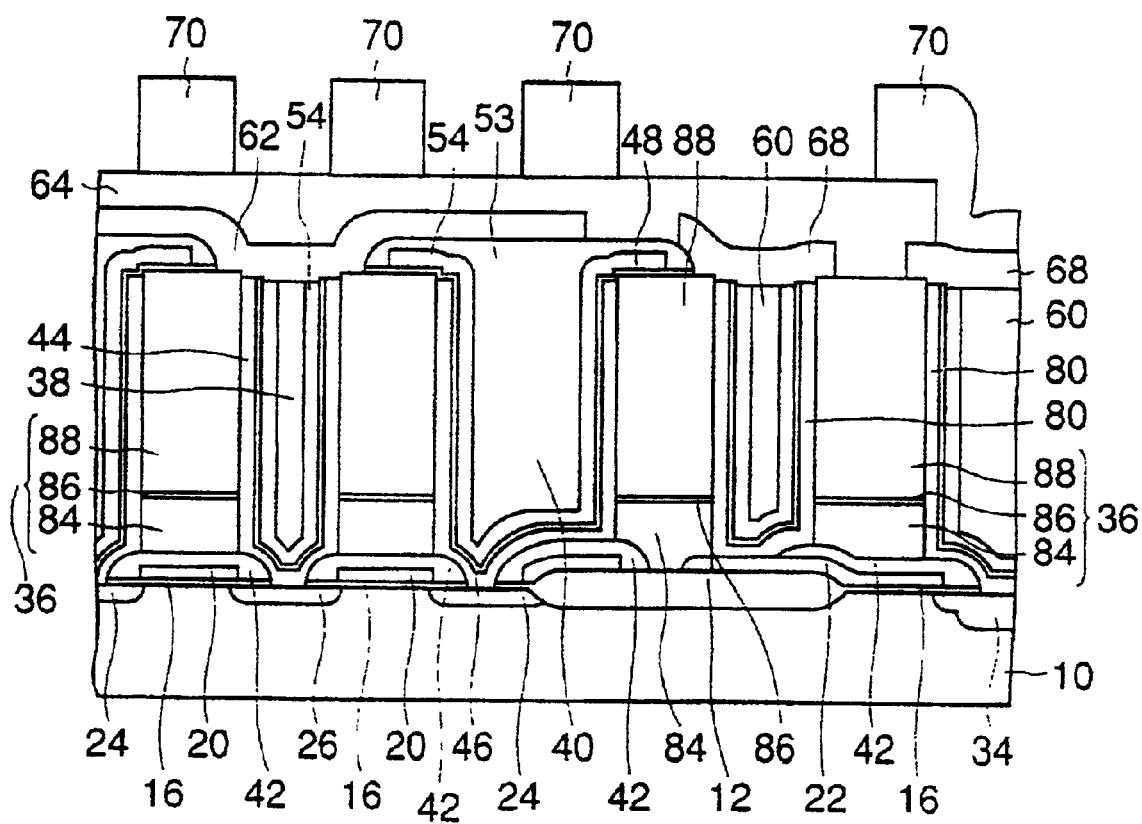
FIG. 19 is a diagrammatic sectional view of the semiconductor storage device according to a fourth embodiment of the present invention explaining a method for fabricating the semiconductor storage device.

FIG. 19 is a diagrammatic sectional view of the semiconductor storage device according to the present embodiment, and FIGS. 20A–20C, and 21A–21B are sectional views of the semiconductor storage device according to the present embodiment in the steps of the method for fabricating the same, which explain the method.

In the first to the third embodiments, to open the through-holes 38, 40, etc., the inter-layer insulation film 36 of an about 2 $\mu$m-thickness is once etched. In the actual fabrication process, it is usual to conduct overetching corresponding to a film thickness of the inter-layer insulation film, taking into consideration disuniformity of the film thickness upon forming the film. Accordingly, considerable overetching is needed to etch the inter-layer insulation film 36 of an about 2 $\mu$m-thickness.

To open the through-holes 38, 40, the insulation films 42 are used as etching stoppers, whereby the self-aligned contact is formed. Silicon nitride films formed on steps, such as the insulation films 42, have lower etching selectivity with respect to silicon oxide film than silicon nitride film formed on plane portions. Etching of the insulation films 42 tend to accelerate especially on the edges, etc. of the gate electrodes 20, 22.

Accordingly, in opening the through-holes 38, 40, etc. in a thick inter-layer insulation film, there is a risk that the insulation films 42 are excessively over-etched to expose the gate electrodes 20, 22 with a result, for example, that the contact conducting films to be buried in the through-holes 38 and the gate electrodes 20 may be short-circuited.

Thus, the formation of the through-hoes 38, 40 is one of the most difficult fabrication steps of the method of the present invention.

In the present embodiment, taking into consideration the above-described problems, the semiconductor storage device and the method for fabricating the same which make it easy to form the through-holes 38, 40 will be explained.

The semiconductor storage device according to the present embodiment is characterized in that inter-layer insulation film formed between bit lines 62 and a silicon substrate 40 are an insulation film of a three-layer structure.

That is, inter-layer insulation film 36 constituted by silicon oxide films 84, silicon nitride films 86 and silicon oxide films 88 sequentially laid one on another are formed on the semiconductor substrate 10 with memory cell transistors including gate electrodes 20, source diffused layers 24 and drain diffused layers 26 formed on.

In the inter-layer insulation film 36, the through-holes 38 opened on the drain diffused layers 26 and the through-holes 40 opened on the source diffused layers 24 are formed.

Capacitor storage electrodes 46 of TiN film are formed on the inside walls of the through-holes 40 and the source diffused layers 24 and connected to the source diffused layers 24 at the bottoms of the through-holes 40. Capacitor dielectric films 48 are formed on the inside surfaces and the top surfaces of the capacitor storage electrodes 46. Capacitor opposed electrodes 54 are formed in the through-holes 40 with the capacitor storage electrodes 46 and the capacitor dielectric films 48 formed on and on the inter-layer insulation film 36. Thus, capacitors constituted by the capacitor storage electrodes 46, the capacitor dielectric films 48 and the capacitor opposed electrodes 54.

Contact conducting films 44 are formed on the inside walls of the through-holes 38 and connected to bit lines 62 arranged normal to word lines through an inter-layer insulation film 53 formed on the capacitor opposed electrodes 54.

Wiring layers 70 are formed above the bit lines 62 through an inter-layer insulation film 64. Thus, a DRAM comprising 1-transistor and 1-capacitor memory cells is constituted.

Then, the method for fabricating the semiconductor storage device according to the present embodiment will be explained.

First, an about 300 nm-thick device isolation film 12 is formed on the major surface of the p-silicon substrate 10 by, e.g., the usual LOCOS to define a device region 14. Then, about 10 nm-thick gate oxide films 16 are formed in the device region 14 by thermal oxidation.

Subsequently, an about 150 nm-thick polycrystalline silicon film containing a high concentration of P and an about 200 nm-thick silicon nitride film are successively formed by CVD, and then that portion of the silicon nitride film in the peripheral region is partially removed by the usual lithography and etching. This region is to be a gate contact 82 through which wiring of the gate electrodes 22 are to be led out.

Next, the silicon nitride film and the polycrystalline silicon film are patterned together by the usual lithography and etching to form the gate electrodes 20 of the memory cell transistors and the gate electrodes 22 of a peripheral circuit.

Figure 20A:
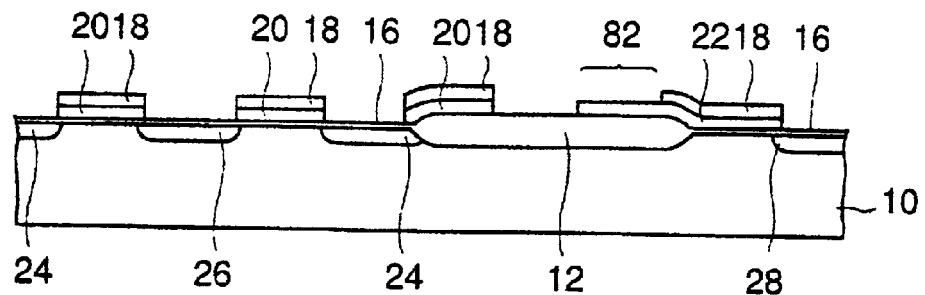
FIGS. 20A–20C are sectional views of the semiconductor storage device according to the fourth embodiment in steps of a method for fabricating the semiconductor storage device (Part 1).

Then, with the silicon nitride films 18 and the gate electrodes 20, 22 as a mask, the source diffused layers 24 and the drain diffused layers 26 of the memory cell transistors, and low-concentration diffused layers 28 of the peripheral circuit transistors are formed by implanting, for example, P ions under the conditions of a 40 keV acceleration energy and a $2 \times 10^{13}$ ions $cm^{-2}$ dose (FIG. 20A).

Next, an about 100 nm-thick silicon nitride film is formed by CVD and then is subjected to anisotropic etching by the use of $CHF_3/H_2$ gas to form the sidewall nitride films 30 of the silicon nitride film by self-alignment on the sidewalls of the patterned silicon nitride films 18 and gate electrodes 20, 22.

Figure 20B:
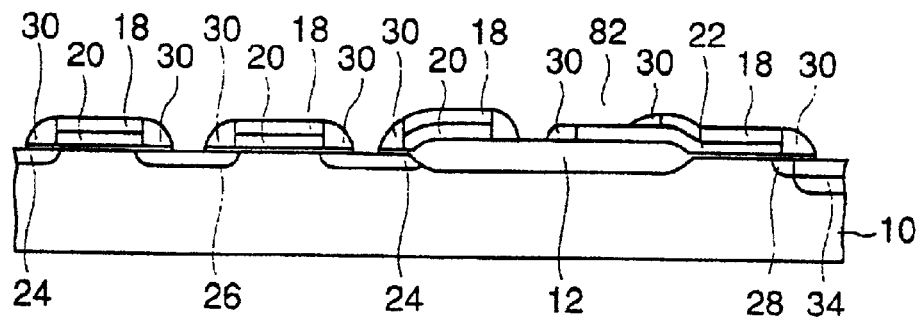

The source diffused layers and the drain diffused layers 34 of the peripheral circuit n-transistors are formed by the usual lithography by selectively implanting in the peripheral circuit n-transistor region, for example, As ions under the conditions of a 40 keV acceleration energy and a $4 \times 10^{15}$ ions $cm^{-2}$ dose (FIG. 20B).

Then, the silicon oxide film 84 is deposited in a layer about 1 μm thick by CVD, and the surface thereof is polished by about 0.7 μm by CMP for planarization. Then, the silicon nitride film 88 and the silicon oxide film 88 are successively grown respectively by 20 nm and 1.8 μm by CVD.

Figure 20C:
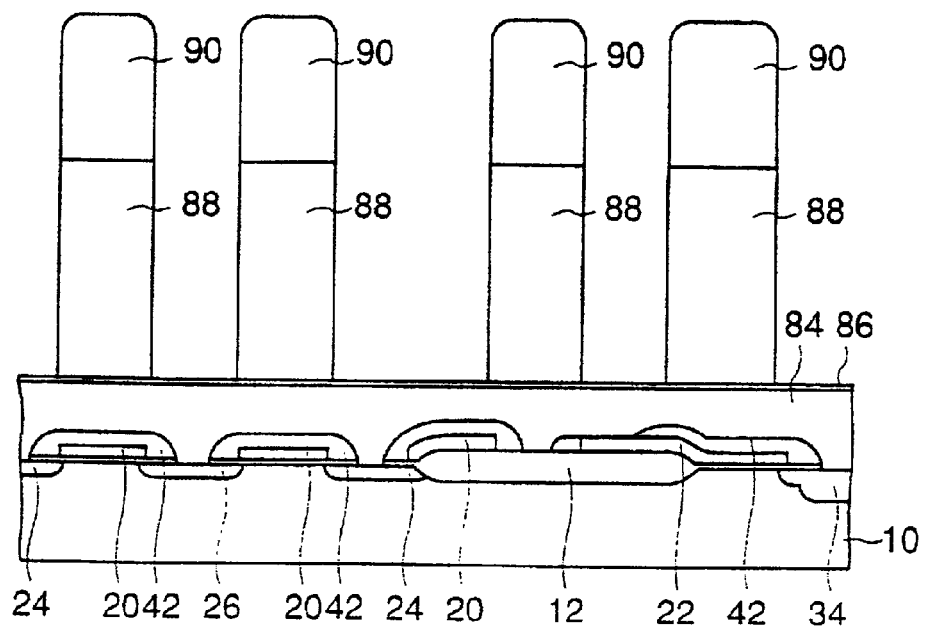

Next, a photoresist 90 is patterned by the usual lithography, and then the silicon oxide film 88 is etched by an etching gas, such as $C_2F_6$ or others. Here, the silicon nitride film 86 is deposited on the planarized silicon oxide film 84, whereby a selectivity ratio with respect to the silicon oxide film 88 can be about 100 and is sufficiently usable as the etching stopper for etching the silicon oxide film 88 (FIG. 20C).

Then, with the photoresist 90 as a mask, the silicon nitride film 86 and next the silicon oxide film 84 are etched respectively by etching gases of $CHF_3/CF_4/Ar$ and $C_2F_6$.

Figure 21A:
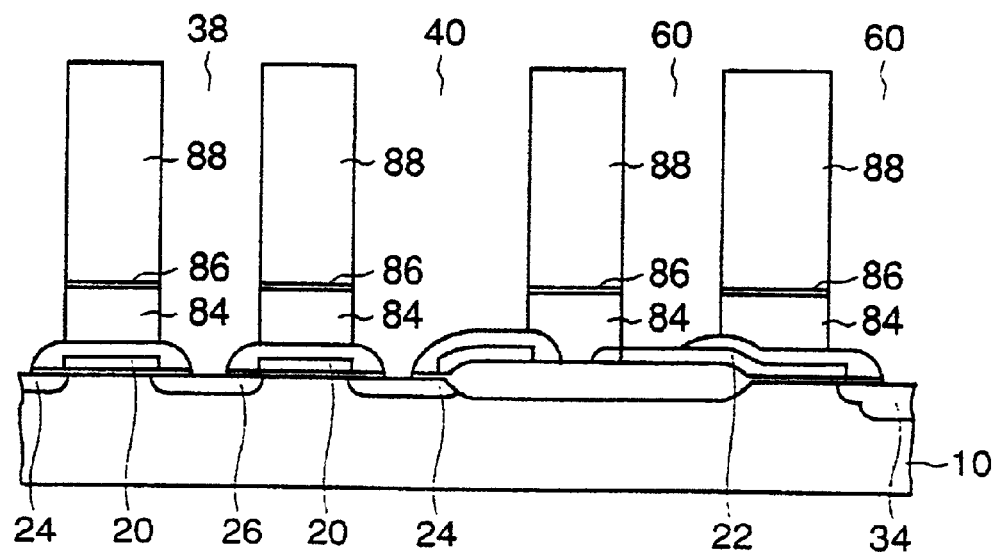
FIGS. 21A and 21B are sectional views of the semiconductor storage device according to the fourth embodiment in steps of a method for fabricating the semiconductor storage device (Part 2).

Then, the photoresist 90 is removed, and the inter-layer insulation film 36 with the through-holes 38 opened on the drain diffused layers 26 of the memory cell transistors, the through-holes 40 opened on the source diffused layers 24 of the memory cell transistors and the through-holes 60 of the peripheral circuit region formed in (FIG. 21A).

Figure 21B:
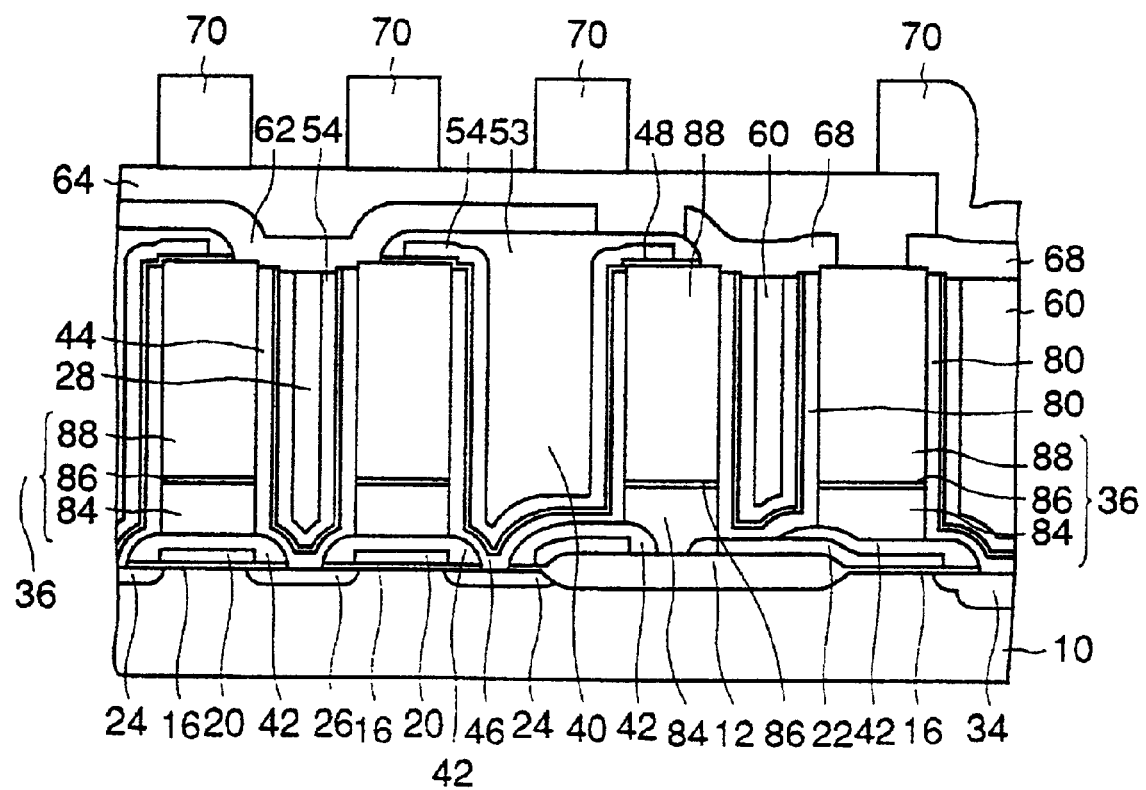

Next, the capacitors, the bit lines, the wiring layers, etc. are formed by the fabrication steps exemplified in FIG. 17A showing the third embodiment and a DRAM of FIG. 21B comprising 1-transistor and 1-capacitor memory cells is constituted.

As described above, according to the present embodiment, the etching of the very deep openings is divided in two steps, whereby the etching of one step is relatively easy. Especially in the step of etching the silicon oxide film 84 for diffusing the source diffused layers 24 and the drain diffused layers 26, 34, the silicon oxide film 84 can be much thinned, so that decreases of the thickness of the insulation films 42 on the gate electrodes 20, 22, and decreases of the thickness of the device isolation film 12 occurring when the device isolation film 12 is exposed in the openings due to unalignment or other causes in the lithography step can be reduced Fifth Embodiment The semiconductor storage device according to a fifth embodiment of the present invention and a method for fabricating the same will be explained with reference to FIGS. 22 to 24. Common members of the present embodiment with the semiconductor storage device and the method for fabricating the same according to the third embodiment shown in FIGS. 15 to 18 are represented by common reference numerals to simplify and not repeat their explanation.

Figure 22:
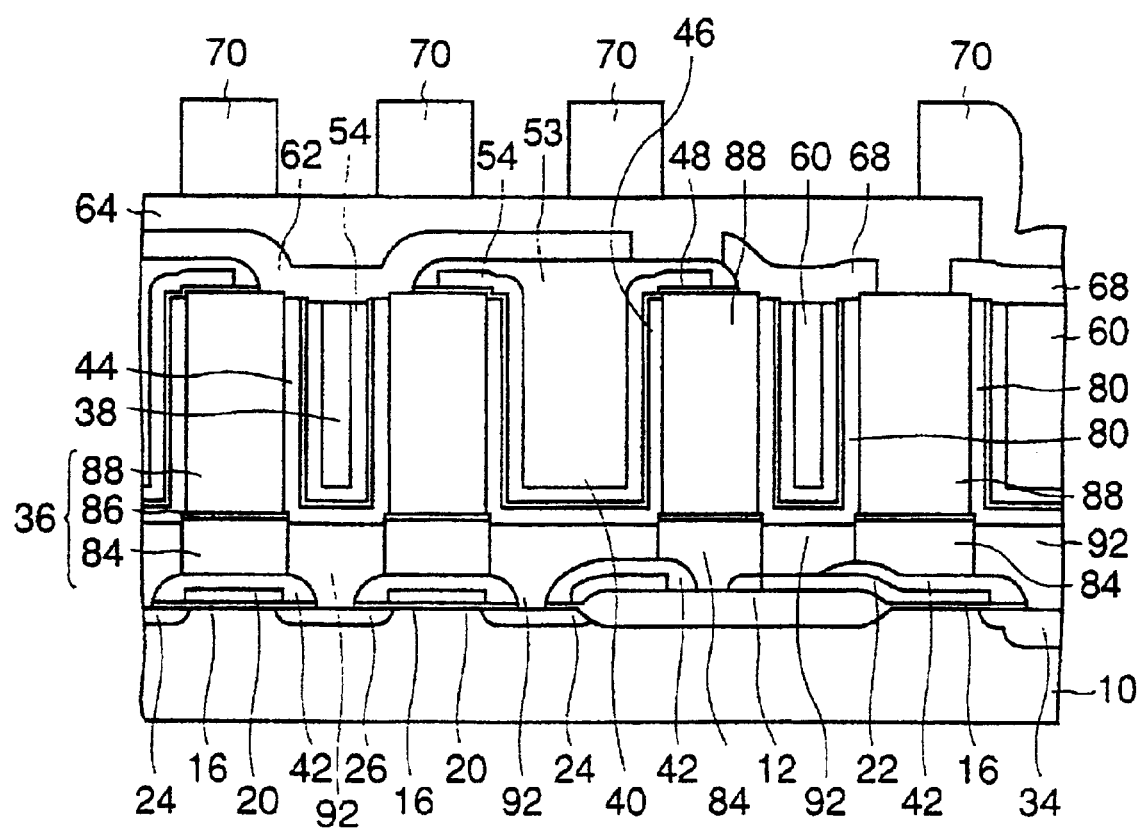
FIG. 22 is a diagrammatic sectional view of the semiconductor storage device according to a fifth embodiment of the present invention explaining a method for fabricating the semiconductor storage device.

FIG. 22 is a diagrammatic sectional view of the semiconductor storage device according to the present embodiment, and FIGS. 23 and 24 are sectional views of the semiconductor storage device according to the present embodiment in the steps of the method for fabricating the same, which explain the method.

In the third embodiment, after the through-holes 38, 40, 60 are opened in the inter-layer insulation film 36, a Ti film and a TiN film are deposited by CVD or collimated sputtering to form the capacitor storage electrodes, 54, etc.

The deposited Ti film is essential to enable ohmic contact because the Ti film is caused to react with the base silicon substrate 10 by the following thermal treatment to form the titanium silicide film. The Ti film must be deposited accurately on the bottoms of the through-holes 38, 40, 60.

In a case that the through-holes are micronized and deeper with higher device integration, it is difficult to thus bury the Ti film.

In the present embodiment the semiconductor storage device and the method for fabricating the same which can solve this problem will be explained.

The semiconductor storage device according to the present embodiment is characterized in that buried conductors 92 are formed on the bottoms of through-holes 38, 40, 60.

That is, an inter-layer insulation film 36 comprising a silicon oxide films 84, a silicon nitride films 86 and a silicon oxide films 88 sequentially laid one on another is formed on a semiconductor substrate 10 with memory cell transistors comprising gate electrodes 20, diffused layers 24, drain diffused layers 26 formed on.

In the inter-layer insulation film 36 there are formed the through-holes 38 opened on the drain diffused layers 26, and through-holes 40 opened on the source diffused layers 24.

The buried conductors 92 of Ti and TiN films are formed on the bottoms of the through-holes 38, 40.

Capacitor storage electrodes 46 of the TiN film are formed on the inside walls of the through-holes 40 and on the buried conductors 92 and are connected to the source diffused layers 24 through the buried conductors 92. Capacitor dielectric films 48 are formed on the inside surfaces and the top surfaces of the capacitor storage electrodes 46. Capacitor opposed electrodes 54 are formed in the through-holes 40 with the capacitor storage electrodes 46 and the capacitor dielectric films formed in, and on the inter-layer insulation film 36. Thus, capacitors comprising the capacitor storage electrodes 46, the capacitor dielectric films 48 and the capacitor opposed electrodes 54 are constituted.

Contact conductor films 44 of the TiN film are formed on the inside walls of the through-holes 38 and the buried conductors 92 and are connected to the drain diffused layers 26 and bit lines 62 through the buried conductors 92.

Above the bit lines 62 there are formed wiring layers 70 through an inter-layer insulation film 64, and a DRAM comprising 1-transistor and 1-capacitor memory cells is constituted.

Then, the method for fabricating the semiconductor storage device according to the present embodiment will be explained.

First an about 300 nm-thick device isolation film 12 is formed on the major surface of a p-silicon substrate by, e.g., the usual LOCOS to define a device region 14. Then, an about 10 nm-thick gate oxide film 16 is formed in the device region 14 by thermal oxidation.

Subsequently, an about 150 nm-thick polycrystalline silicon film containing a high concentration of P and an about 200 nm-thick silicon nitride film are successively formed by CVD, and then the silicon nitride film in the peripheral circuit region is partially removed by the usual lithography and etching. This region is to be a gate contact 82 through which wiring of the gate electrodes 22 are to be led out.

Then, the silicon nitride film and the polycrystalline silicon film are patterned together by the usual lithography and etching to form the gate electrodes of the memory cell transistors and the gate electrodes 22 of the peripheral circuits.

Figure 23A:
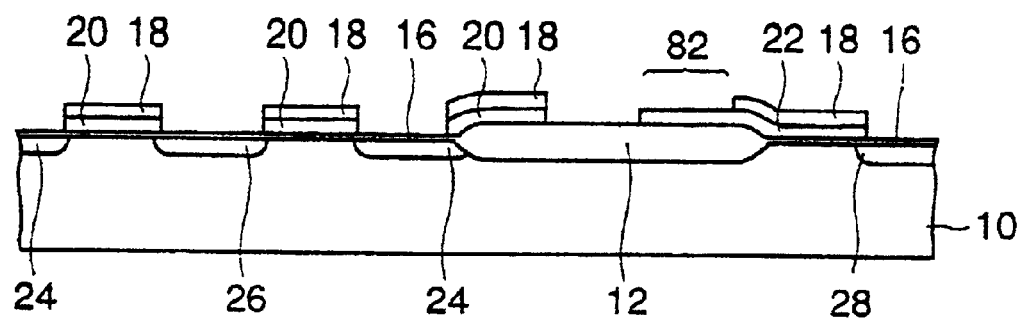
FIGS. 23A–23C are sectional views of the semiconductor storage device according to the fifth embodiment in steps of a method for fabricating the semiconductor storage device (Part 1).

Then, with the silicon nitride films 18 and the gate electrodes 20, 22 as a mask, the source diffused layers 24 and the drain diffused layers 26 of the memory cell transistors, and low concentration diffused layers 28 of transistors for peripheral circuits are formed (FIG. 23A).

Next, an about 100 nm-thick silicon nitride film is formed by CVD and is subjected to anisotropic etching using $CHF_3/H_2$ gas, and sidewall nitride films 30 of the silicon nitride film ar formed by self-alignment on the sidewalls of the patterned silicon nitride films 18 and gate electrodes 20, 22.

Figure 23B:
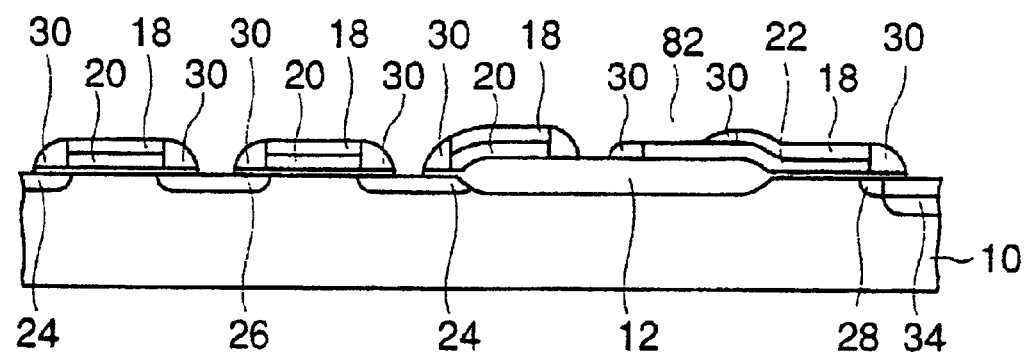

Subsequently, in the n-transistor region for peripheral circuits, source diffused layers and drain diffused layers 34 of the peripheral circuit n-transistors are formed by, using the usual lithography, implanting, for example, As ions under the conditions of a 40 keV acceleration energy and a $4 \times 10^{15}$ ions $cm^{-2}$ dose (FIG. 23B).

Then, an about 1 μm thick silicon oxide film 84 is deposited by CVD, and the surface thereof is polished by about 0.7 μm by CMP for planarization. Then, a silicon nitride film 86 is grown in a 100 nm-thickness by CVD.

Next, a photo-resist (not shown) is patterned by the usual lithography, and next the silicon nitride film 86 is etched with $CHF_3/CF_4/Ar$ as an etching gas. Then, the silicon oxide film 84 is etched with $C_2F_6$ as an etching gas. Thus, the source diffused layers 24 and the drain diffused layers 26, 34 are exposed.

Figure 23C:
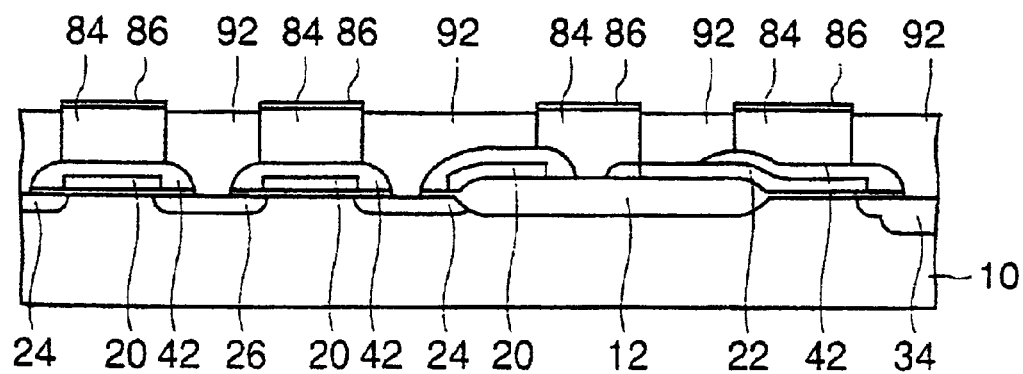

Then, a Ti film and a TiN film are successively grown respectively by collimated sputtering in a 10 nm-thickness and CVD in a 200 nm-thickness to be buried on the source diffused layers 24 and the drain diffused layers 26, 34. Then, the Ti film and the TiN film on the silicon nitride films 86 are removed by CMP to form the buried conductors 92 (FIG. 23C).

Next, an about 2 μm-thick silicon oxide film 88 is grown by CVD, and a photo-resist is patterned by the usual lithography. Then, the silicon oxide film 88 is etched with an etching gas, such as $C_2F_6$ or others. By using $C_2F_6$ gas as an etching gas at this time, the etching can be automatically stopped by the buried conductors 92 or the silicon nitride films 86.

Figure 24A:
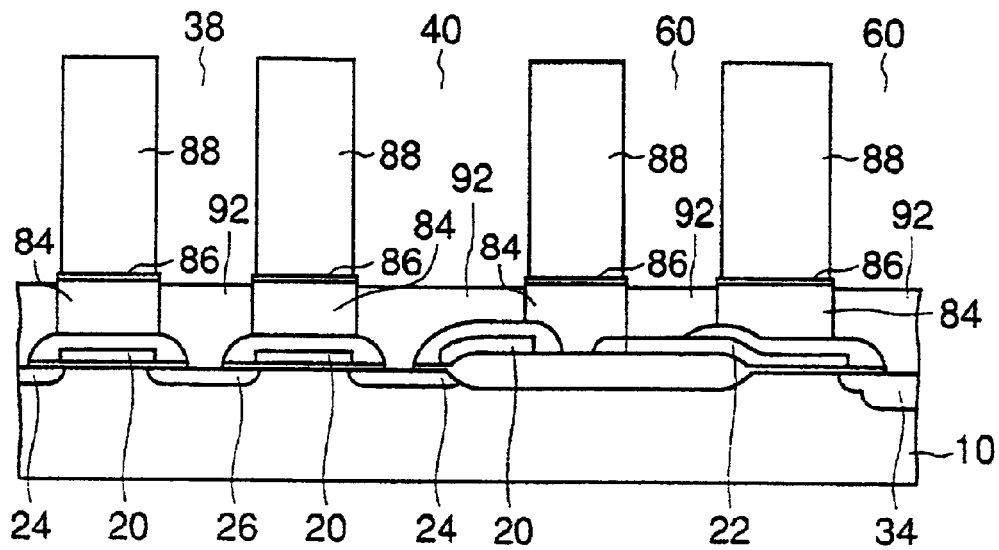
FIGS. 24A and 24B are sectional views of the semiconductor storage device according to the fifth embodiment in steps of a method for fabricating the semiconductor storage device (Part 2).

Subsequently, the photo-resist is removed, and in the inter-layer insulation film 36 are formed the through-holes 38 opened on the buried conductors 92 on the drain diffused layer 26 of the memory cell transistors, the through-holes 40 opened on the buried conductors 92 on the source diffused layers 24 of the memory cell transistors, and the through-holes 60 in the peripheral circuit region with the buried conductors 92 formed on the bottoms (FIG. 24A).

Figure 24B:
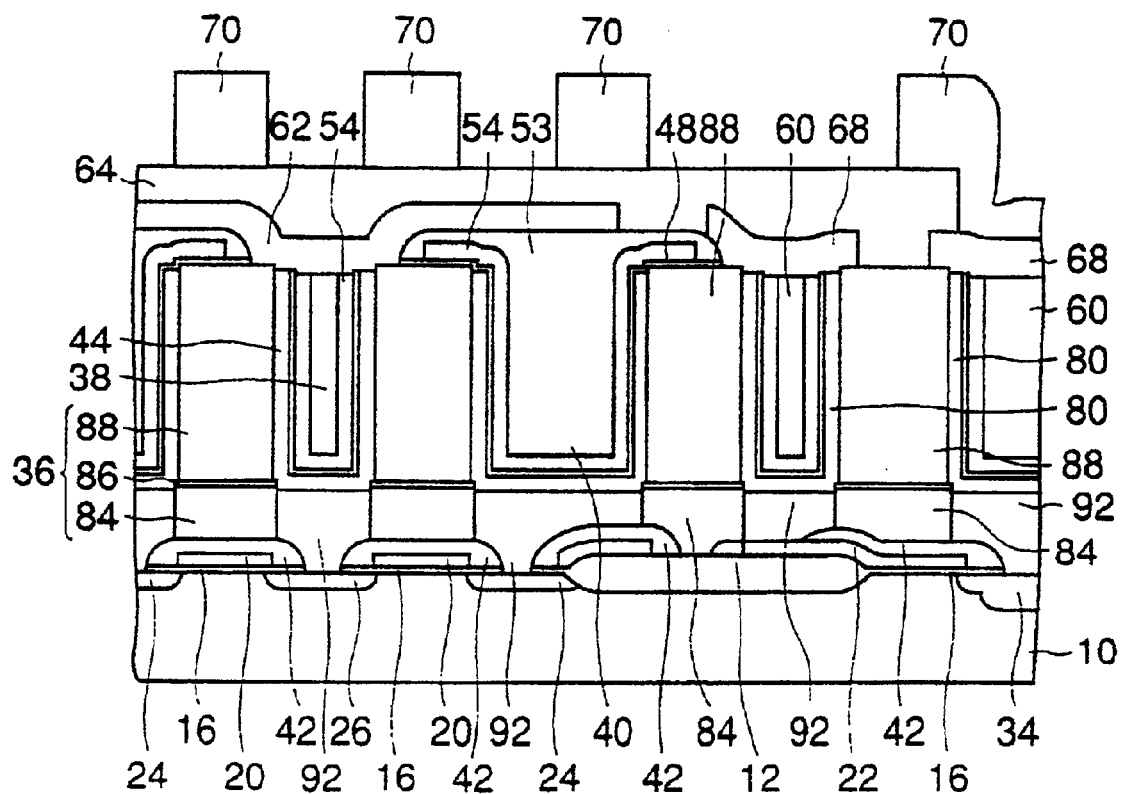

Then, capacitors, bit lines, wiring layers, etc. are formed in the same steps of FIGS. 17A and its followers, and a DRAM comprising 1-transistor and 1-capacitor memory cells is constituted (FIG. 24B).

As described above, according to the present embodiment, in forming the through-holes, etc. of high aspect ratios, ohmic contacts are formed by forming in advance the buried conductors in regions where the buried conductors contact the silicon substrate, whereby even in a case that the through-holes are micronized and deeper for higher device integration, contact characteristics can be ensured on the bottoms of the through-holes.

In the present embodiment, one lithography step is added to form the buried conductors 92, but the use of SALICIDE (SALICIDE: Self-ALIgned siliCIDE; disclosed by, e.g., J. R. Pfiester, Technical Digest IEDM 1990, p. 241 (1990)) permits the conductors for contact to be formed on the bottoms of the through-holes without adding one lithography step.

That is, after the insulation films 42 covering the gate electrodes 20, 22 are formed, a Ti film for example, is deposited by sputtering on the entire surface of a semiconductor substrate 10 and then is subjected to a heat treatment. Then, silicidation takes place only on regions where the semiconductor substrate 10 and the deposited Ti film directly contact each other, e.g., on the source diffused layers 24 and the drain diffused layers 26, 34.

Then, that portion of the Ti film unreacted is removed by, e.g., aqua regia, and a titanium silicide film can be formed by self-alignment on the source diffused layers 24 and the drain diffused layers 26, 34.

After the titanium silicide films are thus formed on the source/drain diffused regions, the semiconductor storage device is fabricated by the method described in any one of the first to the fourth embodiments, whereby even in a case where the through-holes, etc. have high aspect ratios, contact characteristics can be secured on the bottoms of the through-holes.

Other metal films which are applicable to silicide process are, e.g., Ta (tantalum), W (tungsten), Mo (molybdenum), etc.

Sixth Embodiment

The semiconductor storage device according to a sixth embodiment of the present invention and a method for fabricating the same will be explained with reference to FIGS. 25 to 28B. Common members of the present embodiment with the semiconductor storage device and the method for fabricating the same according to the first embodiment shown in FIGS. 1 to 6 are represented by common reference numerals to simplify and not repeat their explanation.

Figure 25:
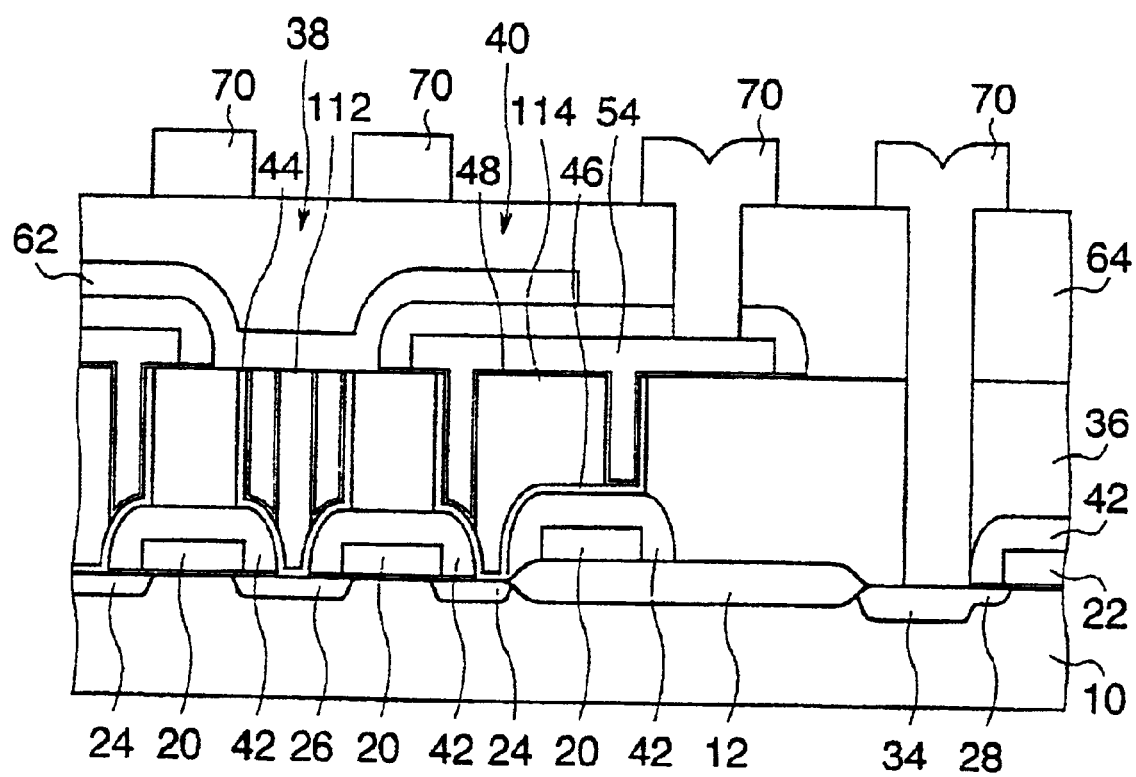
FIG. 25 is a diagrammatic sectional view of the semiconductor storage device according to a sixth embodiment of the present invention explaining a method for fabricating the semiconductor storage device.

FIG. 25 is a diagrammatic sectional view of the semiconductor storage device according to the present embodiment, and FIGS. 26A–26B, 27A–27B, and 28A–28B are sectional views of the semiconductor storage device according to the present embodiment in the steps of the method for fabricating the same, which explain the method.

In the method for fabricating the semiconductor storage device according to the first embodiment, as shown in FIG. 4A, in forming the contact conducting films 44 and the capacitor storage electrodes 46, a polycrystalline silicon film containing a high concentration of P is formed, and then the polycrystalline silicon film on the inter-layer insulation film 36 is removed by CMP.

In the simple polishing, however, pulverized objects generated upon polishing intrude into the through-holes 38, 40 with a risk of lowered yields.

In the semiconductor storage device according to the first embodiment, because the contact conducting films 44 and the capacitor storage electrodes 46 are formed of one and the same film, when the contact conducting films 44 are made thicker, an inside surface of the through-holes 40 of the capacitor storage electrodes 46 adversely have a smaller surface area. Consequently, to lower resistance the value of the contact conducting films 44, a capacitance is sacrificed.

The resistance of the contact conducting films 44 is insignificant for about 256M DRAMs, because a depth of the through-holes 40 can be set to be below 2 $\mu$m, but resistance increases of the contact conducting films 44 accompanying deeper through-holes 40 and thicker contact conducting films 44 for high integrations is a serious problem.

In the semiconductor storage device according to the present embodiment and the method for fabricating the same, in polishing step for forming the contact conducting films 44 and the capacitor storage electrodes 46, pulverized objects are prevented from residing in the through-holes 38, 40, and the contact conducting films 44 without sacrificing capacitances.

The semiconductor storage device according to the present embodiment is characterized in that columnar conductors 112, 114 are formed respectively in the through-holes 38, 40.

That is, the columnar conductor 112 connected to the contact conducting film 44 at the bottom and having capacitor dielectric films 48 formed on the sidewalls are formed in the through-holes 38, and the columnar conductors 114 connected to the capacitor storage electrodes 46 at the bottoms and having the capacitor dielectric films 48 formed on the sidewalls are formed in the through-holes 40.

By thus providing the columnar conductors, electric passage interconnecting drain diffused layers 26 and a bit lien 62 are constituted in the through-holes 38 by the contact conducting films 44 and the columnar conductors 112. An electric resistance at the bit line contacts can be drastically decreased.

By forming the columnar conductors 114 in the through-holes 40, the capacitor dielectric films 48 are formed on the sidewalls thereof. The capacitor area is larger, and a larger capacitance can be obtained.

Then, the semiconductor storage device according to the present embodiment will be explained.

Figure 26A:
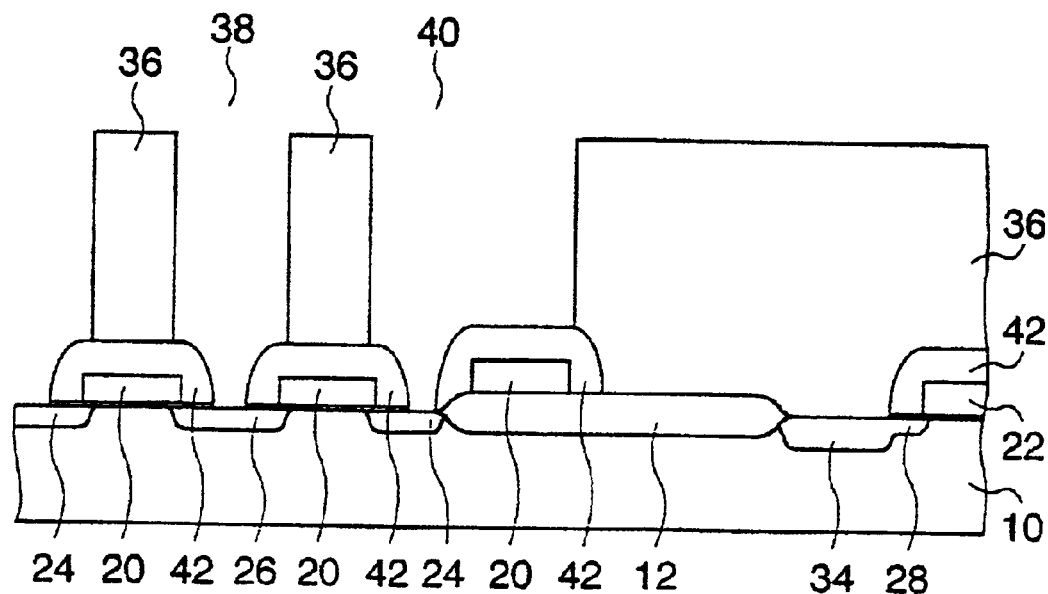
FIGS. 26A and 26B are sectional views of the semiconductor storage device according to the sixth embodiment in steps of a method for fabricating the semiconductor storage device (Part 1).

First, by the same method for fabricating the semiconductor storage device according to the first embodiment shown in FIGS. 3A to 3D, an inter-layer insulation film 36 with the through-holes 38 formed in on the drain diffused layers 26 and the through-holes 40 formed in on the source diffused layers 24 is formed (FIG. 26A). A size of the through-holes 38 is, e.g., 0.3×0.3 $\mu$m, and that of the through-holes 40 is, e.g., 0.3×0.6 $\mu$m.

Next, a polycrystalline silicon film 106 containing a high concentration of P is formed in an about 30 nm-thickness by CVD.

Figure 26B:
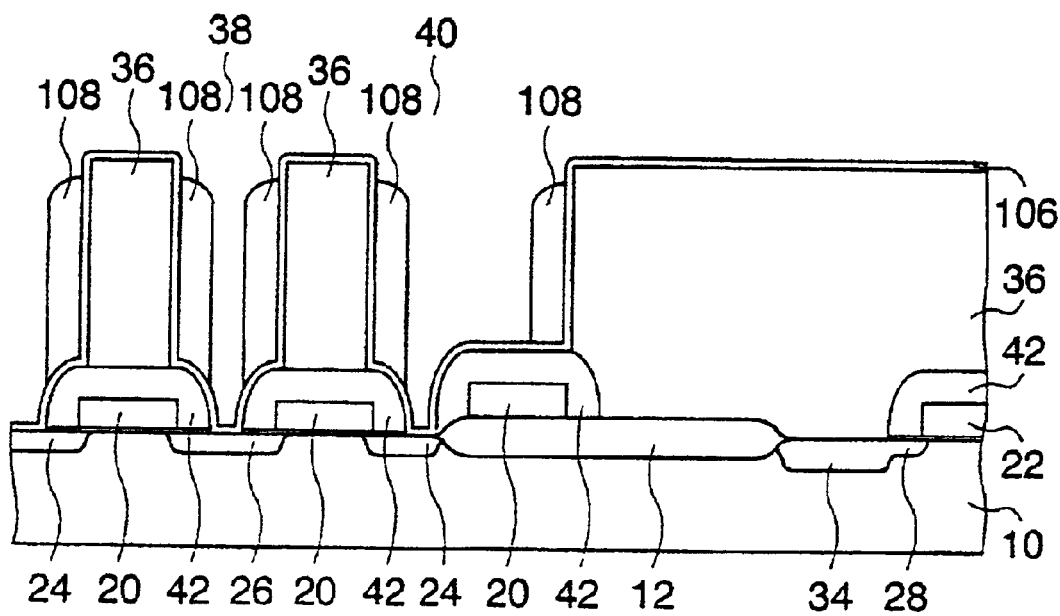

Subsequently, a silicon oxide film is grown in an about 80 nm-thickness by CVD using, e.g., TEOS (tetraethoxysilane) as a main material, and then the entire surface of the silicon oxide film is etched vertically by RIE to form the sidewalls 108 (FIG. 26B).

As a result, [300−2×(30+80)]×[300−2×(30+80] nm, i.e., 80×80 gaps are left in the through-holes 38, and [300−2× (30+80)×[600−2×(30+80)] nm, i.e., 80×380 nm gaps are left.

Figure 27A:
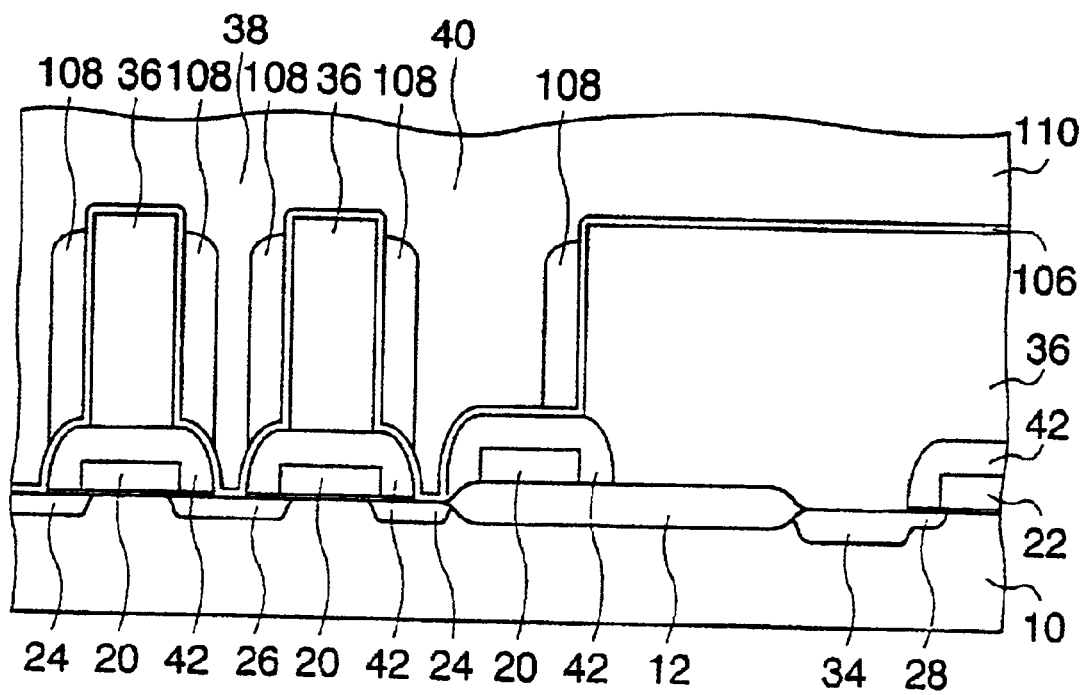
FIGS. 27A and 27B are sectional views of the semiconductor storage device according to the sixth embodiment in steps of a method for fabricating the semiconductor storage device (Part 2).

Then, an about 200 nm-thick polycrystalline silicon film 110 is deposited by CVD (FIG. 27A). It is preferred to set a thickness of a polycrystalline silicon film 110 to be deposited so that the gaps in the through-hoes 38, 40 are completely buried, and the entire surface is generally substantially flat.

Then, the entire surface is polished by CMP. In this polishing somewhat over-polishing is conducted so that the top surfaces of the sidewalls 108 are completely exposed.

Figure 27B:
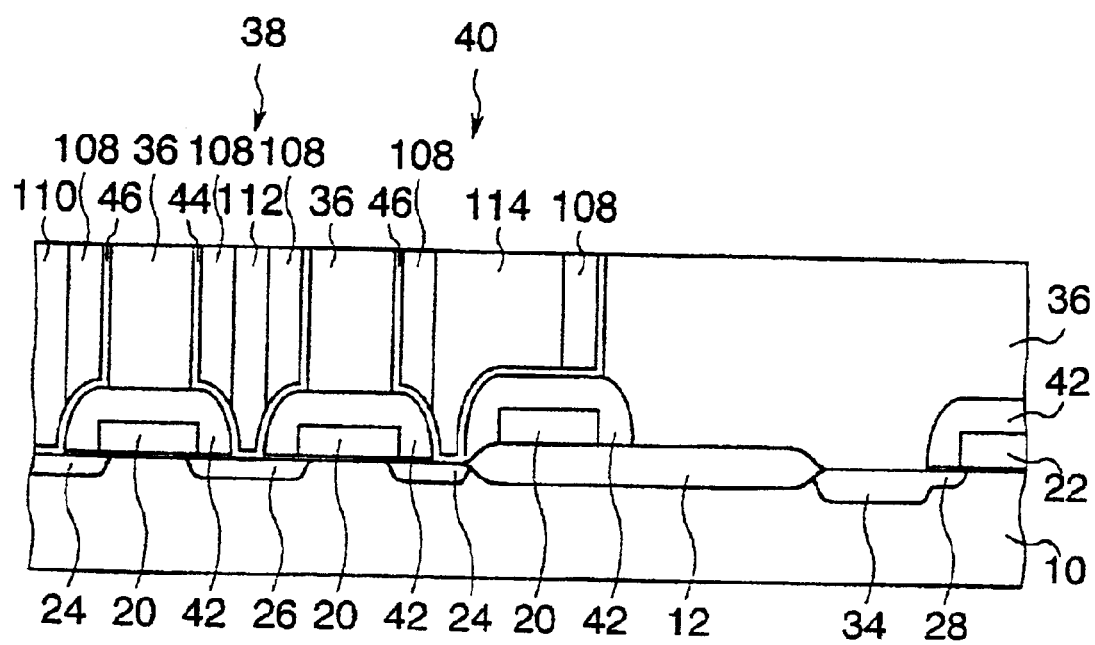

Thus, the surface is planarized with the contact conducting films 44 of the polycrystalline silicon film 106, the columnar conductors 112 of the polycrystalline silicon film 110 and the sidewalls 108 completely buried in the through-holes 38 and with the capacitor storage electrodes 46 of the polycrystalline silicon film 106, the columnar conductors 114 of the polycrystalline silicon film 110 and the sidewalls 108 completely buried in the through-holes 40 (FIG. 27B).

Figure 28A:
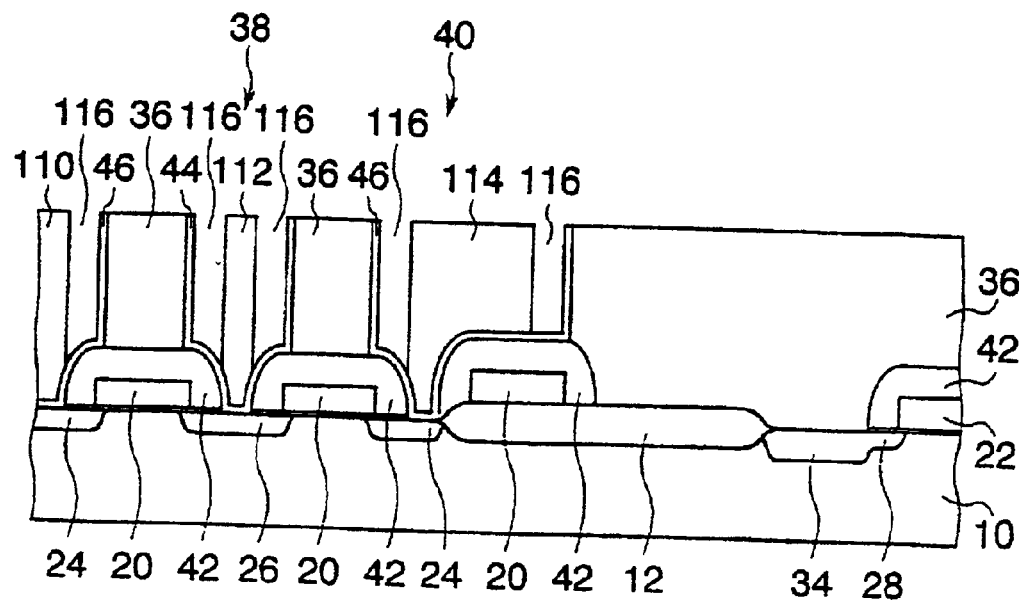
FIGS. 28A and 28B are sectional views of the semiconductor storage device according to the sixth embodiment in steps of a method for fabricating the semiconductor storage device (Part 3).

Subsequently, the substrate is immersed in a solution of, e.g., $HF:NH_4F=1:5$, whereby the sidewalls 108 are selectively removed. Thus, voids 116 are formed in the through-holes 38, 40 (FIG. 28A).

Figure 28B:
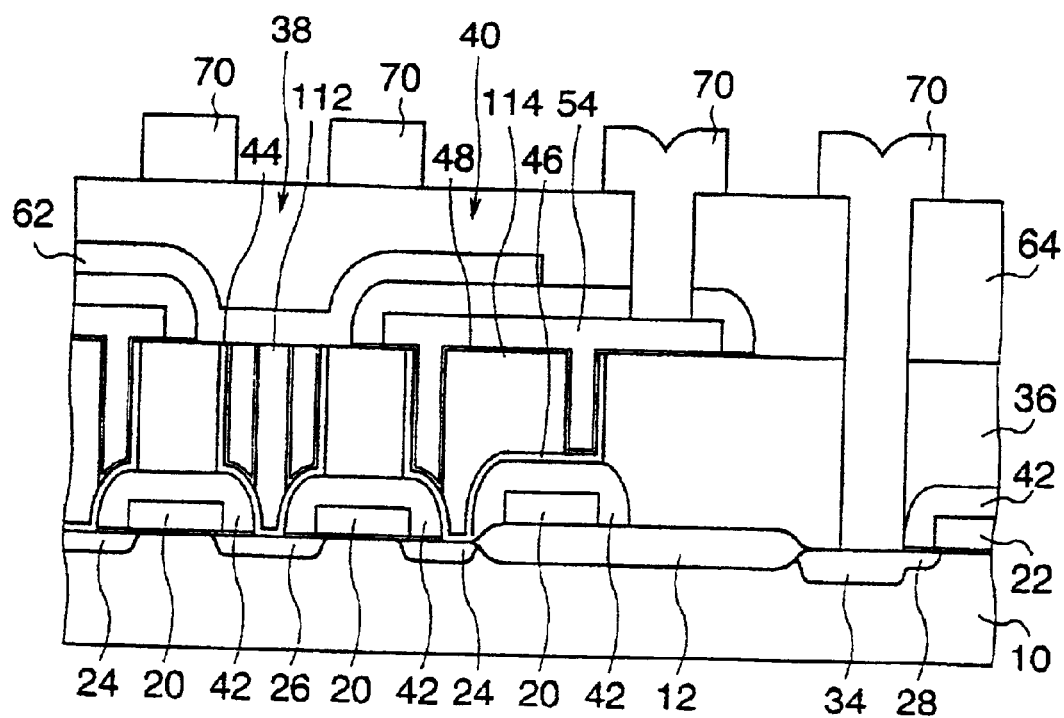

Then, the capacitor dielectric films 48, the capacitor opposed electrodes 54 and bit lines 62, wiring layers 70, etc. are formed by the same steps of the method for fabricating the semiconductor storage device according to, e.g., the first embodiment shown in FIG. 4B to FIG. 6B (FIG. 28B).

As described above, according to the present embodiment, the columnar conductors 114 are formed in the through-holes 40, whereby the columnar conductors 114 function as capacitor storage electrodes in addition to the capacitor storage electrodes 46, whereby a surface area of the capacitors can be increased by a surface area of the columnar conductors 114. Accordingly, even in a case that the same capacity as the semiconductor storage device of FIG. 1 is necessary, the through-holes 40 can be made shallow.

Lead out electrodes at the bit line contacts are constituted by the contact conducting films 44 and the columnar conductors 112, whereby the resistance of the lead out electrodes can be lowered. As described above, a capacitance can be increased, which makes it possible to shallow the through-holes 38. This makes it possible to make the resistance of the lead out electrodes low.

In the semiconductor storage device according to the present embodiment, a peripheral circuit contact holes 60 have the same structure as in the semiconductor storage device according to the variation of the first embodiment but may have a different structure. For example, as in the semiconductor storage device of FIG. 2 according to the first embodiment, via holes 66 are opened on the wiring layers 68 to form the wiring layers 70.

Seventh Embodiment

The semiconductor storage device according to a seventh embodiment of the present invention and a method for fabricating the same will be explained with reference to FIGS. 29 to 31B. Common members of the present embodiment with the semiconductor storage device and the method for fabricating the same according to the first embodiment shown in FIGS. 1 to 7 are represented by common reference numerals to simplify and not repeat their explanation.

Figure 29:
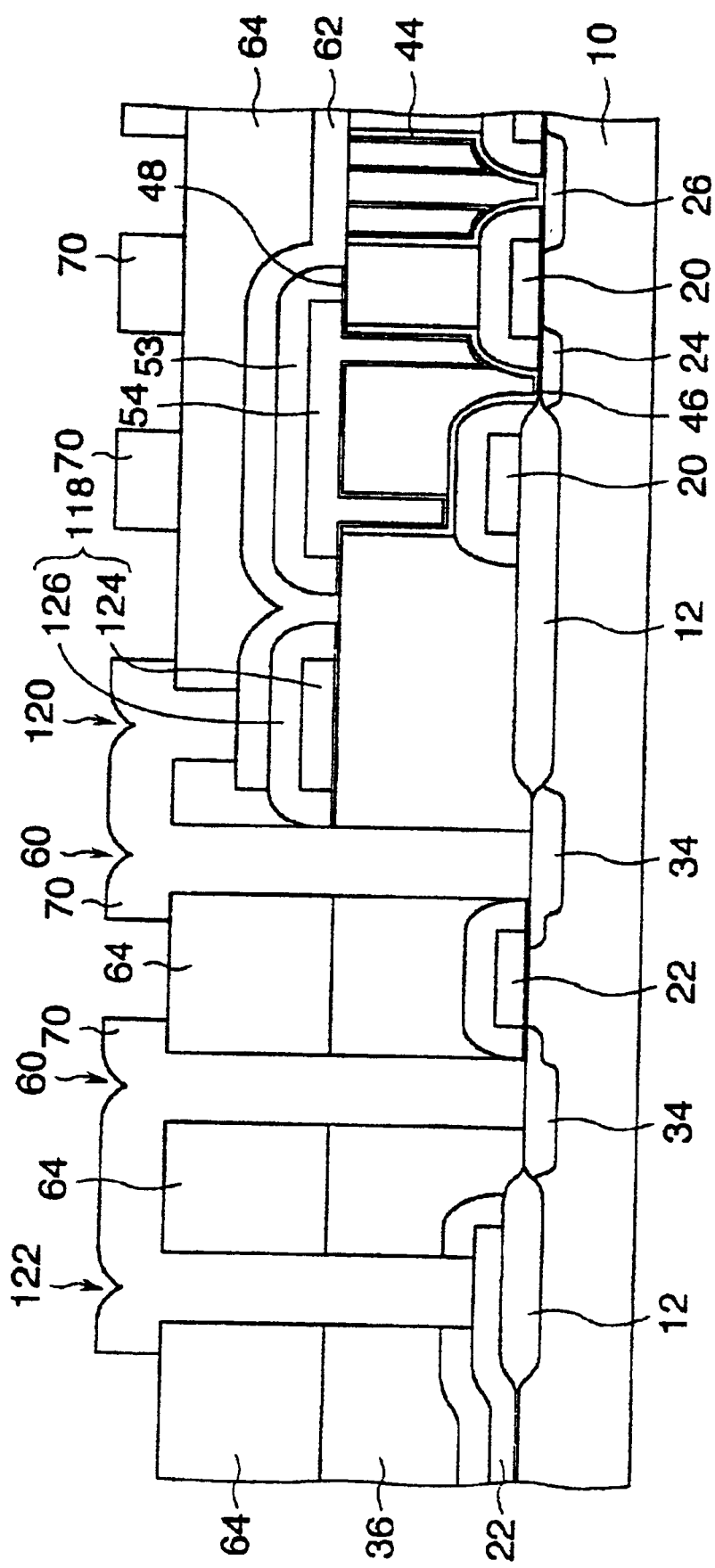
FIG. 29 is a diagrammatic sectional view of the semiconductor storage device according to a seventh embodiment of the present invention explaining a method for fabricating the semiconductor storage device.

FIG. 29 is a diagrammatic sectional view of the semiconductor storage device according to the present embodiment, and FIGS. 30A–30B, and 31A–31B are sectional views of the semiconductor storage device according to the present embodiment in the steps of the method for fabricating the same, which explain the method.

In the semiconductor storage device according to one variation of the first embodiment, which is shown in FIG. 7, the through-holes 60 of peripheral circuits are opened after the inter-layer insulation film 64 have been formed to contact the wiring layers 70 directly to the capacitor opposed electrodes 54, and the source/drain diffused layers 34 of the peripheral circuit transistors, whereby lithography steps are decreased.

The wiring layers 70 must contact concurrently to the source/drain diffused layers 34 of peripheral circuit transistors, the capacitor opposed electrodes 54, the bit lines 62, etc., and, to this end, the through-holes 60, the contact holes 59, etc. have various depths from very deep to shallow.

In etching holes of such various depths, it takes a long period of time for the source/drain diffused layers 34 of the peripheral circuit transistors to be exposed after the surfaces of the bit lines 62 and the capacitor opposed electrodes 54 are exposed, and the surfaces of the bit lines 62 and the capacitor opposed electrodes are continuously exposed to an etching gas for the long period of time. Especially in a case that the bit lines 62 are formed of a columnar crystal metal thin film, such as tungsten or others, sometimes the ground insulation film is etched through gaps between crystals, causing damages. As a result, the bit lines 62 and the silicon substrate 10 may be short-circuited.

In the semiconductor storage device according to the present embodiment and the method for fabricating the same, the through-holes of various depths can be simultaneously formed.

The semiconductor storage device according to the present embodiment is characterized in that an inter-layer insulation film 53 having etching characteristics different from those of inter-layer insulation film 64, 36 is formed on capacitor opposed electrodes 54, and etching stoppers 118 which are laminated films of conducting films 124, and insulation films 126 having etching characteristics different from those of the inter-layer insulation film 64, 36 are disposed below parts of bit lines 62 in regions for contact holes 120 connecting the bit lines 62 and wiring layers 70 above the bit lines 62.

That is, the wiring layers 70 formed on the inter-layer insulation film 64 are connected to gate electrodes 22 of peripheral circuit transistors through through-holes 122, connected to source/drain diffused layers 34 of the peripheral circuit transistors through through-holes 60, connected to the capacitor opposed electrodes 54 through contact holes 59, and connected to the bit lines 62 through contact-hole 120. Inter-layer insulation film 53 of silicon nitride film is formed on the capacitor opposed electrodes 54. Below the laminated films 118 of the conducting films 124 and silicon nitride films 126 are provided below the contact holes 120 opened on the bit lines 62.

Then, the method for fabricating the semiconductor storage device according to the present embodiment will be explained with reference to FIGS. 30A to 31B.

Figure 30A:
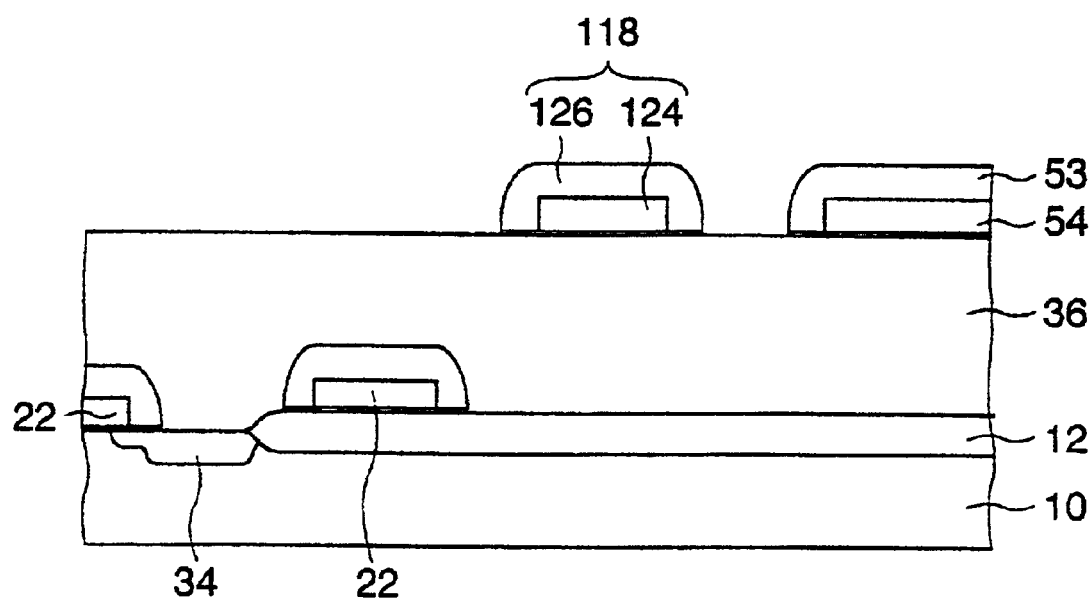
FIGS. 30A and 30B are sectional views of the semiconductor storage device according to the seventh embodiment in steps of a method for fabricating the semiconductor storage device (Part 1).

The capacitor opposed electrodes 54 are formed by the same steps of the method for fabricating the semiconductor storage device according to the first embodiment shown in FIGS. 3A to 5A. At this time, the laminated films 118 of the conducting layers formed of the same film as the capacitor opposed electrodes 54, and the insulation films 126 formed of the inter-layer insulation film 53 have been provided in regions for contacts to be formed between the bit lines 62 and the wiring layers 70 above the bit lines 62 (FIG. 30A). The inter-layer insulation film 53 is formed of a material, e.g., silicon nitride film, having etching characteristics different from those of the inter-layer insulation film 36 and the inter-layer insulation film 64 to be deposited on the inter-layer insulation film 36.

Then, the inter-layer insulation film 64 is deposited on the entire surface to planarize the surface. Then, a photo-resist 72 with a pattern of the through-holes and the contact holes formed on is formed by the usual lithography.

Subsequently, with the photo-resist 72 as a mask, the inter-layer insulation film 64 and the inter-layer insulation film 36 are etched. The inter-layer insulation film 64, 36 are etched under conditions which allow a sufficient selection ratio with respect to the inter-layer insulation film 53.

Figure 30B:
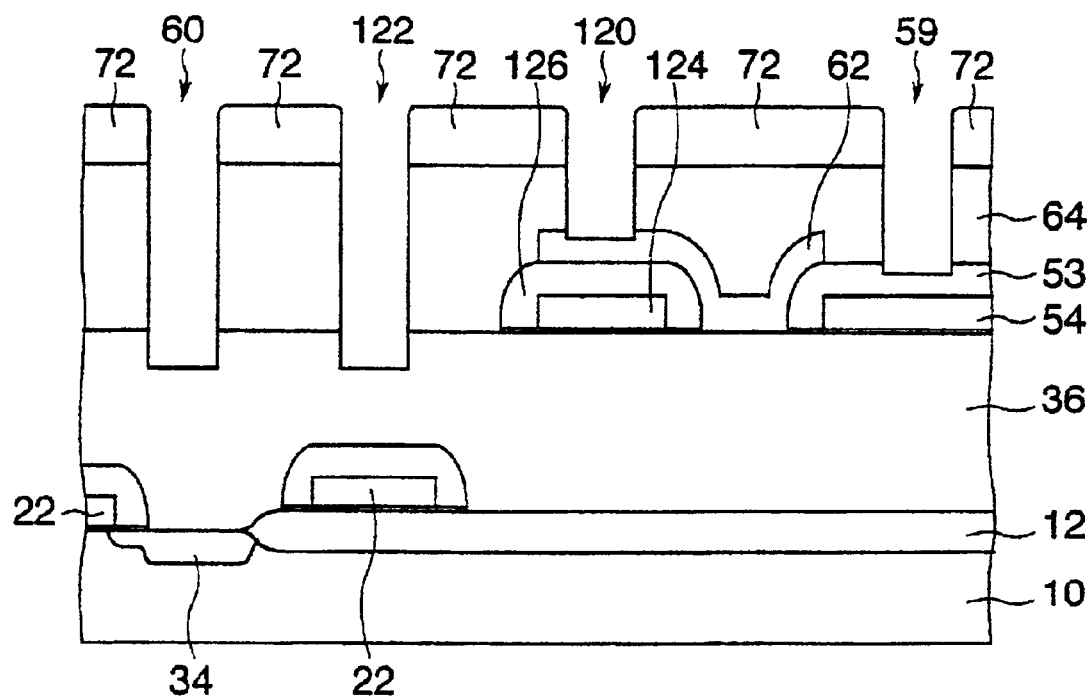

In this etching, because the through-holes 59 formed on the capacitor opposed electrodes 54 and the contact holes 120 formed on the bit lines 62 are shallower than the through-holes 60 opened on the source/drain diffused layers 34 of the peripheral circuit transistors and the through-holes 122 opened on the gate electrodes 22 of the peripheral circuit transistors, that portion of the inter-layer insulation film 64 on the bit lines 62 is completely removed to expose the surface of the bit lines 62 to an etching gas before the through-holes 60, 122 are completely opened. The inter-layer insulation film 53 is exposed on the capacitor opposed electrodes 54 but is not substantially etched because the inter-layer insulation film 53 is formed of silicon nitride film whose etching characteristics are different from those of the inter-layer insulation film 64 of silicon oxide film (FIG. 30B).

Figure 31A:
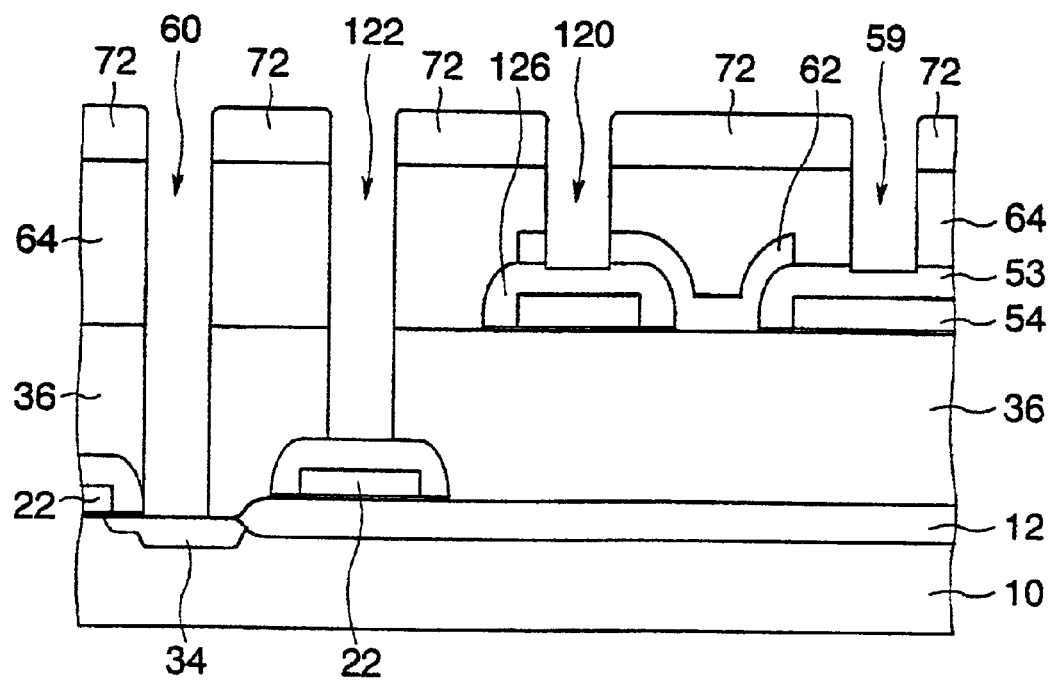
FIGS. 31A and 31B are sectional views of the semiconductor storage device according to the seventh embodiment in steps of a method for fabricating the semiconductor storage device (Part 2).

The etching is further set on to expose the source/drain diffused layer 34 of the peripheral circuit transistors (FIG. 31A). At this time, in the case that the bit lines 62 are formed of a columnar crystal material, e.g., tungsten, the etching sometimes reaches even the lower layer film at the crystal boundaries. This is emphatically shown in FIG. 31A by extinguishing the bit lines 62 themselves. Because of the insulation films 126 of silicon nitride film formed below the bit lines 62, the inter-layer insulation film 36 is not damaged.

Figure 31B:
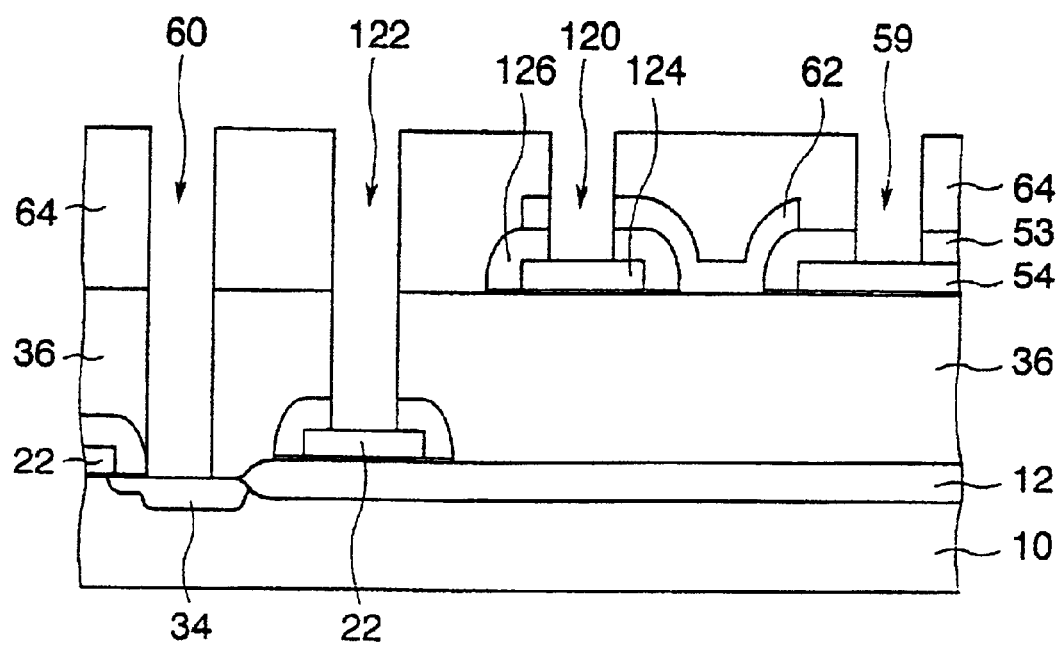

Then, the silicon nitride film is removed by etching using, e.g., $CF_4/CHF_3$/He gas, whereby the inter-layer insulation film 53 on the capacitor opposed electrodes 54 and the insulation films 42 on the gate electrodes of the peripheral circuit transistors are removed, and the through-holes 60, 122 and the contact holes 59, 120 are completely opened (FIG. 31B). At this time, the insulation films 126 below the bit lines 62 are also removed, but the etching is stopped by the conducting films 124 below the insulation films 126.

An etching gas used in this etching can have a short etching time because the etching speed of silicon is low, and the residual silicon nitride films are not thick. Accordingly, etching of the already exposed source/drain diffused layers 34 of the peripheral circuit transistors is ignorable.

Thus, all the through-holes and the contact holes can be formed without any inconvenience.

As described above, according to the present embodiment, the laminated film 118 is formed in advance in the regions for the contacts between the bit lines 62 and the wiring layers 70 above the bit lines 62, whereby the inter-layers insulation film 36 below the bit lines 62 is not etched in forming the through-holes 60, 120 of the peripheral circuit region, and short-circuit between the bit lines 62 and the semiconductor substrate 10, etc. can be prevented.

Eighth Embodiment

The semiconductor storage device according to an eighth embodiment of the present invention will be explained with reference to FIGS. 32A to 38. Common members of the semiconductor storage device according to the present embodiment and the method for fabricating the same with the semiconductor storage device according to the first embodiment and the method for fabricating the same are represented by common reference numerals to simplify and not to repeat their explanation.

Figure 33:
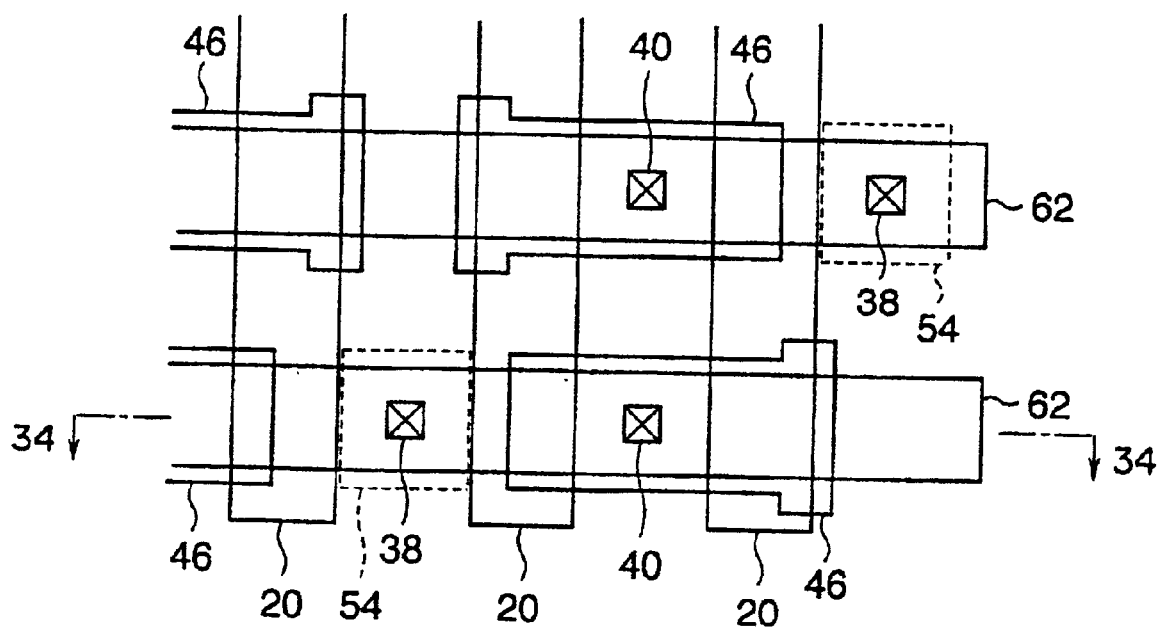
FIG. 33 is a plan view of the semiconductor storage device according to an eighth embodiment of the present invention explaining a structure thereof.
Figure 34:
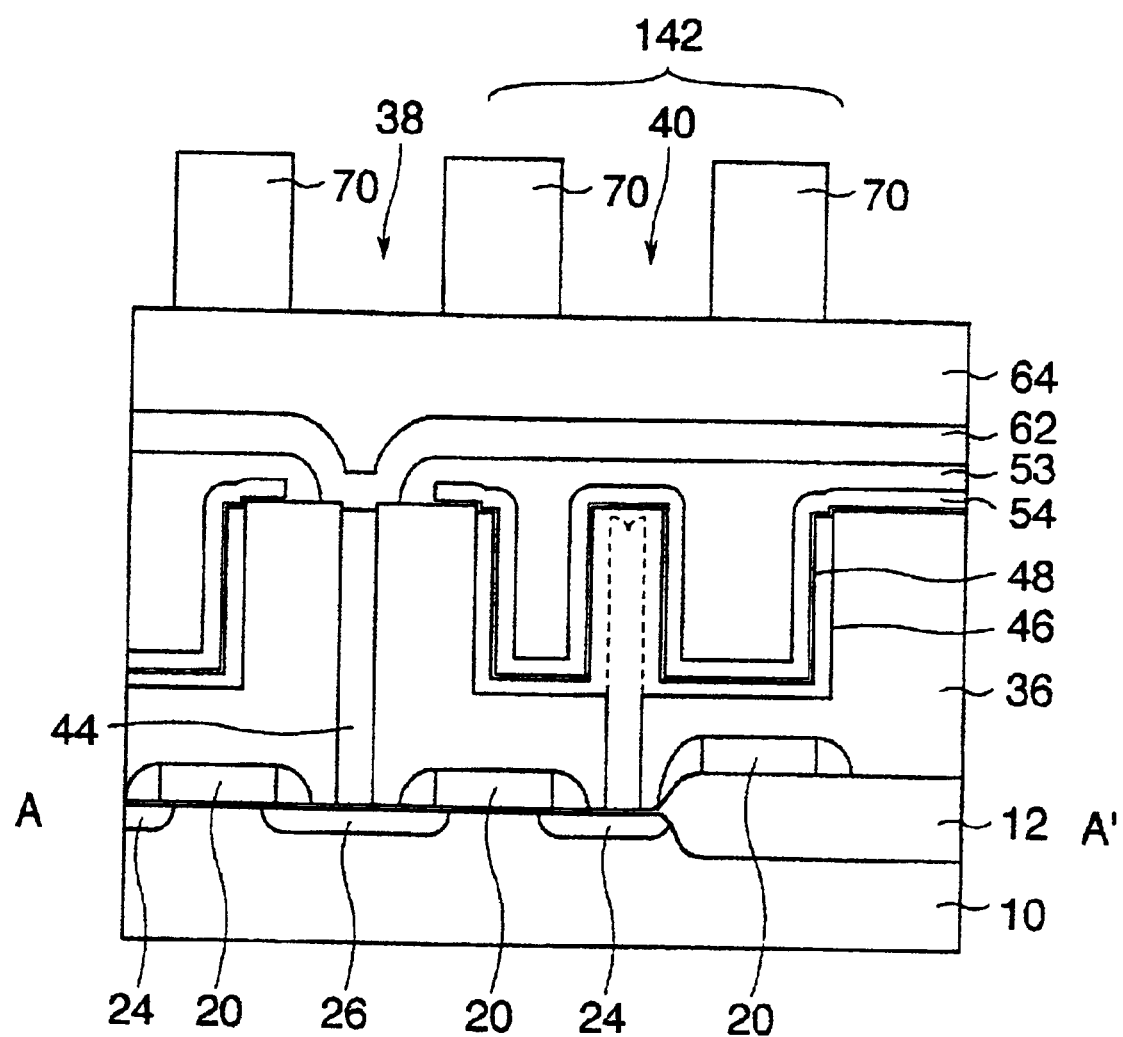
FIG. 34 is a diagrammatic sectional view of the semiconductor storage device according to the eighth embodiment explaining the structure thereof.

FIGS. 32A–32D are views for explaining the problems of the method for fabricating the semiconductor storage device according to the first embodiment. FIG. 33 is a plan view of the semiconductor storage device according to the present embodiment, which explain the structure thereof. FIG. 34 is a diagrammatic sectional view of the semiconductor storage device according to the present embodiment, which explains the structure thereof. FIGS. 35A–35B, 36A–36B, 37A–37B, and 38 are sectional views of the semiconductor storage device according to the present embodiment in the steps of the method for fabricating the same, which explain the method for fabricating the same.

In the method for fabricating the semiconductor storage device according to the first embodiment, which is shown in FIGS. 3A to 6, the contact conducting films 44 and the capacitor storage electrodes 46 are formed by self-alignment with the gate electrodes 20 of the memory cell transistors. According to this method, it is not necessary to consider a positioning allowance between the gate electrodes 20 and the through-holes 38. This results in a merit that the memory cells can have smaller areas.

Micronization of the memory cells, however, abruptly increases depths of the through-holes 38, which abruptly makes the etching of the through-hoes difficult. Problems of the semiconductor storage device according to the first embodiment will be explained.

Figure 32A:
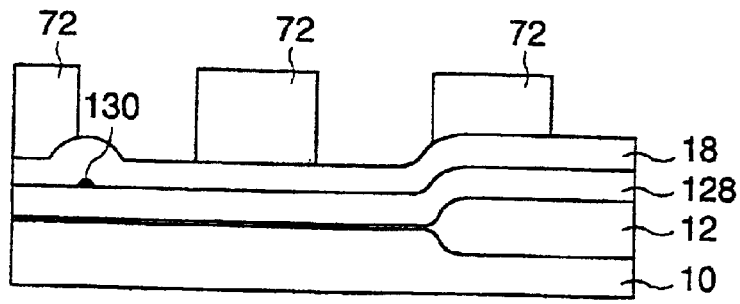
FIGS. 32A–32D are views explaining problems of the method for fabricating a semiconductor storage device according to the first embodiment.

In the steps of the method for fabricating the semiconductor storage device, which are shown in FIGS. 3A and B, if dust 130 stays on the polycrystalline silicon film 128 when the silicon nitride film 18 is deposited on the polycrystalline silicon film 128 to be the gate electrodes 20, the silicon nitride film 18 grown on the polycrystalline silicon film 128 in a region with the dust 130 staying on bulges (FIG. 32A).

Figure 32B:
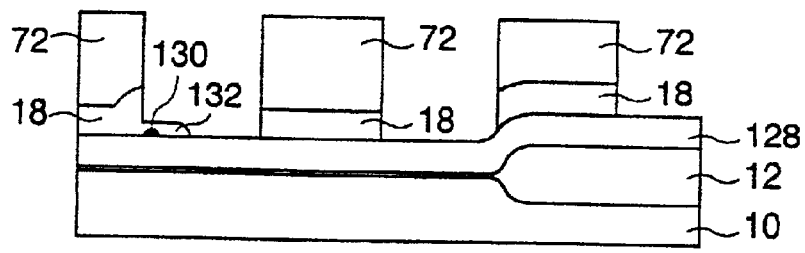

When the silicon nitride film 18 is etched with the photo-resist 72 patterned in the gate electrodes 20, the polycrystalline silicon film bulges around the dust 130, and a part of the polycrystalline silicon film remains as residue 132 (FIG. 32B).

Figure 32C:
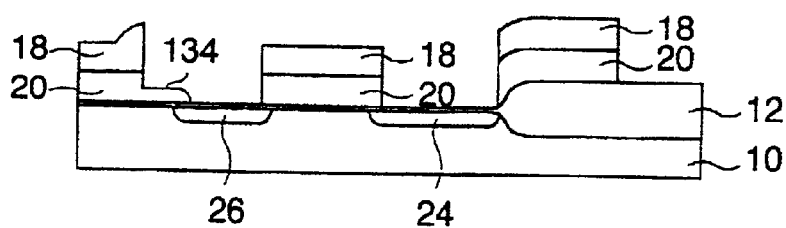
Figure 32D:
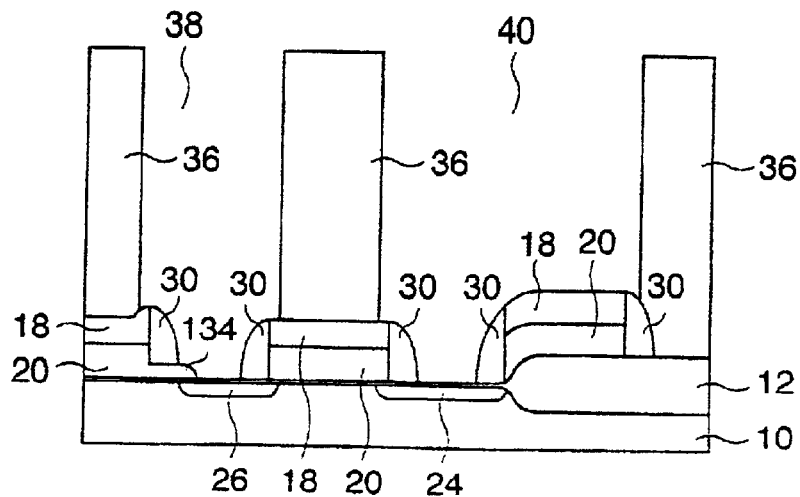

When the base polycrystalline silicon film 128 is etched in this state, the residue 132 functions as a mask, adversely leaving a part of the polycrystalline silicon film 128 as residue 134 (FIG. 32C).

Then, when the through-holes 38, 40 are formed by the same way as by the method for fabricating the semiconductor storage device shown in FIGS. 3B to 3D, the residue 134 is adversely exposed in the through-holes 38, with a result of short-circuit with the contact conducting films 44.

Thus, the structure of the semiconductor storage device according to the first embodiment is very sensitive to dust, and there is a risk that this may result in decrease of yields. If simply yields are decreased, it can be solved by means of redundancy or other means. Shirt circuit between the bit lines 62 and the word lines 20 is a serious problem. That is, a current regularly flows from the bit lines 62 to the word lines 20 when in a standby operation because a potential of the bit lines 62 is set to half the source voltage, and a potential of the word lines 20 is set at zero. The current consumption is therefore increased when in a standby operation, which cannot be remedied by the usual redundancy.

The semiconductor storage device according to the present embodiment and the method for fabricating the same can solve the problem the first embodiment cannot solve.

As shown in the plan view of FIG. 33 and the sectional view of FIG. 34, the semiconductor storage device according to the present embodiment is characterized in that fine through-holes 38 for connecting bit lines 62 and drain diffused layers 26, and find through-holes 40 for contact of capacitor storage electrodes 46 are formed, and the capacitor storage electrodes 36 are formed in larger openings 142 formed on the through-holes 40.

This structure can sufficiently space the contact conducting films 44 buried in the through-holes 38 from the gate electrodes 20, whereby short-circuit between the gate electrodes 20 and the bit lines 62 can be drastically decreased.

A polycrystalline silicon film 140 is present in columnar projections in the openings 142, whereby larger capacitances can be obtained.

Next, the method for fabricating the semiconductor storage device according to the present embodiment will be explained.

First, an about 300 nm-thick device isolation film 12 is formed on the major surface of a silicon substrate 10 to define a device region 14 by, e.g., the usual LOCOS. Then, an about 10 nm-thick gate oxide film 16 is formed in the device region by thermal oxidation.

Subsequently, an about 150 nm thick polycrystalline silicon film containing a high concentration of P is formed by CVD and is patterned by the usual lithography and etching to form the gate electrodes 20.

In the present embodiment the polycrystalline silicon film alone is patterned to form the gate electrodes 20, but as in the first embodiment, a polycrystalline silicon film and a silicon nitride film are successively formed, and the laminated film of these films may be patterned together. In the latter case, accidental exposure of the gate electrodes 20 in the through-holes 38, 40 can be prevented in forming the through-holes 38, 40.

Figure 35A:
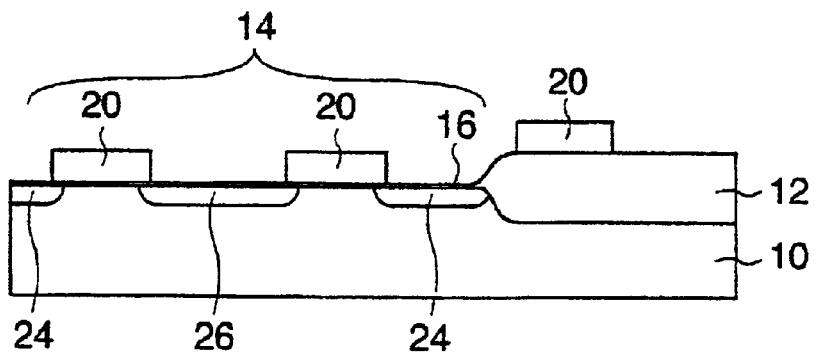
FIGS. 35A–35C are sectional views of the semiconductor storage device according to the eighth embodiment in steps of a method for fabricating the semiconductor storage device (Part 1).

Then, source diffused layers 24 and drain diffused layers 26 of the memory transistors are formed by, with the gate electrodes 20 as a mask, implanting, e.g., P ions under the conditions of an acceleration energy of 20 keV and a dose of $2 \times 10^{13}$ ions $cm^{-2}$. Although not shown in the present embodiment, the thus-formed diffused layers become $n^-$ layers of the LDD structure of peripheral circuit n-transistors (FIG. 35A).

Figure 35B:
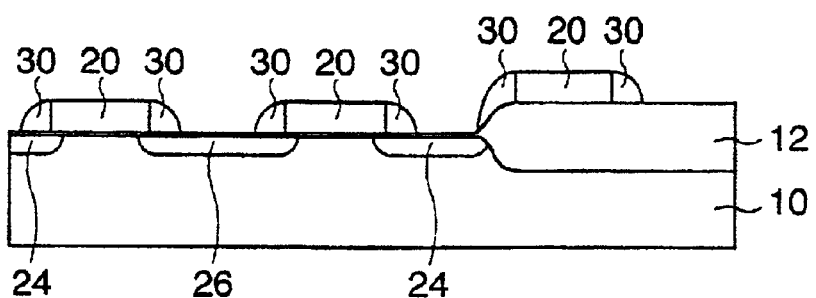

Then, an about 100 nm-thick silicon nitride film is formed by CVD and then is subjected to anisotropic etching to form by self-alignment sidewall nitride films 30 on the sidewalls of the gate electrodes 20 (FIG. 35B). The sidewalls may be formed of silicon oxide film.

Subsequently, source/drain diffused layers of peripheral circuit n-transistors are formed by selectively implanting, for example, As ions under the conditions of a 40 keV acceleration energy and a $4 \times 10^{15}$ ions $cm^{-2}$ dose. Thus, peripheral circuit transistors of the LDD structure can be formed.

Then, an about 2 μm thick BPSG film is deposited by CVD to form an inter-layer insulation film 36.

Then, an about 100 nm-thick polycrystalline silicon film is formed on the inter-layer insulation film 36 by CVD. Next, the polycrystalline silicon film is patterned by the usual lithography and etching to form a polycrystalline silicon pattern 136.

Figure 35C:
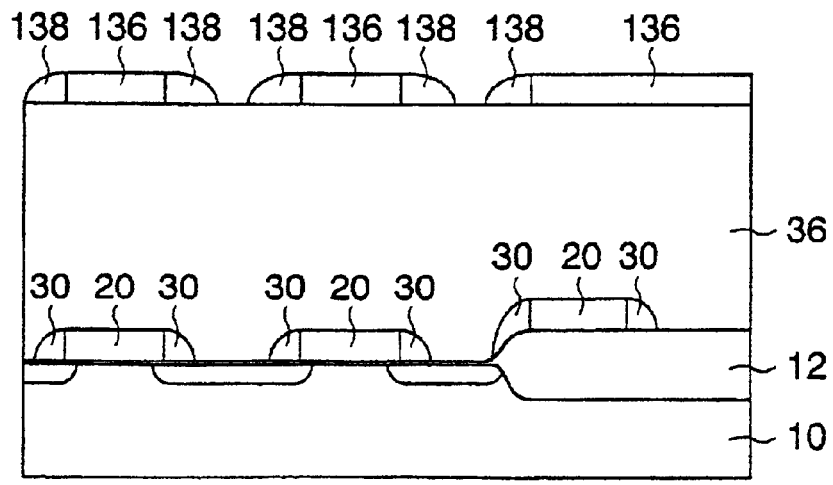

Subsequently, an about 150 nm-thick polycrystalline silicon film is deposited and then etched by RIE to form polycrystalline silicon sidewalls 138 on the sidewalls of the patterned polycrystalline silicon patterns 136 (FIG. 35C).

Figure 36A:
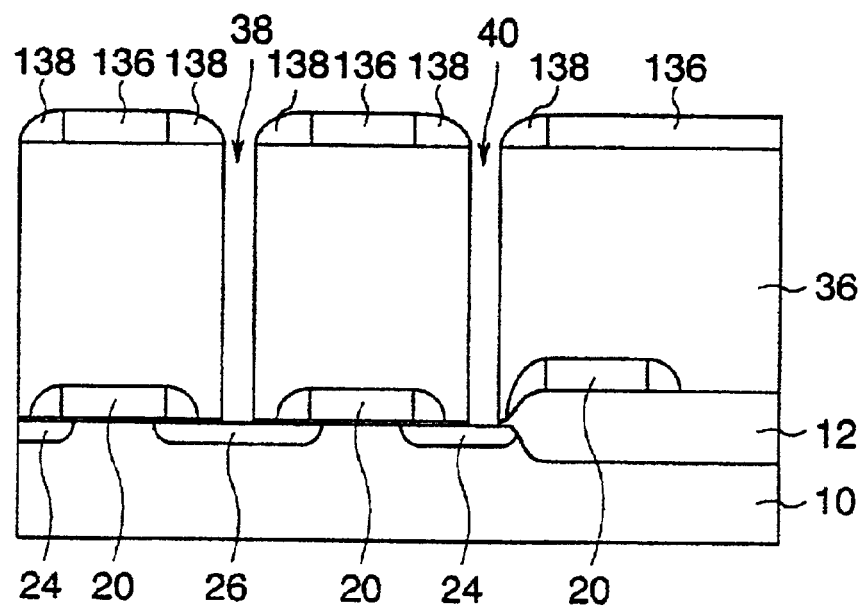
FIGS. 36A and 36B are sectional views of the semiconductor storage device according to the eighth embodiment in steps of a method for fabricating the semiconductor storage device (Part 2).

Then, with the thus-formed polycrystalline silicon pattern 136 and the polycrystalline silicon sidewalls 138 as a mask, the inter-layer insulation film 36 is etched to form the through-holes 40 opened on the source diffused layers 24 and the through-holes 38 opened on the drain diffused layers 26 (FIG. 36A).

The thus-formed through-holes 38, 40 are opened with the polycrystalline silicon patterns 136 and the polycrystalline silicon sidewalls 138 as a mask, and these through-holes can have fine openings of, e.g., 0.1 μm, which is below minimum resolution dimensions of an exposure device.

The method in which the through-holes 38, 40 are formed needs a considerable number of fabrication steps. The through-holes 38, 40 can be formed by electron beam lithography by limiting regions in which the through-holes 38, 40 are formed, e.g., to the memory cells. Generally, electron beam lithography adds time to the throughput, but the additional time can be compensated by the fabrication step number difference of the above-described method, whereby it is possible to shorten the throughput time.

Figure 36B:
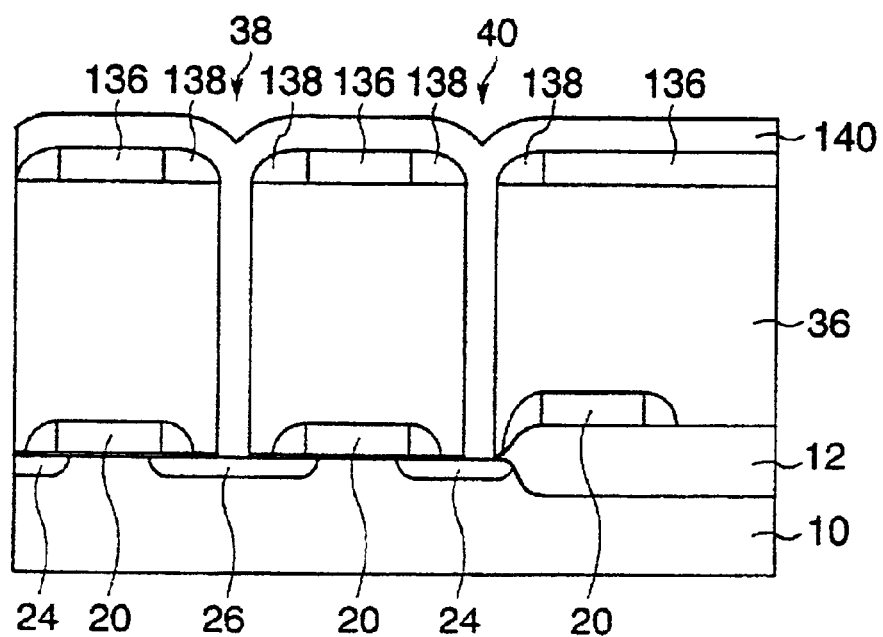

Then, an about 100 nm thick polycrystalline silicon film 140 is deposited by CVD to fill the through-holes 38, 40 (FIG. 36B). This step is not essential but is effective to increase a capacitance and protect the base substrate from damages by the etching. This will be described later.

Figure 37A:
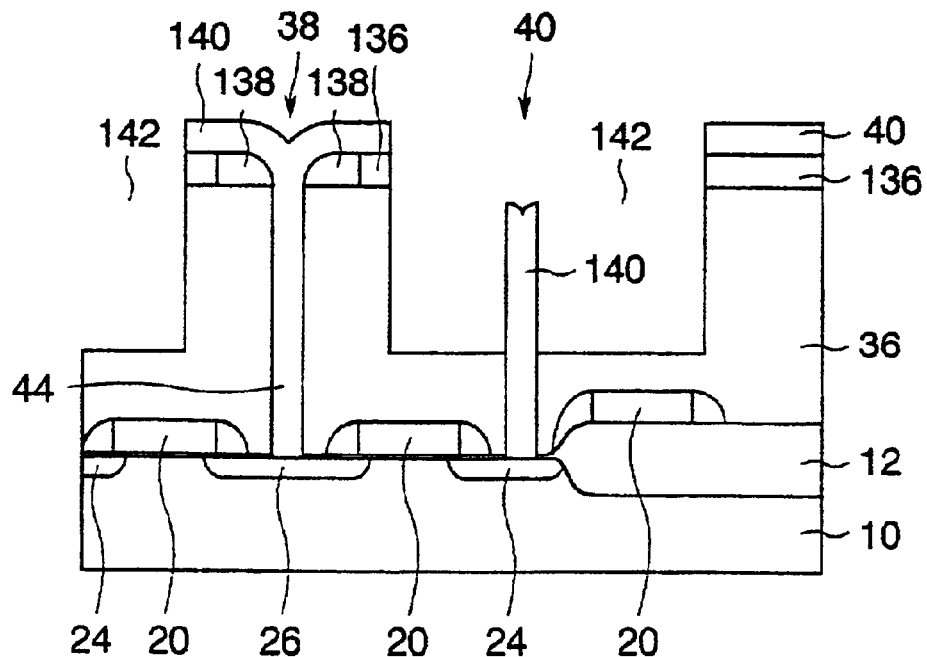
FIGS. 37A and 37B are sectional views of the semiconductor storage device according to the eighth embodiment in steps of a method for fabricating the semiconductor storage device (Part 3).

Subsequently, the polycrystalline silicon film 140, the polycrystalline silicon patterns 136, the polycrystalline silicon sidewalls 138 and the inter-layer insulation film 36 are patterned by the usual lithography and etching to form openings 142 in regions for capacitors to be formed in (FIG. 37A). At this time, the polycrystalline silicon film 140 which has been buried in the through-holes 40 is left in columnar projections which keep the surface of the silicon substrate 10 from direct damage by the etching.

It is necessary to pause the etching of the inter-layer insulation film 36 therein. In a case that the etching cannot have sufficient precision, it is possible that the inter-layer insulation film 36 is a laminated film of, e.g., a silicon nitride film and a BPSG film, and the etching of the openings 142 are stopped on the silicon nitride film. This adds to a number of the fabrication steps but facilitates the depth control of the openings 142, lowers capacitance disuniformity, and stabilizes characteristics.

Figure 37B:
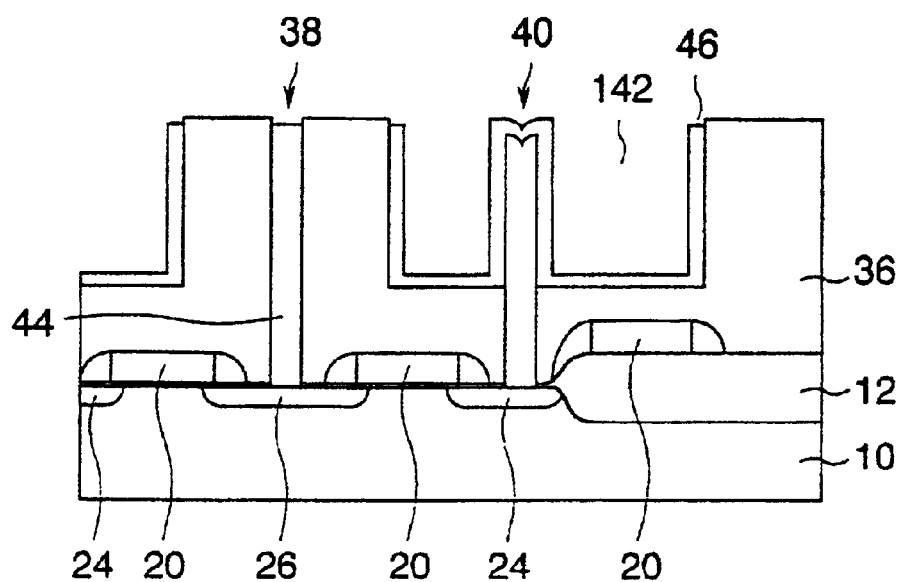

Then, an about 20 nm-thick polycrystalline silicon film is deposited by CVD and is polished by CMP until the inter-layer insulation film 36 is exposed on the surface. Thus, capacitor storage electrodes 46 are formed in the openings 142, and contact conducting films 44 are formed in the through-holes 38 (FIG. 37B).

The polycrystalline silicon films 140 left in the columnar projections within the openings 142 add to a surface area of the capacitor storage electrodes 46. This increases a capacitance.

Figure 38:
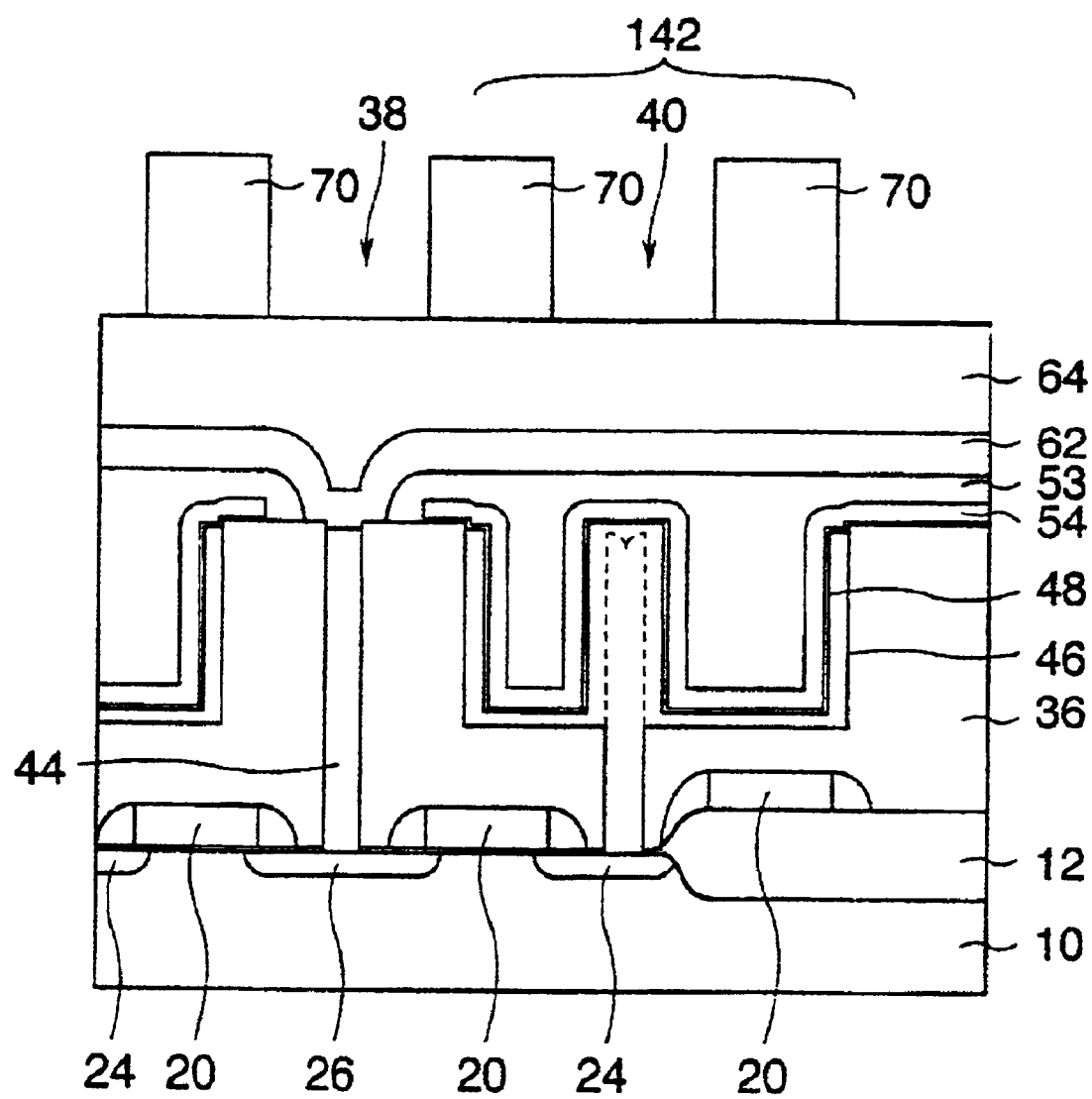
FIG. 38 is sectional view of the semiconductor storage device according to the eighth embodiment in steps of a method for fabricating the semiconductor storage device (Part 4).

After the contact conducting films 44 and the capacitor storage electrodes 46 are thus formed, the capacitor opposed films 48, the capacitor opposed electrodes 54, the bit lines 62, the wiring layers 70, etc. are formed in the same way as in the method for fabricating the semiconductor storage device according to the first embodiment (FIG. 38)

Thus, according to the present embodiment, the through-holes opened on the source diffused layers 24, and the through-holes 38 opened on the drain diffused layers 26 can have very small bores, whereby even when etching residues of the gate electrodes 20 take place, short-circuit between the bi line 62 and the gate electrodes 20 can be much reduced.

A surface area of the capacitor storage electrodes 54 is determined by the openings 142 separately formed, and the above-described effect can be produced without decrease a surface area of the capacitor storage electrodes 46.

The columnar projections are left in the openings 142 by depositing the polycrystalline silicon film 140 before the formation of the openings 142, whereby a capacitance can be increased, and a depth of the through-holes can be decreased for a certain capacitance.

In the present embodiment, the conducting film buried in the through-holes 38, 40 is polycrystalline silicon film but may be various conductor films as exemplified in the third embodiment.

Ninth Embodiment

The method for fabricating the semiconductor storage device according to a ninth embodiment will be explained with reference to FIGS. 39A to 40B. Common members of the ninth embodiment with the first embodiment of FIGS. 1 to 7 and with the semiconductor storage device according to the third embodiment and the method for fabricating the same are represented by common reference numerals to simplify and not repeat their explanation.

FIGS. 39A–39B, and 40A–40B are sectional views of the semiconductor storage device in the steps of the method for fabricating the same, which explain the method.

In the method for fabricating the semiconductor storage device according to the first embodiment, as shown in FIG. 4A, in forming the contact conductor films 44 and the capacitor storage electrodes 46, a polycrystalline silicon film containing a high concentration of P is formed, and then the polycrystalline silicon film on the inter-layer insulation film 36 is removed by CMP.

In the method for fabricating the semiconductor storage device according to the third embodiment, as shown in FIG. 17A, in forming the contact conductor films 44, the capacitor storage electrodes 46 and the conductor films 80, a Ti film and a TiN film are successively formed, and then the TiN film and the Ti film on the inter-layer insulation film 36 are removed by CMP.

As described in the sixth embodiment, however, the contact conductor films 44 and the capacitor storage electrodes 46 are formed in the through-holes 38, 40, 60, pulverized objects generated upon the polishing intrude into he through-holes 38, 40, 60 with a risk of lowering yields.

When the pulverized objects intrude into the through-holes 40, the through-holes 40 are filled up, with results that a capacity cannot be ensured, and also a breakdown voltage is lowered.

In the third embodiment, by the use of lithography in place of CMP, a photo-resist is left in the through-holes 38, 40, 60, and then with the photo-resist as a mask the Ti film and the TiN film are etched off. This method cannot control the etching at the end point.

The control in terms of time needs overetching, because residues at places other than within the through-holes 38, 40, 60 cause short-circuit between, e.g., the bit lines 62 and the capacitor storage electrodes 46. The overetching etches even the capacitor storage electrodes 46 on the sidewalls of the through-holes 40, with a result of a decreased capacitance.

In the method for fabricating the semiconductor storage device according to the present embodiment, the contact conductor films 44 and the capacitor storage electrodes 46 and the conductor films 80 can be formed by CMP without intrusion of the pulverized objects, etc. into the through-holes 38, 40, 60.

The present embodiment to be described below is applied to the method for fabricating the semiconductor storage device according to the third embodiment but may be applicable to the method for fabricating the semiconductor storage device according to the other embodiments.

Through-holes 38, 40, 60 are formed in an inter-layer insulation film 36 in the same way as in the method for fabricating the semiconductor storage device according to the third embodiment shown in FIGS. 16A to 16C.

Figure 39A:
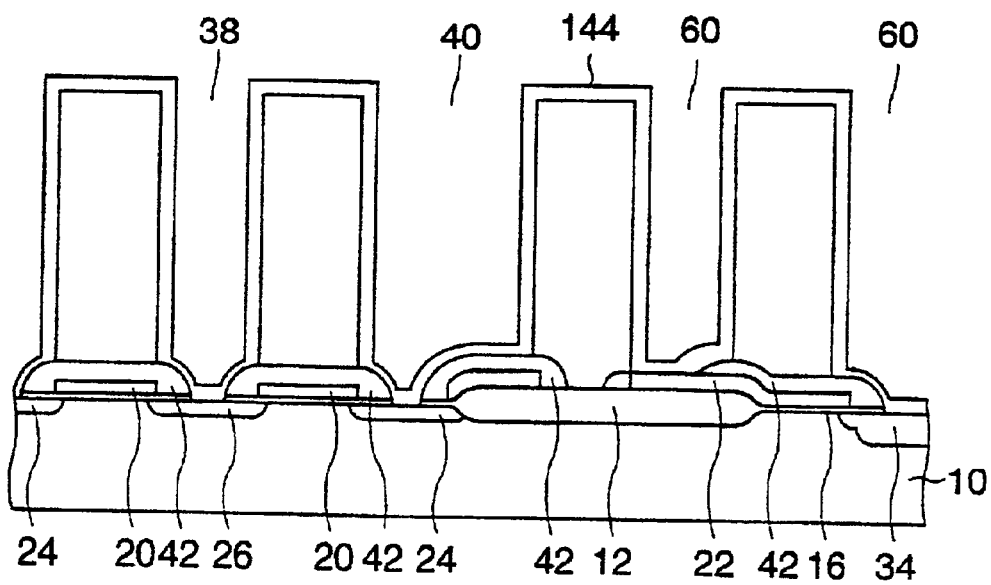
FIGS. 39A and 39B are sectional views of the semiconductor storage device according to a ninth embodiment in steps of a method for fabricating the semiconductor storage device (Part 1).

Then, an about 10 nm-thick Ti film and an about 30 nm-thick TiN film are successively formed by CVD to form a conductor film 144 (FIG. 39A).

Figure 39B:
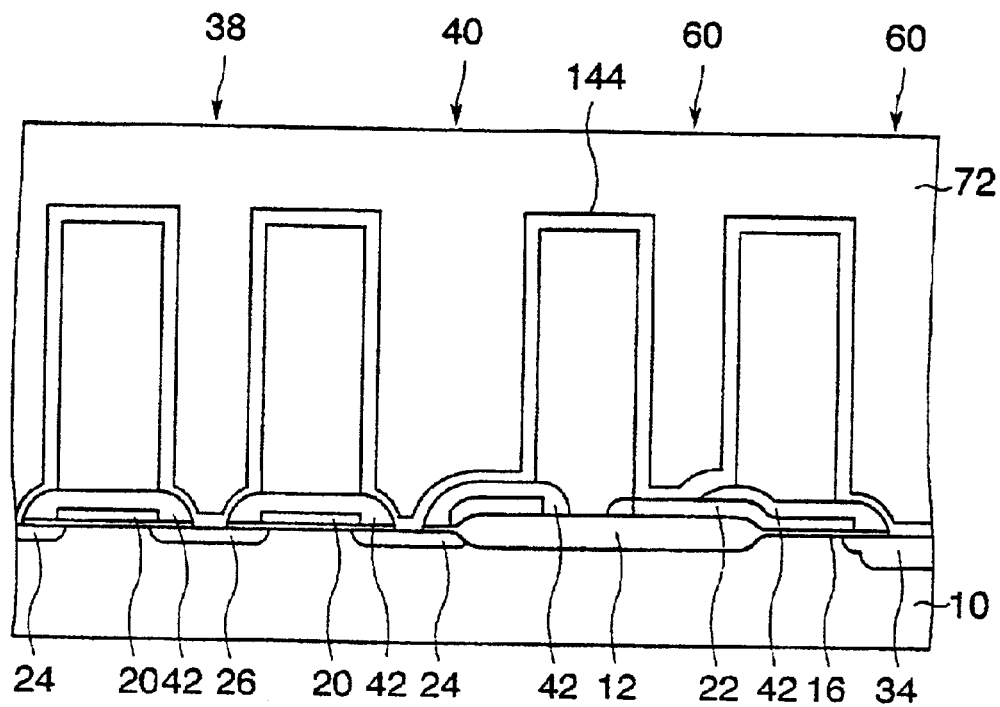

Subsequently, a pigment-containing resist is applied to the surface to form an about 3 $\mu$m-thickness photo-resist 72, whereby the through-holes 38, 40, 60 are completely filled with the photo-resist (FIG. 39B). Photosensitive polyimide may be used in place of the photo-resist 72.

Figure 40A:
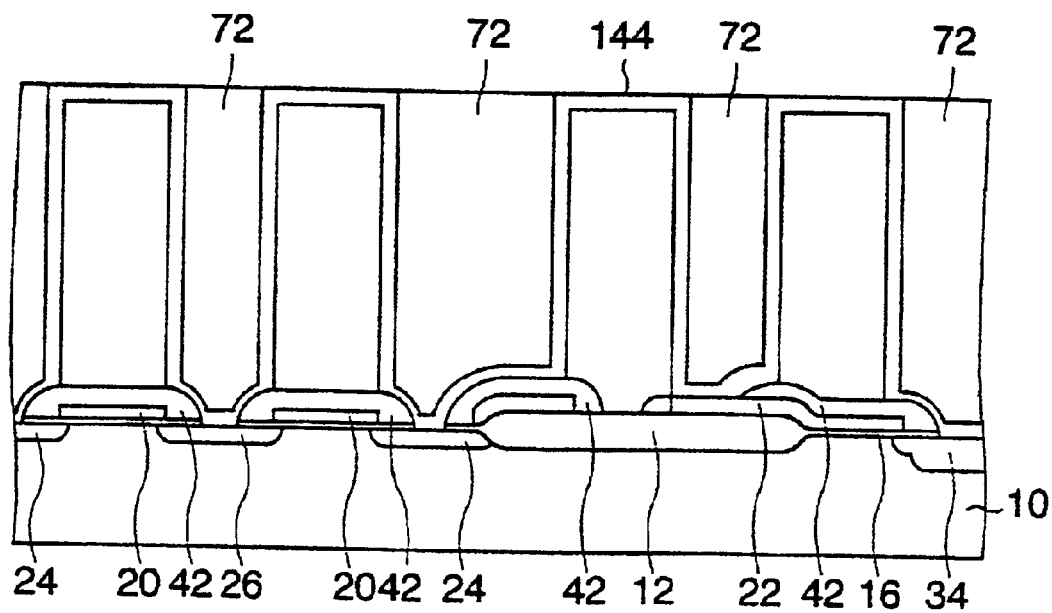
FIGS. 40A and 40B are sectional views of the semiconductor storage device according to the ninth embodiment in steps of a method for fabricating the semiconductor storage device (Part 2).

Next, the entire surface of the photo-resist 72 is exposed to leave the photo-resist 72 only in the through-holes 38, 40, 60 (FIG. 40A).

Then, the conductor film 144 on the inter-layer insulation film 36 is removed by CMP. At this time, pulverized objects, etc. generated by the polishing do not intrude into the through-holes 38, 40, 60 because of the photo-resist 72 buried in the through-holes 38, 40, 60. Thus, contact conductor films 44, capacitor storage electrodes 46 and conductor films 80 are formed.

In place of exposing the entire surface of the photo-resist 72, the photo-resist 72, the TiN film and the Ti film may be removed by CMP.

Figure 40B:
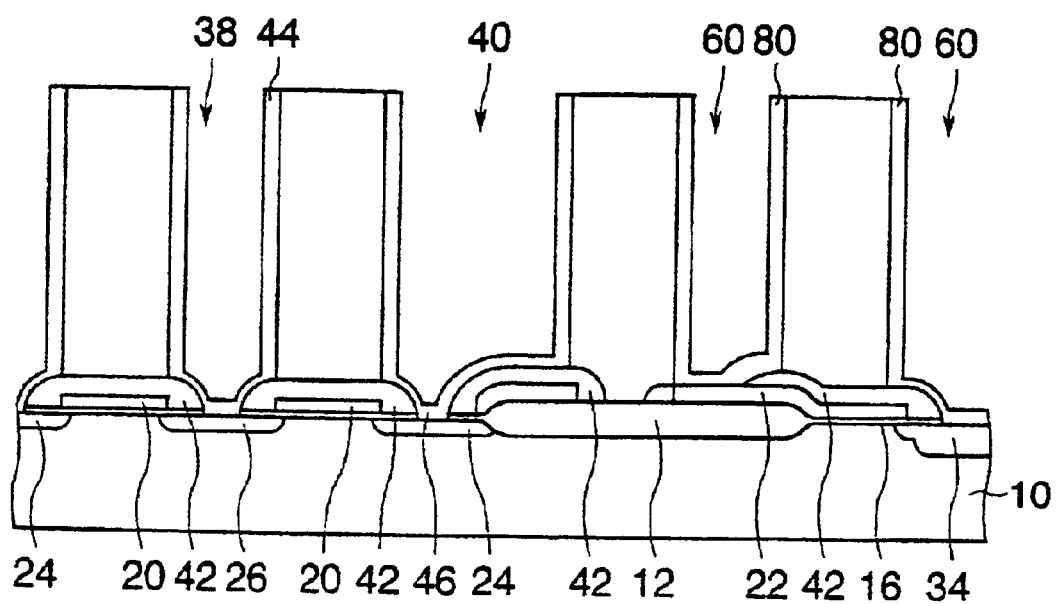

The photo-resist 72 left in the through-holes 38, 40, 60 are removed by an aqueous solution of hydrogen peroxide (FIG. 40B).

Subsequently, the semiconductor storage device is fabricated by the method shown in FIGS. 17A to 18B.

Thus, in the present embodiment, in the polishing step for forming the contact conductor films 44, the capacitor storage electrodes 46 and the conductor films 80, the photo-resist 70 is buried in the through-holes 38, 40, 60, whereby none of pulverized objects generated by the polishing and a polishing agent intrude into the through-holes 38, 40, 60, whereby decrease of yields caused thereby can be prevented.

In the present embodiment, the bit line contacts and the contacts of the peripheral circuit region have the same structure as in the semiconductor storage device according to the third embodiment, but the contacts of the peripheral circuit region may have the structure of the semiconductor storage devices according to the first and the second embodiments.

The structure of the semiconductor storage device according to the present embodiment is applicable to other embodiments of the present invention.

Tenth Embodiment

The semiconductor storage device according to a tenth embodiment of the present invention and the method for fabricating the same will be explained with reference to FIGS. 41 to 43B. Common members of the present embodiment with the semiconductor storage device according to the ninth embodiment and the method for fabricating the same are represented by common reference numerals to simplify or not repeat their explanation.

Figure 41:
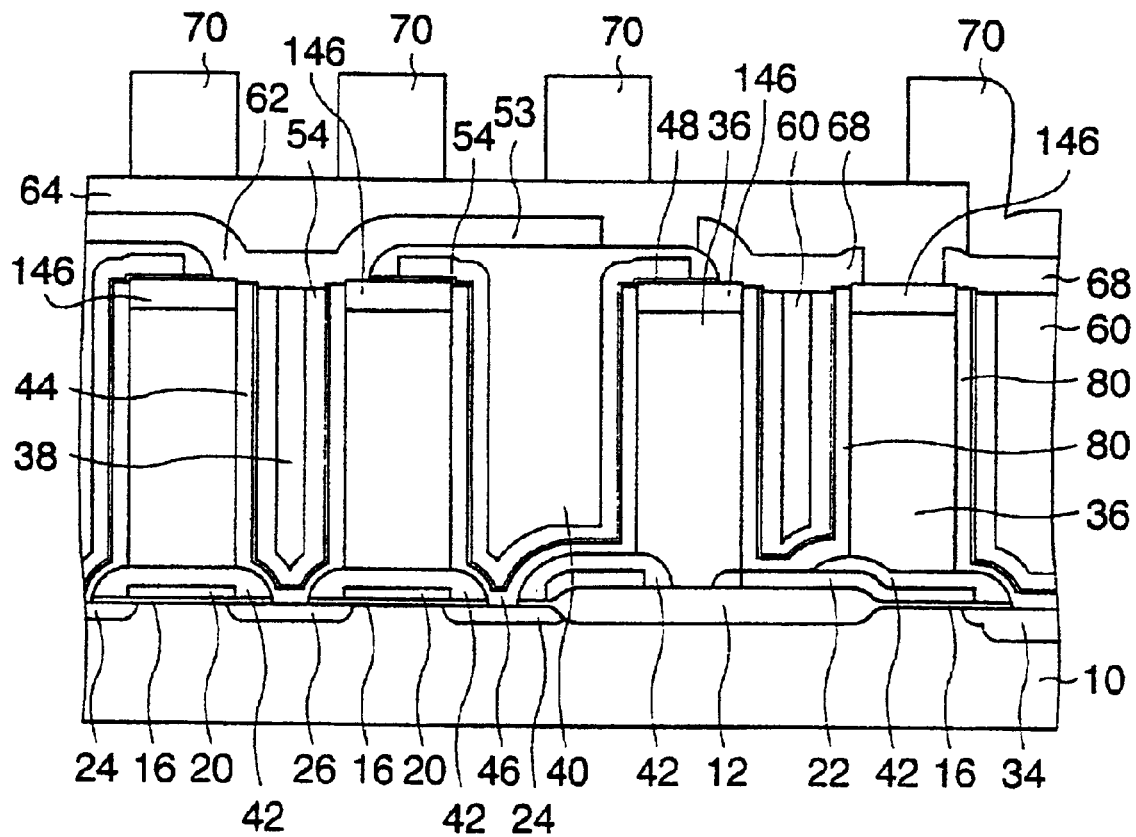
FIG. 41 is a diagrammatic sectional view of the semiconductor storage device according to a tenth embodiment explaining the structure thereof.

FIG. 41 is a diagrammatic sectional view of the semiconductor storage device according to the present embodiment showing the structure thereof. FIGS. 42A–42B, and 43A–43B are sectional views of the semiconductor storage device in the steps of the method for fabricating the same explaining the method.

The method for fabricating the semiconductor storage device according to the present embodiment can form, as can the ninth embodiment, the contact conducting films, the capacitor storage electrodes, etc. by CMP without intrusion of pulverized objects, etc. into the through-holes.

The semiconductor storage device according to the present embodiment is characterized in that an insulation film having etching characteristics different from those of an inter-layer insulation film 36 is formed on the top of the inter-layer insulation film 36.

Then, the method for fabricating the semiconductor storage device according to the present embodiment will be explained.

In the same way as the method for fabricating the semiconductor storage device according to the third embodiment shown in FIGS. 16A and 16B, memory cell transistors and peripheral circuit transistors are formed on a semiconductor substrate 10.

Next, an about 2 $\mu$m-thick silicon oxide film and an about 50 nm-thick silicon nitride film are successively formed by CVD to form the inter-layer insulation film 36, and a silicon nitride film 146 is formed on the top of the inter-layer insulation film 36.

Figure 42A:
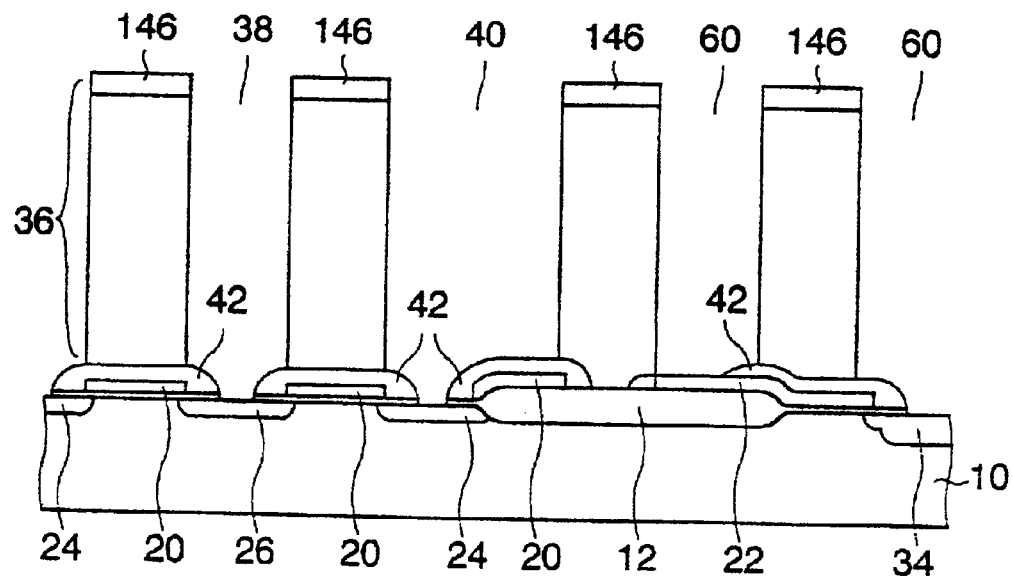
FIGS. 42A and 42B are sectional views of the semiconductor storage device according to the tenth embodiment in steps of a method for fabricating the semiconductor storage device (Part 1).

Subsequently, through-holes 38, 40, 60 are opened in the inter-layer insulation film 36 of the two layer-structure of the silicon nitride film 146 and the silicon oxide film (FIG. 42A).

Figure 42B:
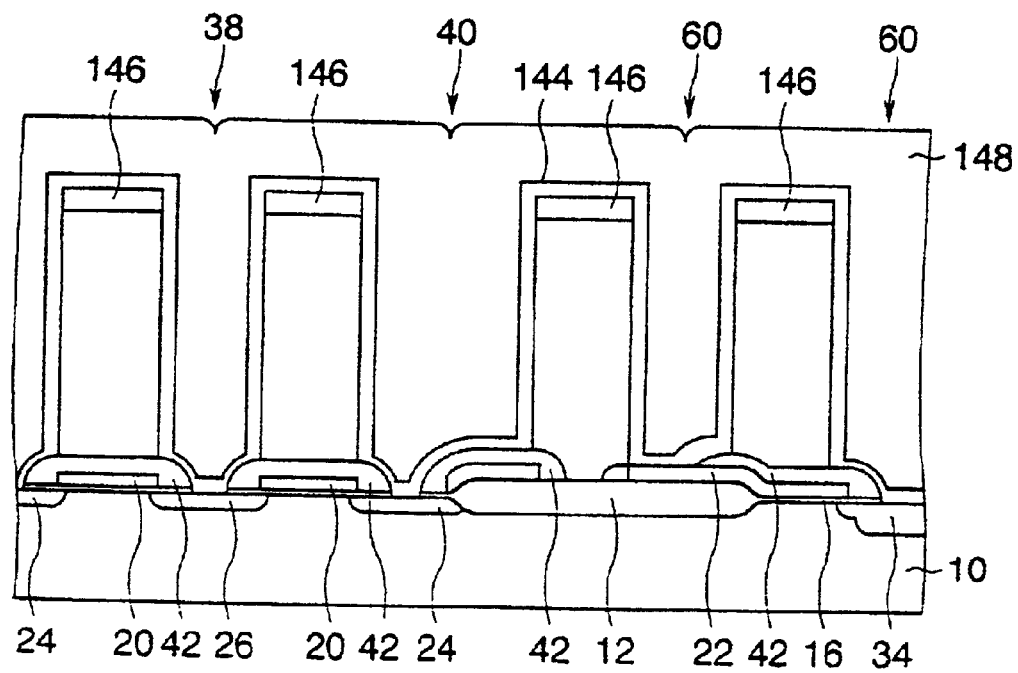

Then, conducting films 144 constituted by an about 10 nm-thick Ti film and an about 30 nm-thick TiN film, and an about 0.15 µm-thick silicon oxide film 148 are deposited by CVD (FIG. 42B). The silicon oxide film 148 completely fills the through-holes 38, 40, 60.

Figure 43A:
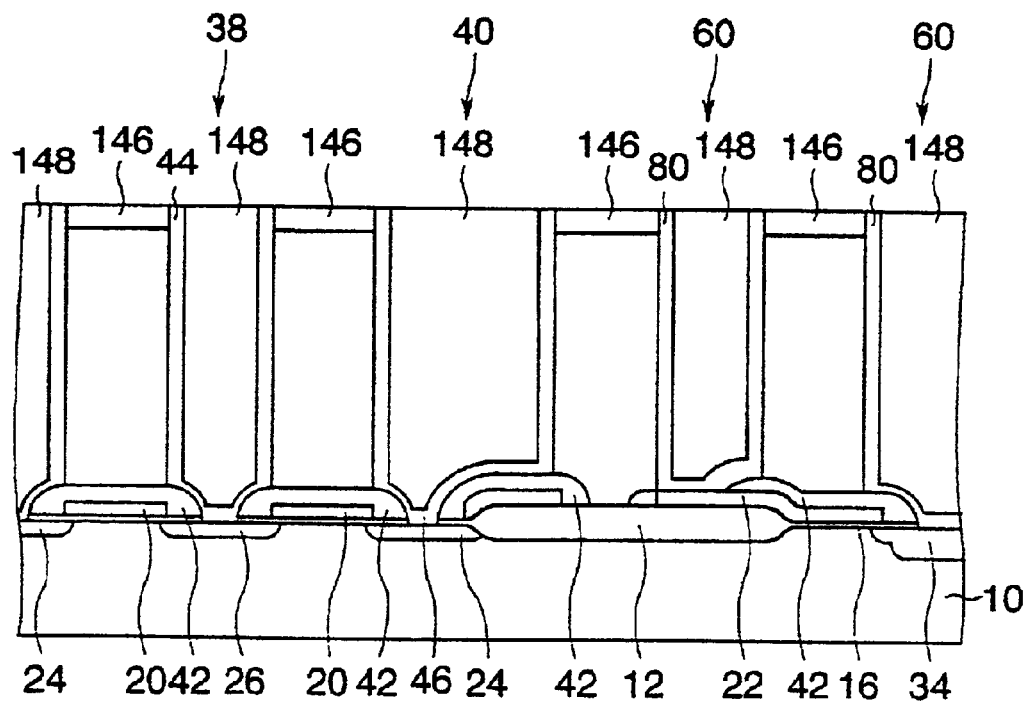
FIGS. 43A and 43B are sectional views of the semiconductor storage device according to the tenth embodiment in steps of a method for fabricating the semiconductor storage device (Part 2).

Then, the silicon oxide film 148 is removed onto the conducting films 144 by CMP, and then the conducting films 144 are removed onto the silicon nitride films 146 (FIG. 43A). Thus, contact conducting films 44, capacitor storage electrodes 46 and conducting films 80 are formed.

By thus forming the contact conducting films 44, the capacitor storage electrodes 46 and the conducting films 80, pulverized objects generated upon the polishing and the polishing agent are hindered from intruding into the through-holes 38, 40, 60.

Figure 43B:
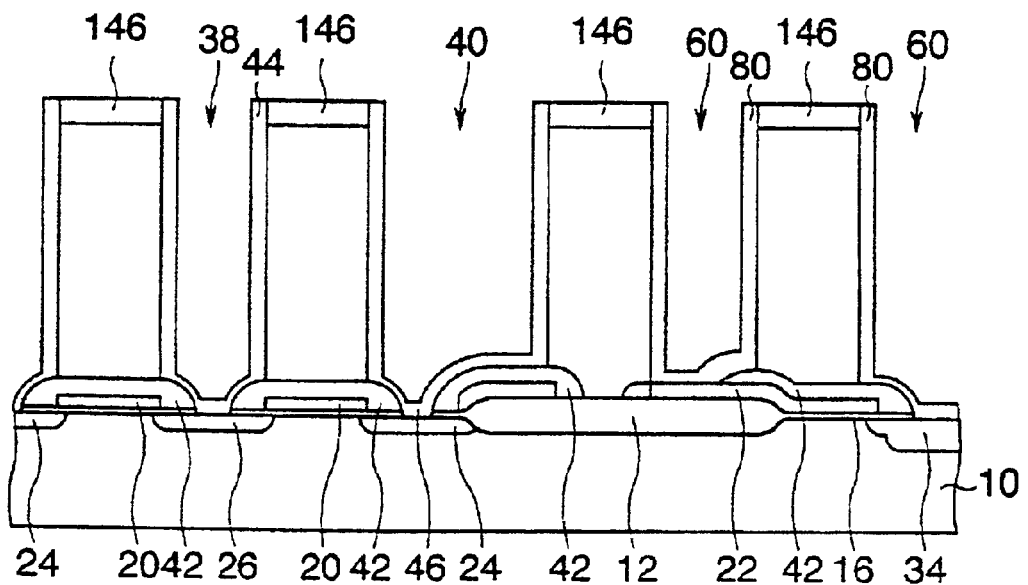

Subsequently, the silicon oxide films 148 are removed by wet etching using, e.g., an aqueous solution of hydrogen fluoride (FIG. 43B).

Then, the semiconductor storage device is formed by the method for fabricating the same shown in FIGS. 17A to 18B.

Thus, according to the present embodiment, the silicon oxide film 148 is filled in the through-holes 38, 40, 60, before the polishing for forming the contact conductor films 44, the capacitor storage electrodes 46 and the conductor films 80, whereby none of pulverized objects generated upon the polishing and a polishing agent intrude into the through-holes 38, 40, 60, with a result that yields drop due to their intrusion can be prevented.

Eleventh Embodiment

The semiconductor storage device according to the eleventh embodiment of the present invention and the method for fabricating the same will be explained with reference to FIGS. 44 to 47.

Figure 44:
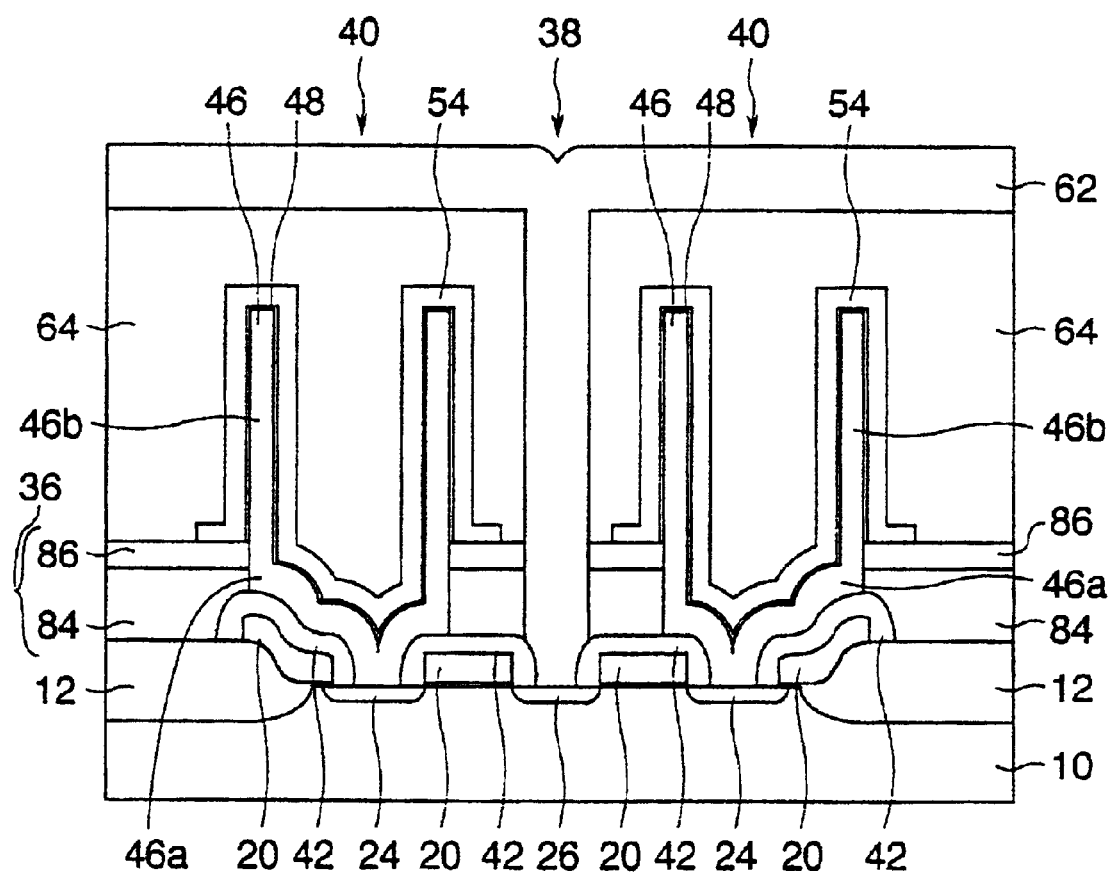
FIG. 44 is a diagrammatic sectional view of the semiconductor storage device according to an eleventh embodiment explaining the structure thereof.

FIG. 44 is a diagrammatic sectional view of the semiconductor storage device according to the present embodiment. FIGS. 45A–45B, 46A–46B, and 47 are sectional views of the semiconductor storage device according to the present embodiment in the steps of the method for fabricating the same, which explain the method.

In the semiconductor storage device according to the present embodiment and the method for fabricating the same, the methods for fabricating the semiconductor storage devices according to the fourth and the tenth embodiments are applied to a semiconductor storage device including double-side cylinder capacitors.

That is, as shown in FIG. 44, capacitor storage electrodes 46 are constituted by contacts 46a formed on the inside walls and bottoms of through-holes 40 formed in an inter-layer insulation film 36 formed of a silicon oxide film 84 and a silicon nitride film 86, and projections 46b formed continuously on the contacts 46a. Capacitor dielectric films 48 are formed covering the interior of the capacitor storage electrodes 46 and the exteriors of the projections 46b. Capacitor opposed electrodes are formed covering at least a part of the capacitor dielectric films 48. Thus, the double-sided cylinder capacitors are formed.

An inter-layer insulation film 36 having the through-holes 40 is formed of a laminated film of films having different etching characteristics from each other. That is, in the semiconductor storage device according to the present embodiment, the inter-layer insulation film 36 comprise silicon oxide films 84 and silicon nitride films 86.

Then, the method for fabricating the semiconductor storage device according to the present embodiment will be explained.

Figure 45A:
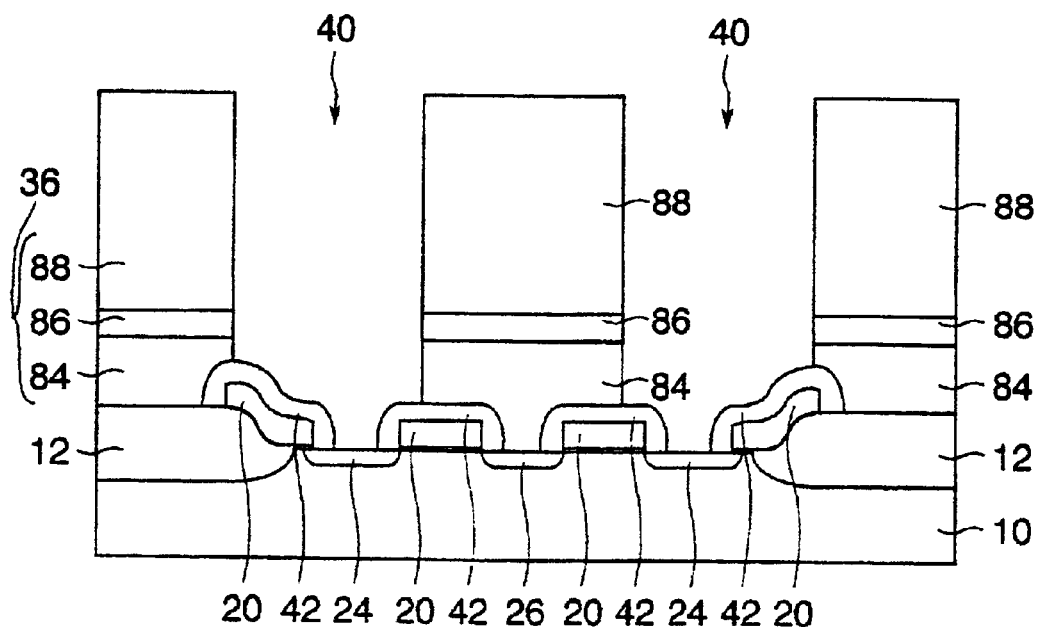
FIGS. 45A and 45B are sectional views of the semiconductor storage device according to the eleventh embodiment in steps of a method for fabricating the semiconductor storage device (Part 1).

First, in the same way as in the method for fabricating the semiconductor storage device according to the fourth embodiment shown in FIGS. 20A to 21A, an inter-layer insulation film of the three-layer structure of the silicon oxide film 84, the silicon nitride film 86 and the silicon oxide film 88 is formed, and the through-holes 40 are opened therein. In the method for fabricating the semiconductor storage device according to the fourth embodiment, the through-holes 38 opened on the drain diffused layers 26 are concurrently opened, but the through-holes 38 are not formed concurrently in the present embodiment (FIG. 45A).

Figure 45B:
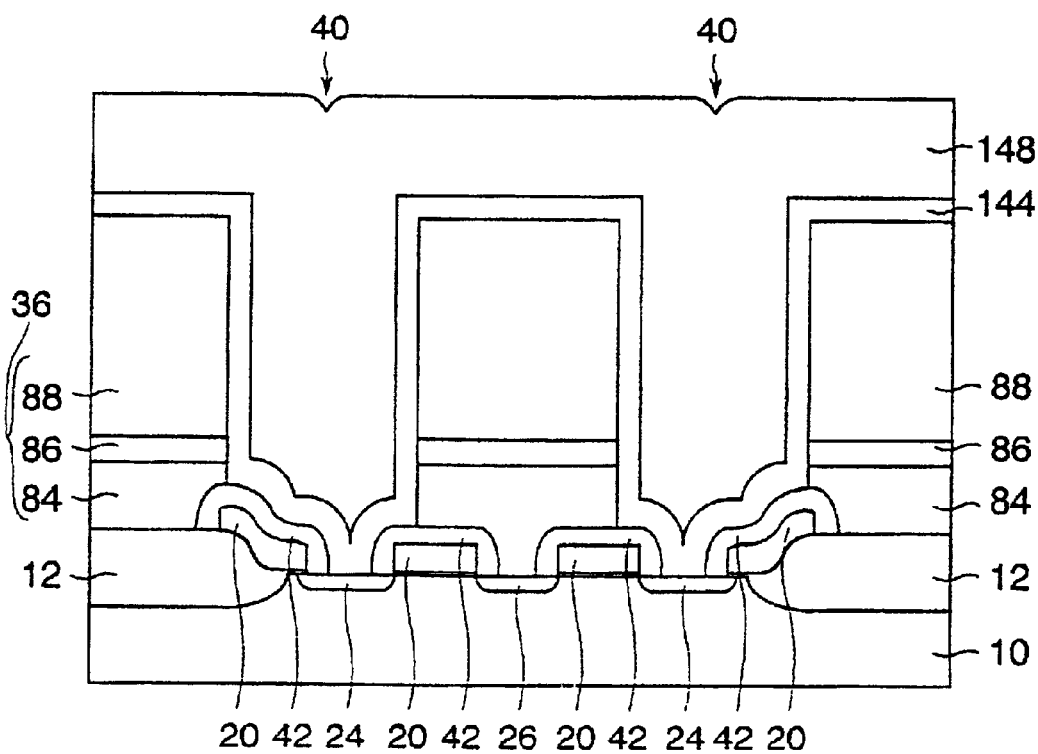

Then, a conducting layer 144 of an about 50 nm-thick polycrystalline silicon film heavily doped with P, and an about 0.15 µm-thick silicon oxide film 148 are deposited by CVD (FIG. 45B). Thus, the through-holes 40 are completely filled with the silicon oxide film 148.

Figure 46A:
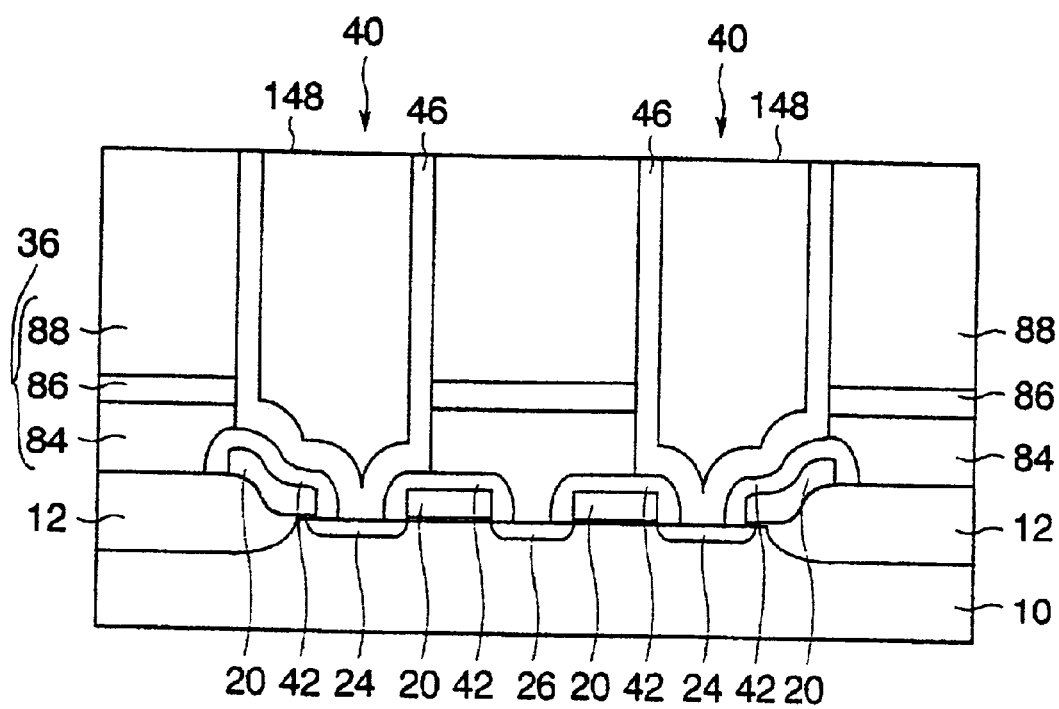
FIGS. 46A and 46B are sectional views of the semiconductor storage device according to the eleventh embodiment in steps of a method for fabricating the semiconductor storage device (Part 2).

Subsequently, the silicon oxide film 148 is removed by CMP onto the conducting film 144. Then, the conducting film 144 is removed onto the silicon oxide film 88 (FIG. 46A). Thus, capacitor storage electrodes 46 are formed.

By thus forming the capacitor storage electrodes 40, pulverized objects generated upon polishing the conducting film 144 and a polishing agent are hindered from intruding into the through-holes 40.

Figure 46B:
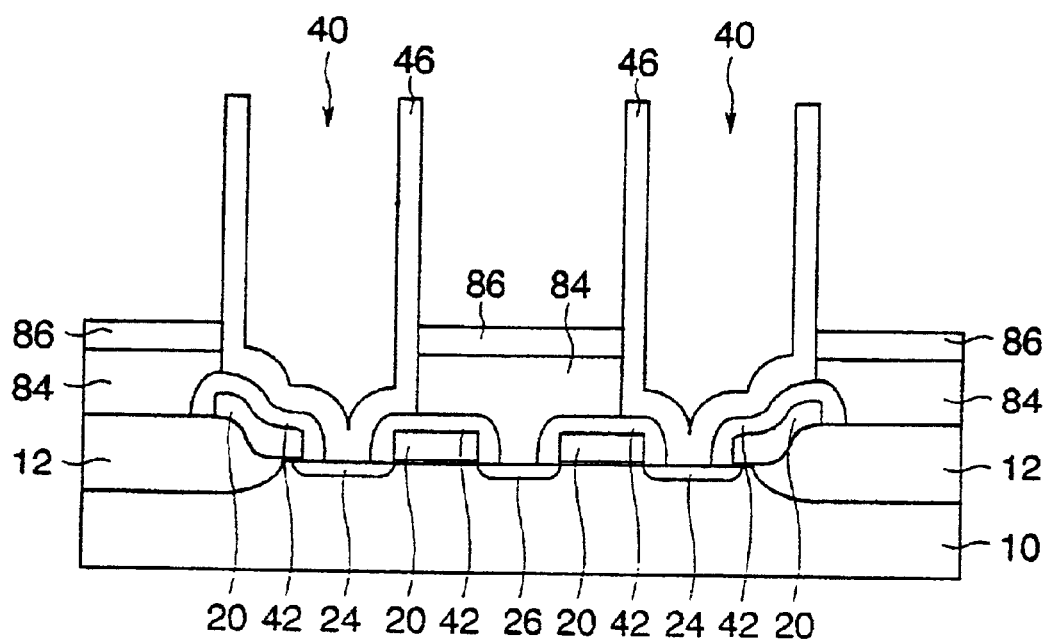

Then, wet etching using, e.g., an aqueous solution of hydrogen fluoride follows. The silicon oxide film 148 and the silicon oxide film 88 are removed by this etching to expose the capacitor storage electrodes 46 into cylindrical projections (FIG. 46B).

Then, the capacitor dielectric film 48 and the capacitor opposed electrodes 54 are formed, and an inter-layer insulation film 64 is deposited.

Figure 47:
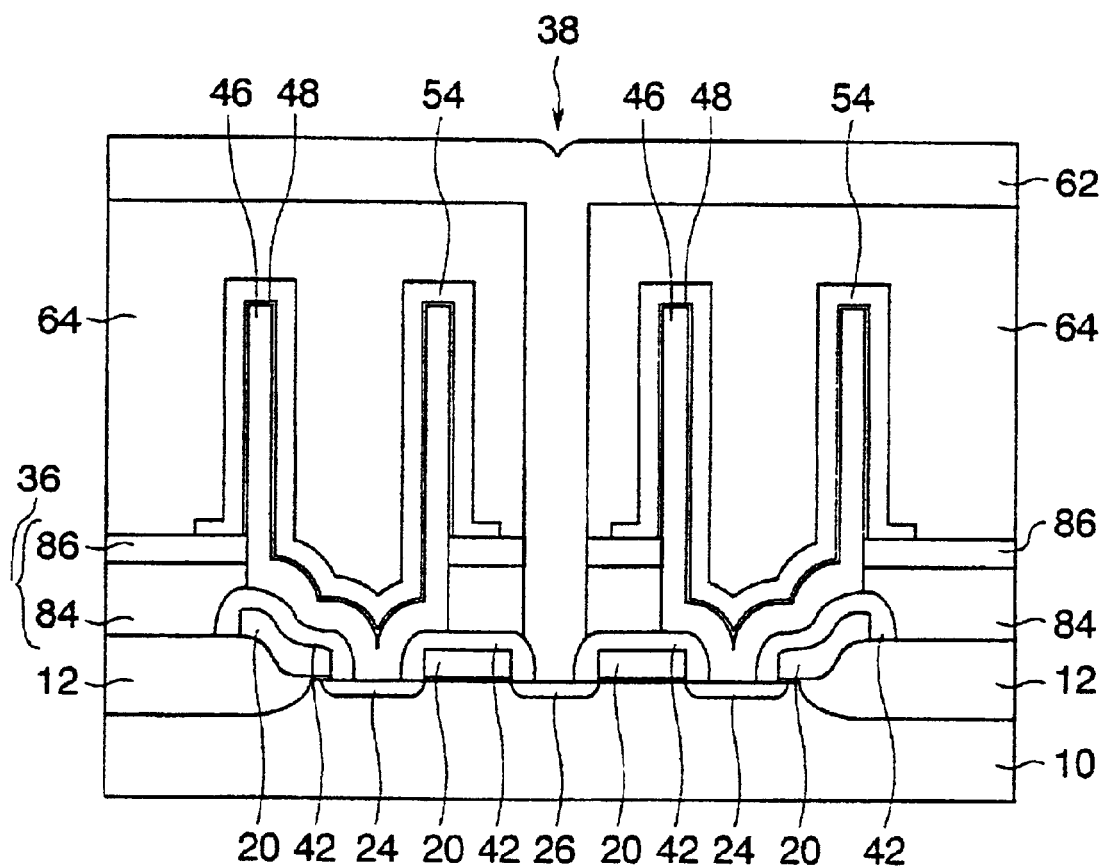
FIG. 47 is sectional views of the semiconductor storage device according to the eleventh embodiment in steps of a method for fabricating the semiconductor storage device (Part 3).

Subsequently, through-holes 38 are opened through the inter-layer insulation film 64, the silicon nitride film 86 and the silicon oxide film 84, and bit lines 62 are formed filling the through-holes 38 (FIG. 47).

The semiconductor storage device is thus fabricated, whereby DRAM cells having capacitors of a two-sided cylinder structure are fabricated.

As described above, according to the present embodiment, by burying the silicon oxide film 148 in the through-holes 40 before the step of the polishing for forming the capacitor storage electrodes 46, pulverized objects generated by the polishing and a polishing agent are hindered from intruding into the through-holes 40, whereby in the semiconductor storage device including cylinder capacitors, yield drops due to their intrusion can be prevented.

In the present embodiment, the bit lines 62 formed on the inter-layer insulation film 64 are directly connected to the drain diffused layers 26, but as in the semiconductor storage device according to the first embodiment, the bit lines 62 may be connected to the drain diffused layers 26 through the contact conducting films 44 formed concurrently with the formation of the capacitor storage electrodes 46.

Twelfth Embodiment

The structure of the semiconductor storage device according to the twelfth embodiment of the present invention will be explained with reference to FIGS. 48A to 49. Common members of the present embodiment with the semiconductor storage devices according to the first to the third embodiments are represented by common reference numerals to simplify or not to repeat their explanation.

Figure 48A:
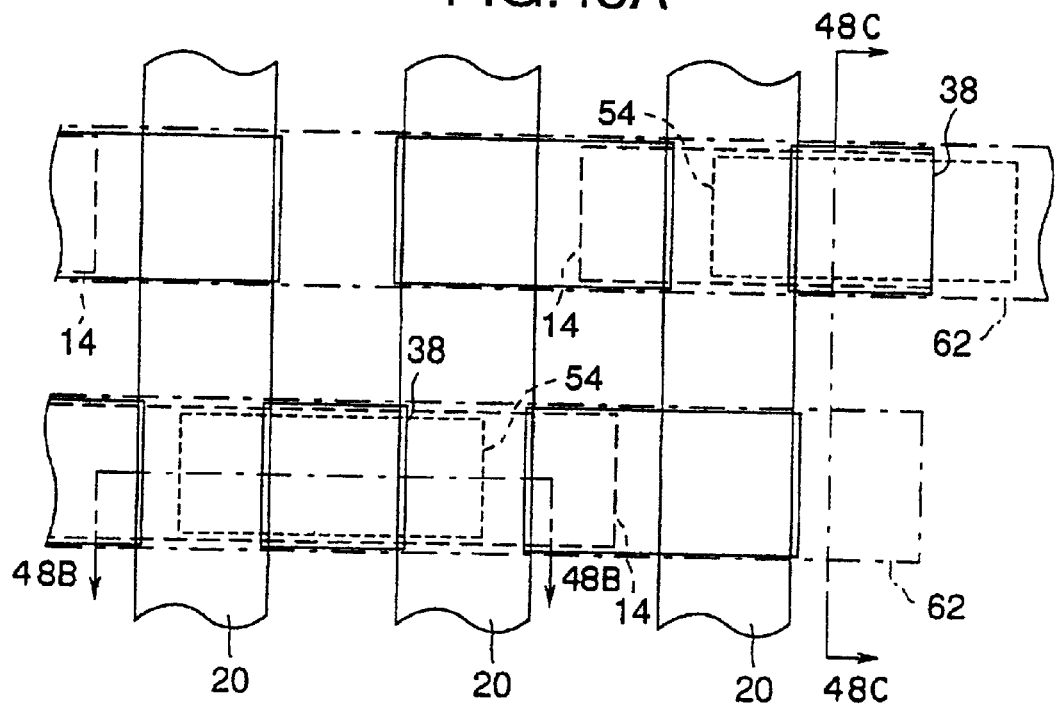
FIG. 48A is a plan view of the semiconductor storage device according to a twelfth embodiment of the present invention explaining a structure thereof.
Figure 48B:
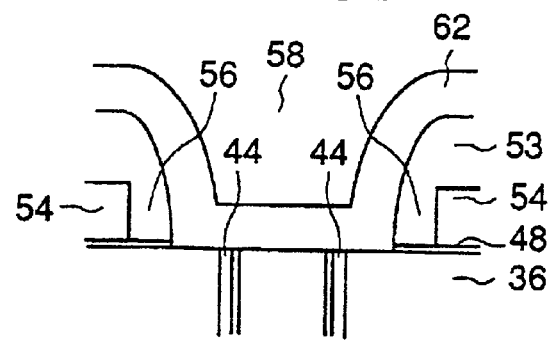
FIGS. 48B and 48C are partial sectional views of the semiconductor storage device according to a twelfth embodiment of the present invention explaining a structure thereof.
Figure 48C:
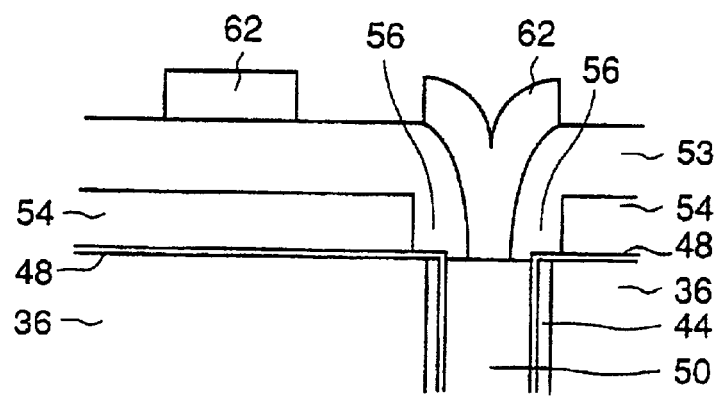

FIG. 48A is a plan view of the semiconductor storage device according to the present embodiment. FIG. 48B and 48C are sectional views of the semiconductor storage device according to the present embodiment, which show the structure thereof. FIG. 49 is a view which exemplifies the structure of the peripheral circuit of the semiconductor storage device according to the present embodiment.

The above-described first to the third embodiments make the best use of self-alignment process to dispense with various self-alignment allowances. Accordingly, it is possible to arrange word lines and bit lines in a line/space (L/S) arrangement of minimum processing dimension.

If the word lines and the bit lines are processed in a L/S of minimum processing dimensions, no overlap allowance, etc. between contact holes and wiring layers can be secured, and lines cannot be bent. To realize such memory cells, in addition to the means described in the above-described embodiments, it is necessary to lay out a pattern in consideration of a peripheral circuit layout, etc.

The structure of the semiconductor storage device according to the present embodiment can realize the semiconductor storage devices according to the first to the third embodiments, taking into consideration a layout of a peripheral circuit.

In the semiconductor storage device according to the present embodiment, as shown in FIG. 48A, the bit lines 62 and word lines 20 which have been patterned in minimum processing dimensions perpendicularly intersect each other. A problem with such layout is overlap allowances, etc. between the bit line contact holes and the bit lines.

The bit lines 62 have to contact conducting films 44 as shown in the sectional view along the line X–X' in FIG. 48A, which is shown in FIG. 48B, and to this end the contact conducting films 44 have to be exposed in the bit line contact holes 58.

However, when pattern edges of the bit lines are adversely formed in the bit line contact holes 58 by unalignment in patterning the bit lines 62, the contact conducting films 44, etc. are etched in forming the bit lines 62, and steps are unfavorably increased. Accordingly, it is required that a width of the bit line contact holes 58 is smaller than a width of the bit lines 62 as shown in FIG. 48C which is the sectional view along the line Y–Y' in FIG. 48A.

On the other hand, it is required that the bit lines 62, which are to be connected to polycrystalline silicon films 50 buried in the through-holes 38, are sufficiently spaced from the through-holes 38 in forming capacitor opposed electrodes 54 so that the polycrystalline silicon films 50 buried in the through-holes 38 are left connected to the capacitor opposed electrodes 54. Thus, it is preferable that the bit line contact holes 58 are wide.

To satisfy these requirements of the bit line contact holes 58, which are contradictory with each other, the thickness of the contact conducting films 44 and the width of the sidewall oxide films 56 must be optimized.

In a case, for example, that the bit lines 62 are patterned in a 0.3 μm L/S, and the through-holes are opened by 0.3 μm, an overlap of the bit lines 62 is, e.g., 0.07 μm, and a gap between the polycrystalline silicon films 50 and the capacitor opposed electrodes 54 is 0.1 μm in consideration of unalignment of the bit lines 62 with the bit line contact holes 58.

Next, the thickness of the contact conducting films 44 and the width of the sidewall oxide films 56 are optimized to satisfy the above-described parameters. For example, when a thickness of the contact conducting films 44 is 0.05 μm, a width of the sidewall oxide films 56 is 0.12 μm, an interval of the capacitor opposed electrodes 54 in the direction of the word lines is 0.4 μm, and a width of the bit line contact holes 58 is 0.16 μm.

The bit line contact holes 58 described here function to block etching the contact conducting films 44, etc. in the etching for the formation of the bit lines 62. Needless to say, if control of the etching is precise, a width of the bit line contact holes 58 may be wider than that of the bit lines 62.

By forming the bit line contact holes 58 of rectangular section which is lengthy in the direction of the bit lines 62 as shown in FIGS. 48B and C, a minimum cell area can be realized. This cell area is 0.72 μm².

Then, a structure example of the peripheral circuit will be explained.

Figure 49:
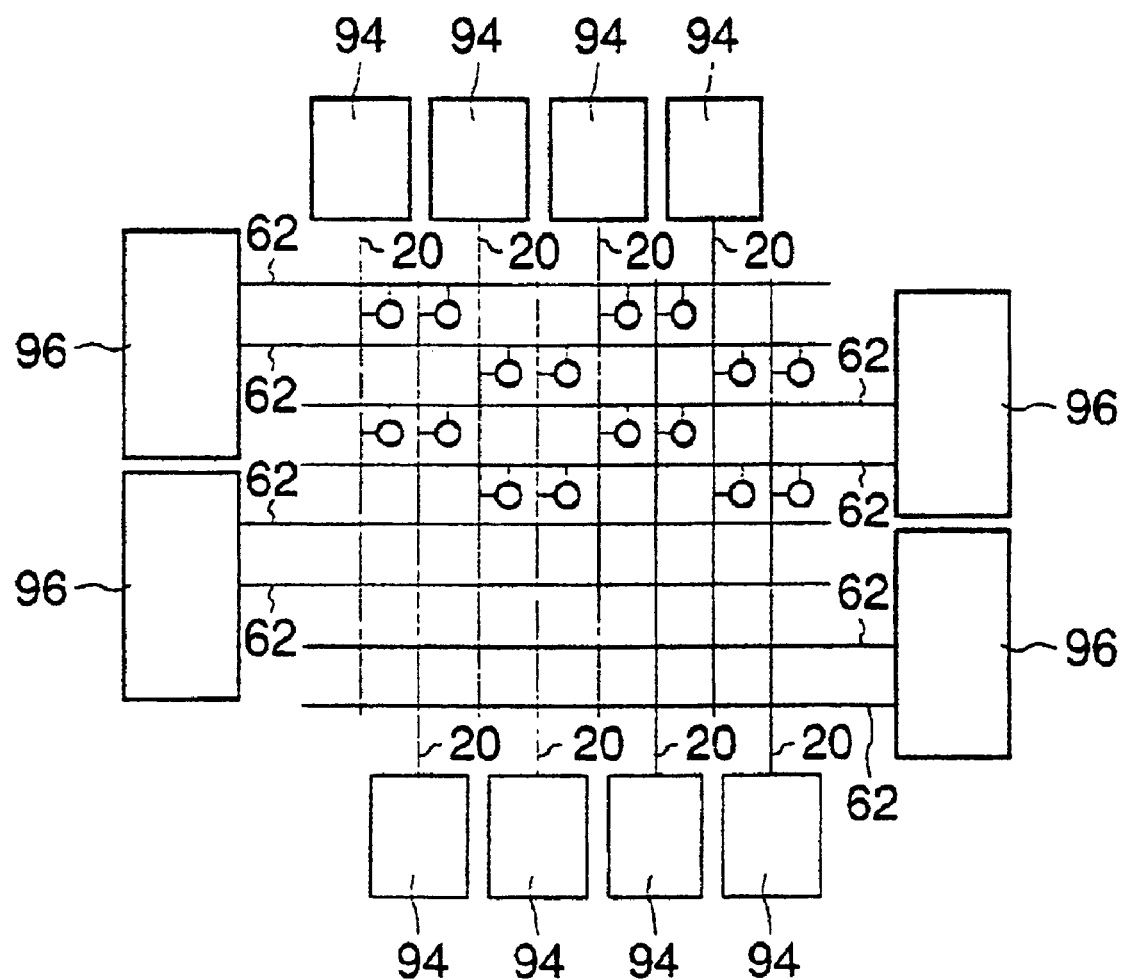
FIG. 49 is a view of an example of a peripheral circuit of the semiconductor storage device according to the twelfth embodiment.

As shown in FIG. 49, decoders 94 and sense amplifiers 96 are formed respectively on the opposed sides of a memory cell region. This arrangement of the decoders 94 and the sense amplifiers 96 enables a peripheral circuit to be arranged without any trouble even in a case that no alignment allowance is taken to decrease a memory cell area.

In the present embodiment, the word lines and the bit lines are arranged by a L/S of minimum processing dimensions, and it is impossible to bend the bit lines 62 on the way. Accordingly, the twist bit line structure in which a pair of bit lines are twisted on each other on the way to suppress interference therebetween. The use of the shield bit line structure in which shield plates are provided on bit lines to suppress interference therebetween unavoidably adds to a number of fabrication steps.

By making a film thickness of bit lines 62 sufficiently smaller than a gap between the bit lines 62, capacity coupling between the bit lines 62 can be reduced, and interference between the bit lines 62 can be reduced. For example, bit lines 62 have a structure of W film (50 nm)/TiN film (50 nm)/ Ti film (30 nm) and a total film thickness of 0.13 μm, whereby a film thickness of the bit lines 62 can be smaller than a half of a 0.3 μm gap between the bit lines 62. This works on the interference between the bit lines 62.

Thus, according to the present embodiment, by optimizing the structure of the bit line contact holes, even in a case that the bit lines are arranged in minimum processing dimensions, an overlap allowance between the bit line contact holes and the bit lines can be secured. The semiconductor storage device can have a much diminished memory cell area.

The decoders and the sense amplifiers are arranged respectively on the opposed sides of the memory cell area, whereby even in a case that the memory cell area is diminished without any alignment allowance, a peripheral circuit can be arranged without any trouble.

Thirteenth Embodiment

The semiconductor storage device according to a thirteenth embodiment and the method for fabricating the same will be explained with reference to FIGS. 50 to 55.

Figure 50:
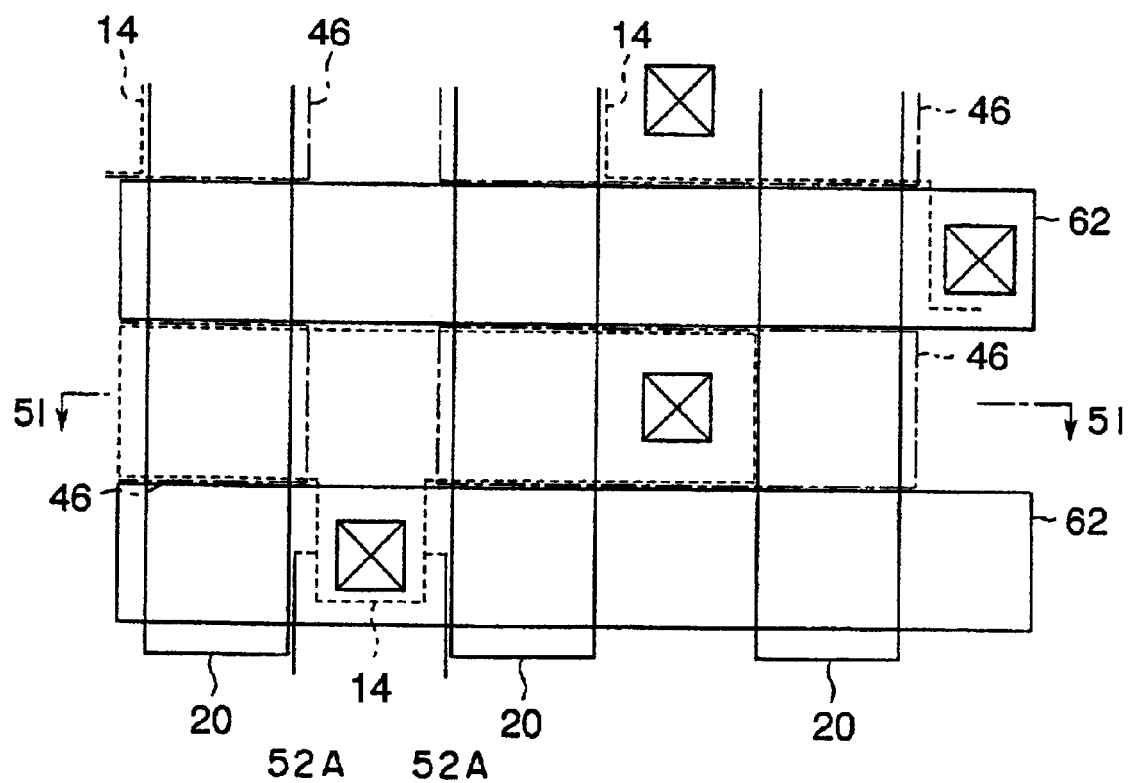
FIG. 50 is a plan view of the semiconductor storage device according to a thirteenth embodiment of the present invention explaining a structure thereof.
Figure 51:
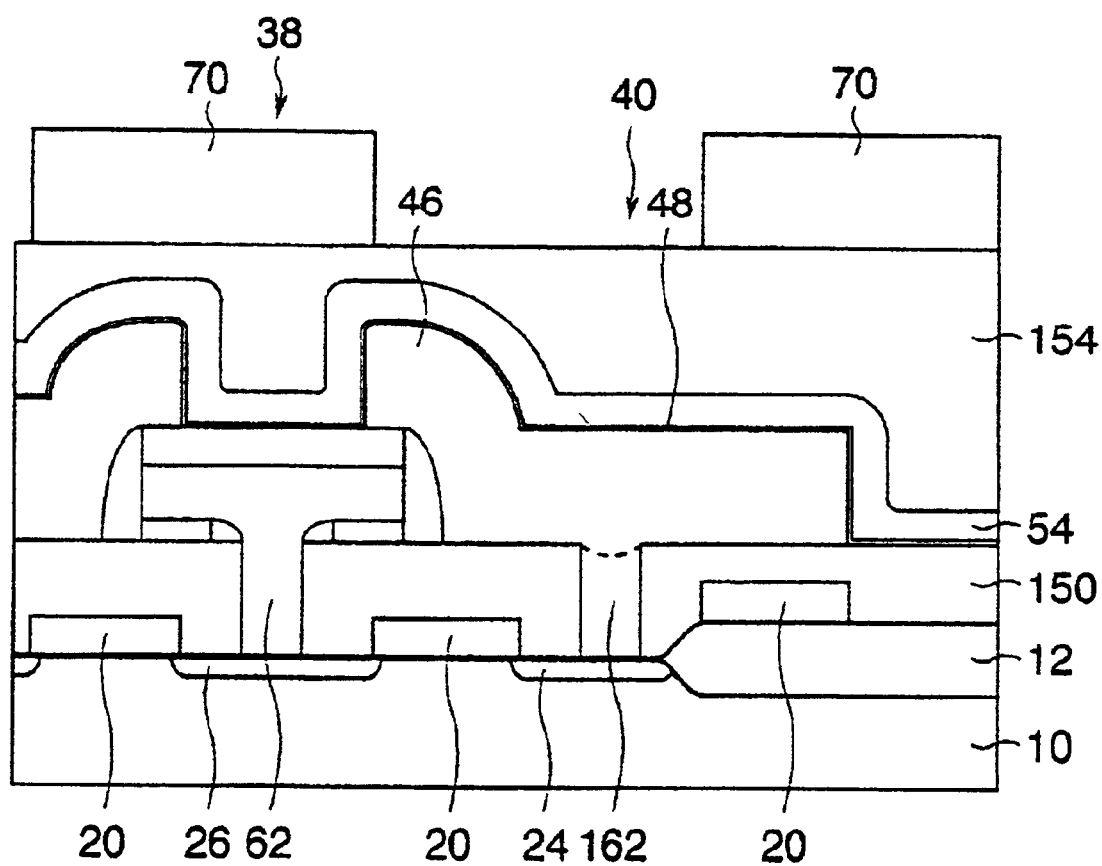
FIG. 51 is a diagrammatic sectional view of the semiconductor storage device according to the thirteenth embodiment explaining the structure thereof.

FIG. 50 is a plan view of the semiconductor storage device according to the present embodiment which explain the structure thereof. FIG. 51 is a diagrammatic sectional view of the semiconductor storage device of FIG. 50 along the line A–A' in FIG. 50. FIGS. 52A–52D, 53A–53B, and 54A–54B are sectional views of the semiconductor storage device in the steps of the method for fabricating the semiconductor storage device according to the present embodiment, which explain the method. FIG. 55 is a diagrammatic sectional view of a variation of the semiconductor storage device according to the present embodiment, which explains the structure thereof.

In the semiconductor storage device according to the present embodiment and the method for fabricating the same, different methods for forming the bit lines and the capacitors are applied to the semiconductor storage device according to the eighth embodiment and the method for fabricating the same.

First, the structure of the semiconductor storage device according to the present embodiment will be explained with reference to the plan view of FIG. 50 and the sectional view of FIG. 51. FIG. 51 basically shows the section along the line A–A' in FIG. 50, but parts of bit lines 62 and through-holes 38 are temporarily moved out. That is, FIG. 51 shows the section along the line B–B' in FIG. 50 and the section along the line A–A' in FIG. 50 together.

A device region 14 is defined on a semiconductor substrate 10 by a device isolation film 12. Source diffused layers 24 and drain diffused layers 26 are formed separately from each other in the device region 14. Gate electrodes 20 are formed through gate oxide films 16 on semiconductor substrate 10 between the source diffused layers 24 and the drain diffused layers 26. Thus, memory cell transistors are constituted by the gate electrodes 20, the source diffused layers 24 and the drain diffused layers 26.

The bit lines 62 are arranged in the direction intersecting the gate electrodes 20 and connected to the drain diffused layers 26 through the through-holes 38. Capacitor storage electrodes 46 are connected to the top of the source diffused layers 24 through through-holes 40, and capacitors are constituted by capacitor dielectric films 48 and capacitor opposed electrodes 54 formed on the capacitor storage electrodes 46. Wiring layers 70 are formed above the capacitors through an inter-layer insulation film 64. A DRAM comprising 1-transistor and 1-capacitor memory cells is constituted.

The gate electrodes 20, i.e., word lines, have a width of 0.2 $\mu$m and arranged at an interval of 0.3 $\mu$m. The through-holes 38, 40 have an opening diameter of 0.1 $\mu$m and spaced from the gate electrodes 20 by 0.1 $\mu$m. The bit lines have a width of 0.2 $\mu$m and are arranged at an interval of 0.3 $\mu$m. An overlap of the bit lines on the through-holes 38 is about 0.05 $\mu$m, and a distance of the bit lines from the through-holes 40 is about 0.1 $\mu$m. Thus, memory cells having a 0.5 $\mu$m cell area are constituted.

Then, the method for fabricating the semiconductor storage device according to the present embodiment will be explained.

A device isolation film of an about 300 nm-thickness is formed on the major surface of the silicon substrate 10 by, e.g., the usual LOCOS to define the device region 14. Then, an about 10 nm-thick gate oxide film 16 is formed in the device region 14.

Subsequently, an about 150 nm-thick polycrystalline silicon film containing a high concentration of P is grown by CVD, and the polycrystalline silicon film is patterned by the usual lithography and etching to form the gate electrodes 20.

Figure 52A:
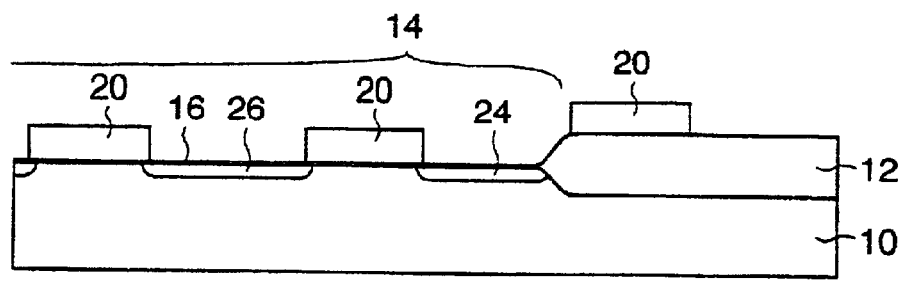
FIGS. 52A–52D are sectional views of the semiconductor storage device according to the thirteenth embodiment in steps of a method for fabricating the semiconductor storage device (Part 1).

Then, with the device isolation film 12 and the gate electrodes 20 as a mask, the source diffused layers 24 and the drain diffused layers 26 of the memory transistors are formed by implanting, for example, P ions under the conditions of a 20 keV acceleration energy and a $2\times10^{13}$ ions cm$^{-2}$ dose (FIG. 52A).

Next, an about 50 nm-thick silicon oxide film and an about 200 nm-thick BPSG film are successively grown by CVD and then are reflowed to planarize the surface to form an inter-layer insulation film 150.

Figure 52B:
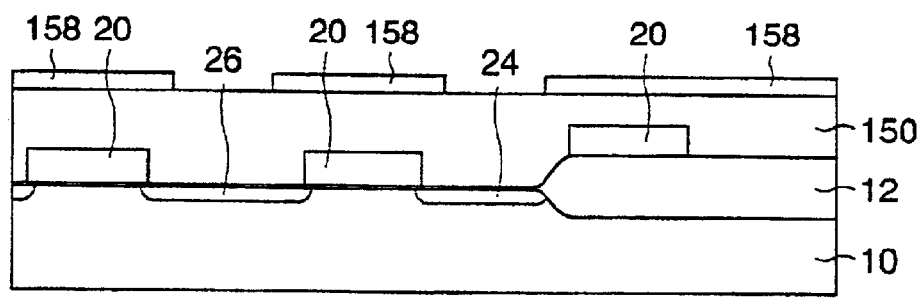

Subsequently, an about 50 nm-thick polycrystalline silicon film 158 is deposited by CVD and is patterned into an about 0.3 $\mu$m width by the usual lithography and etching (FIG. 52B).

Figure 52C:
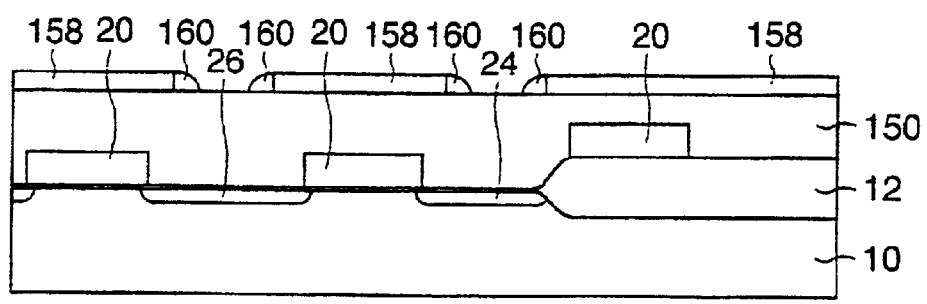

Then, an about 100 nm-thick polycrystalline silicon film is deposited by CVD and etched vertically by RIE to form polycrystalline silicon sidewalls 160 on the sidewalls of the patterned polycrystalline silicon film 158. The polycrystalline silicon sidewalls 160 formed at a 0.3 $\mu$m-width interval expose the inter-layer insulation film 150 by an about 0.1 $\mu$m-width (FIG. 52C).

Figure 52D:
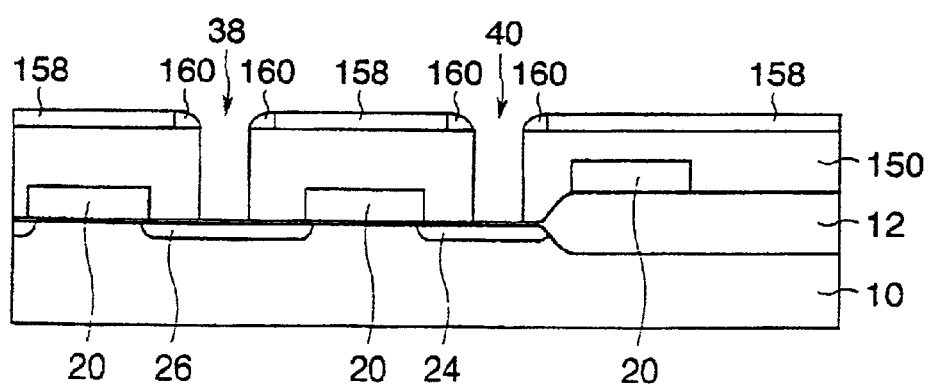

Next, with the polycrystalline silicon films 158 and the polycrystalline silicon sidewalls 160 as a mask, the inter-layer insulation film 150 is etched to form the through-holes opened on the drain diffused layers 26 and the through-holes 40 opened on the source diffused layers 24 (FIG. 52D).

The thus-formed through-holes 38, 40 have an opening diameter which is substantially equal to the interval of the polycrystalline silicon sidewalls 160, about 0.1 $\mu$m as described above.

In the present embodiment, the through-holes 38, 40 are opened with the polycrystalline silicon films 158 and the polycrystalline silicon sidewalls 160 as a mask, whereby the processing is enabled at below a resolution limit of an exposure device. As in the method for fabricating the semiconductor storage device according to the eighth embodiment, the through-holes 38, 40 may be opened by electron-beam lithography. By using either method, the through-holes can have dimensions which cannot be formed by the usual lithography.

Subsequently, an about 60 nm-thick polycrystalline silicon film, an about 100 nm-thick tungsten silicide film and a silicon nitride film are deposited by CVD and patterned by the usual lithography and etching, and the bit lines 62 of a tungsten polycide structure whose top is covered with the silicon nitride films 156.

Figure 53A:
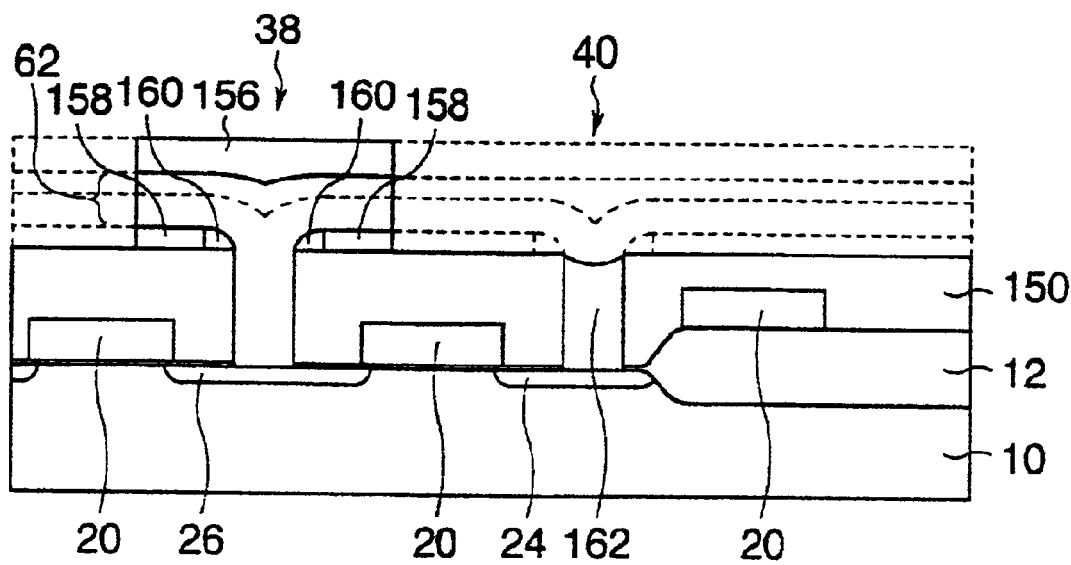
FIGS. 53A and 53B are sectional views of the semiconductor storage device according to the thirteenth embodiment in steps of a method for fabricating the semiconductor storage device (Part 2).

To pattern the bit lines 62, the polycrystalline silicon film 158 and the polycrystalline silicon sidewalls 160 are patterned together, and buried conductors 162 of the polycrystalline silicon film are left in the through-holes 40 (FIG. 53A).

The through-holes 40 are not essentially filled with the polycrystalline silicon alone. For example, the polycrystalline silicon film and the tungsten silicide may be filled in the through-holes 40. As shown in FIG. 55, the polycrystalline silicon film, the tungsten silicide film and the silicon nitride film may be filled in the through-holes 40. Either structure can be used without trouble because contact is made at the entire bottoms of the through-holes 40.

It is preferable that an insulation film formed on the bit lines 62 are formed of silicon oxide film, whose dielectric constant is low, for the purpose of decreasing parasitic capacitances. In a case, however, that the insulation film on the bit lines 62 is used as an etching stopper, it is difficult to use silicon oxide film. In a case that the insulation film is used as an etching stopper, it is most effective that a laminated film of silicon oxide film and a silicon nitride film is formed on the bit lines 62.

Figure 53B:
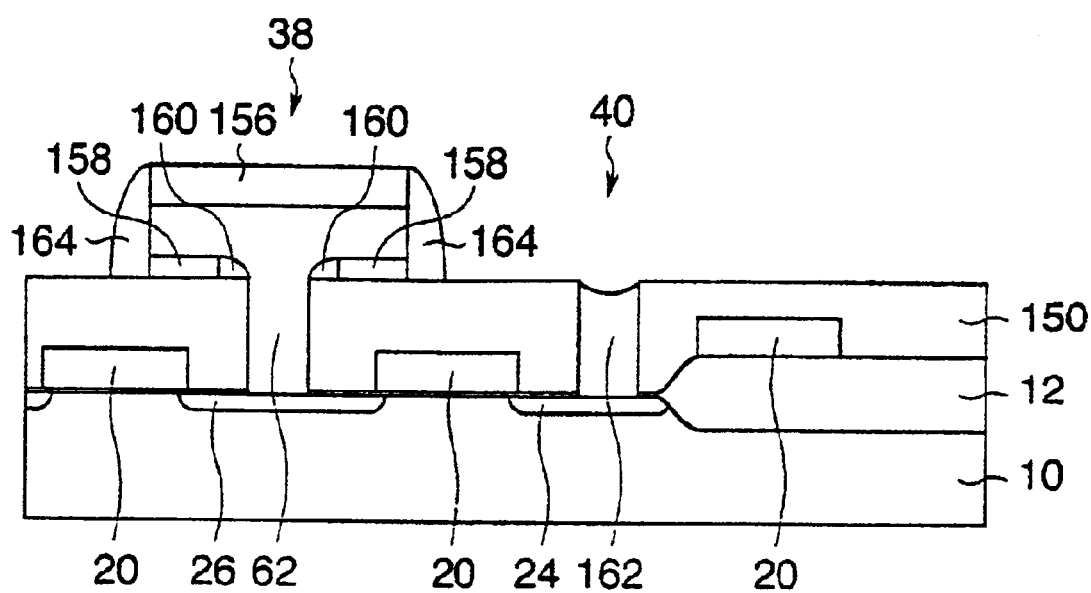

Then, an about 80 nm-thick silicon nitride film is deposited by CVD and etched vertically by RIE. Thus, sidewalls 164 are formed on the sidewalls of the bit lines 62, and the bit lines 62 are completely covered with the silicon nitride films 156 and the sidewalls 164 (FIG. 53B).

Figure 54A:
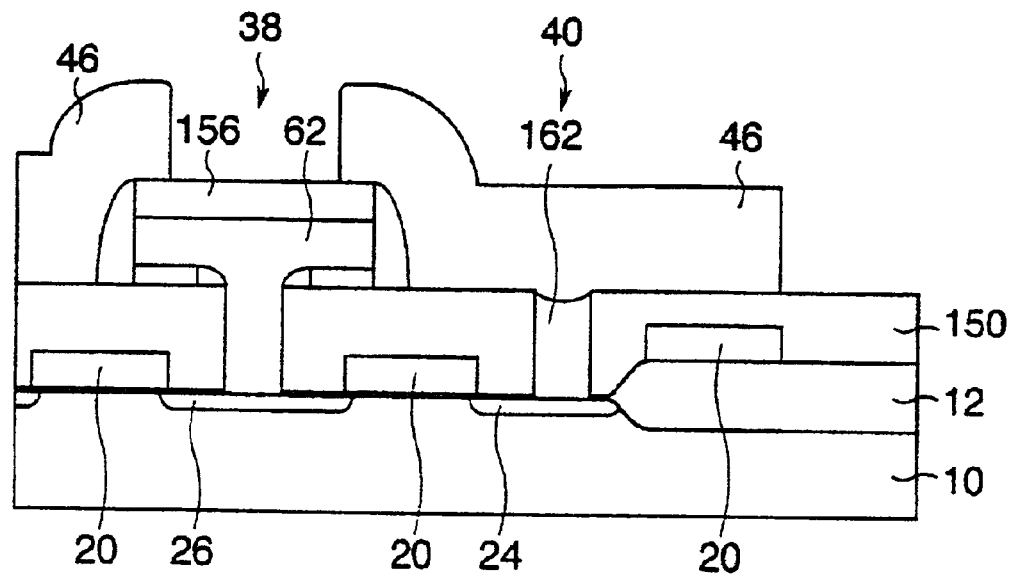
FIGS. 54A and 54B are sectional views of the semiconductor storage device according to the thirteenth embodiment in steps of a method for fabricating the semiconductor storage device (Part 3).
Figure 55:
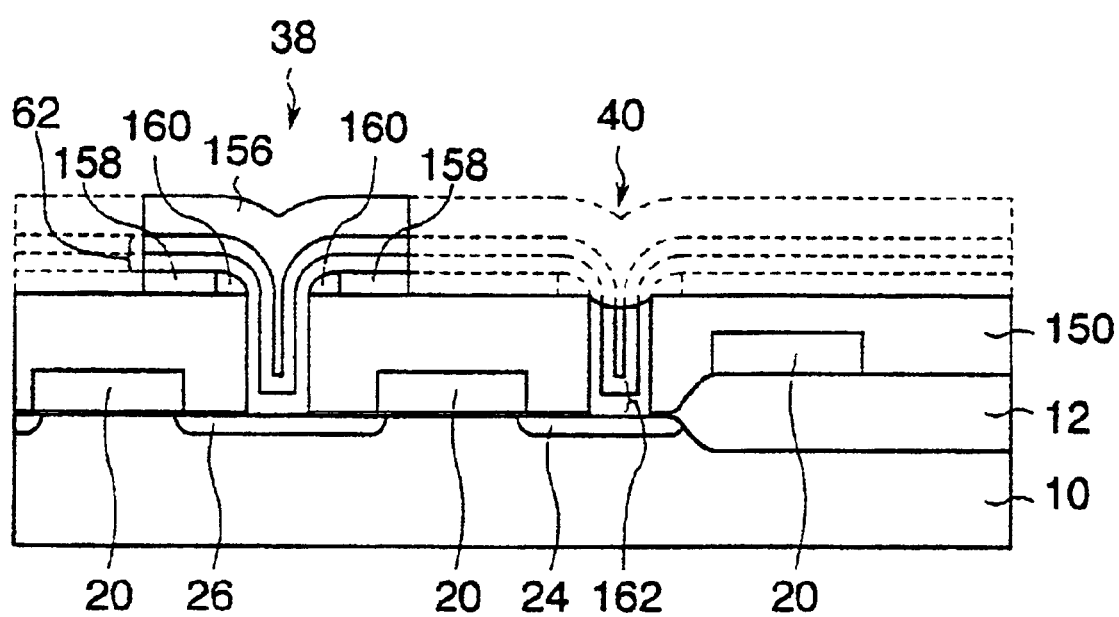
FIG. 55 is a diagrammatic sectional view of the semiconductor storage device according to one variation of the thirteenth embodiment of the present invention explaining a structure thereof.

Next, an about 500 nm-thick polycrystalline silicon film is deposited by CVD and patterned by the usual lithography and etching to form the capacitor storage electrodes 46 (FIG. 54A). By thus forming the capacitor storage electrodes 46, the capacitor storage electrodes 46 can be connected to the source diffused layers 24 without a masking step. One masking step can be omitted in comparison with the conventional method.

Subsequently, an about 5 nm-thick silicon nitride film is deposited by CVD, and the surface of the silicon nitride film is oxidized to form the capacitor dielectric films 48.

Figure 54B:
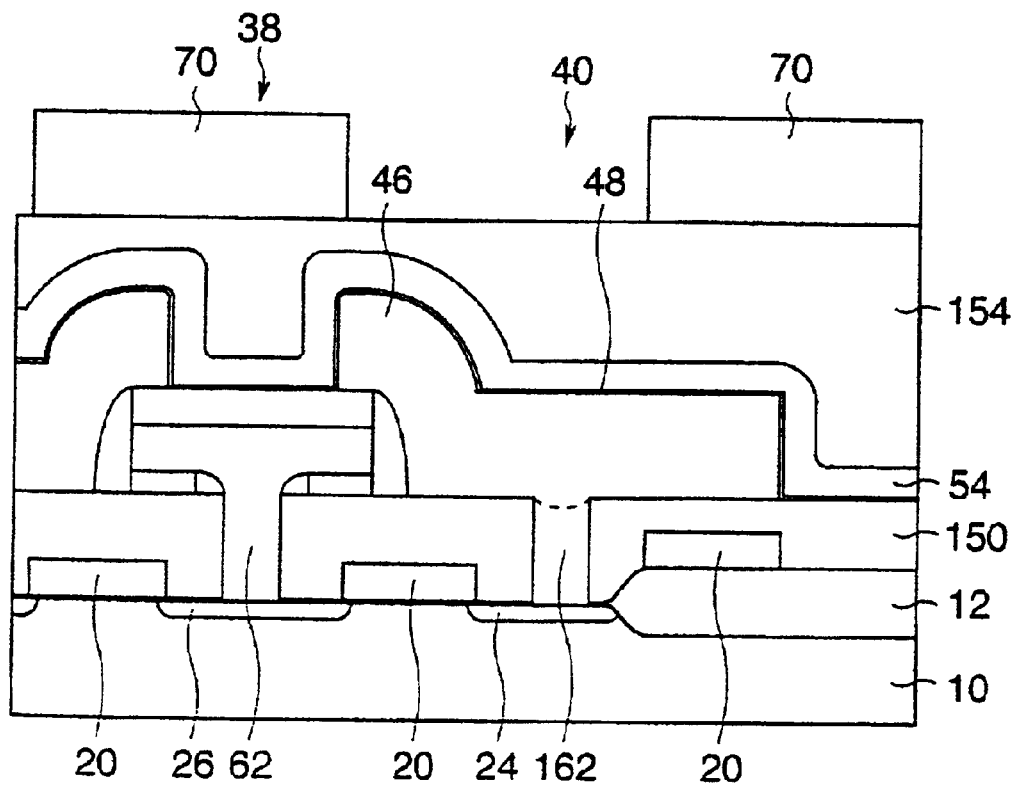

Then, an about 100 nm-thick polycrystalline silicon film is deposited by CVD and patterned by the usual lithography and etching to form the capacitor opposed electrodes 54 (FIG. 54B).

Next, an about 300 nm-thick BPSG film is deposited by CVD and then is reflowed to form the inter-layer insulation film 154.

Subsequently, through-holes are formed in a peripheral circuit region (not shown), and then a metal material, such as tungsten or others is deposited and patterned to form the wiring layers 70 (FIG. 55).

Thus, a DRAM comprising 1-transistor and 1-capacitor memory cells is constituted.

In the present embodiment, the memory capacitor cells are high, and a large height difference is present between the peripheral circuit region and the memory cell region, whereby the wiring layers 70 on the memory cells have a relaxed line width and interval.

In the present embodiment, the capacitor storage electrodes 46 are connected to the source diffused layers 24 through the buried conductors 162 buried in the through-holes 40 formed simultaneously with the formation of the through-holes 38, which (the buried conductors 162) are formed simultaneously with the formation of the bit lines 62. As a result, without adding a new step to the formation of the through-holes 40, advantageously the silicon nitride films 156 on the bit lines 62 are exposed to an etching atmosphere for a reduced period of time.

In covering the tops and the sidewalls of the bit line 62 with the insulation film, the buried conductors 164 are exposed, whereby, as in the conventional method, it is not necessary to form the contact through-holes, using a masking step. One masking step can be omitted.

Fourteenth Embodiment

The semiconductor storage device according to a fourteenth embodiment and the method for fabricating the same will be explained with reference to FIGS. 56 to 58B.

Figure 56:
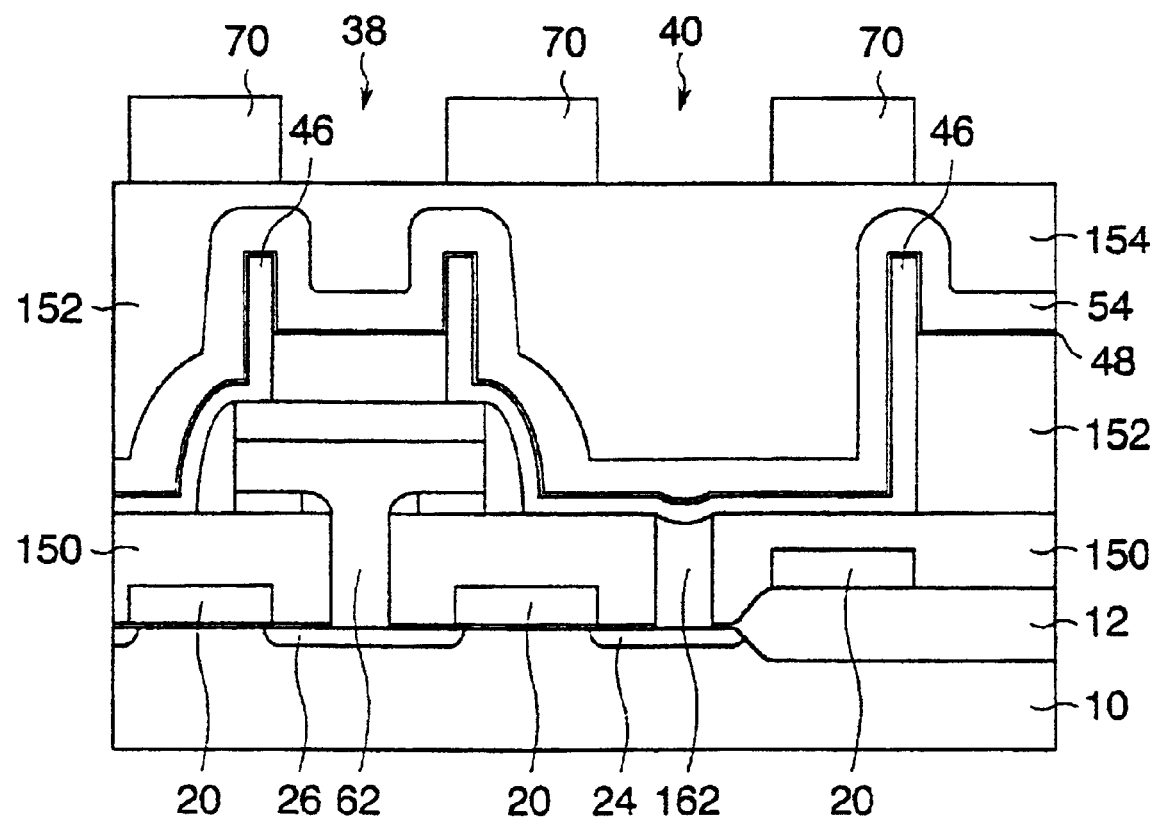
FIG. 56 is a diagrammatic sectional view of the semiconductor storage device according to a fourteenth embodiment explaining the structure thereof.

FIG. 56 is a diagrammatic sectional view of the semiconductor storage device according to the present embodiment, which explains the structure thereof. FIGS. 57A–57B and 58A–58B are sectional views of the semiconductor storage device in the steps of the method for fabricating the same, which explain the method.

In the semiconductor storage device according to the thirteenth embodiment, the memory cell capacitors are so high that a large height difference between the peripheral circuit region and the memory cell region is present. The wiring layers 70 on the memory cells must be designed on a relaxed wiring rule. The semiconductor storage device according to the present embodiment and the method for fabricating the same can solve this problem.

The semiconductor storage device according to the present embodiment is characterized in that an inter-layer insulation film 152 is formed on a peripheral circuit region, and a height difference between a memory cell region and the peripheral circuit region is small.

That is, in the peripheral circuit region the inter-layer insulation film has the three-layer structure of an inter-layer insulation films 150, 152, 154, and the inter-layer insulation films 150, 154 constitute the inter-layer insulation film in the memory cell region. Accordingly, the inter-layer insulation film of the peripheral circuit region is thicker by a thickness of the inter-layer insulation film 152, and a height difference between the memory cell region and the peripheral circuit region is small.

Then, the method for fabricating the semiconductor storage device according to the present embodiment will be explained.

Figure 57A:
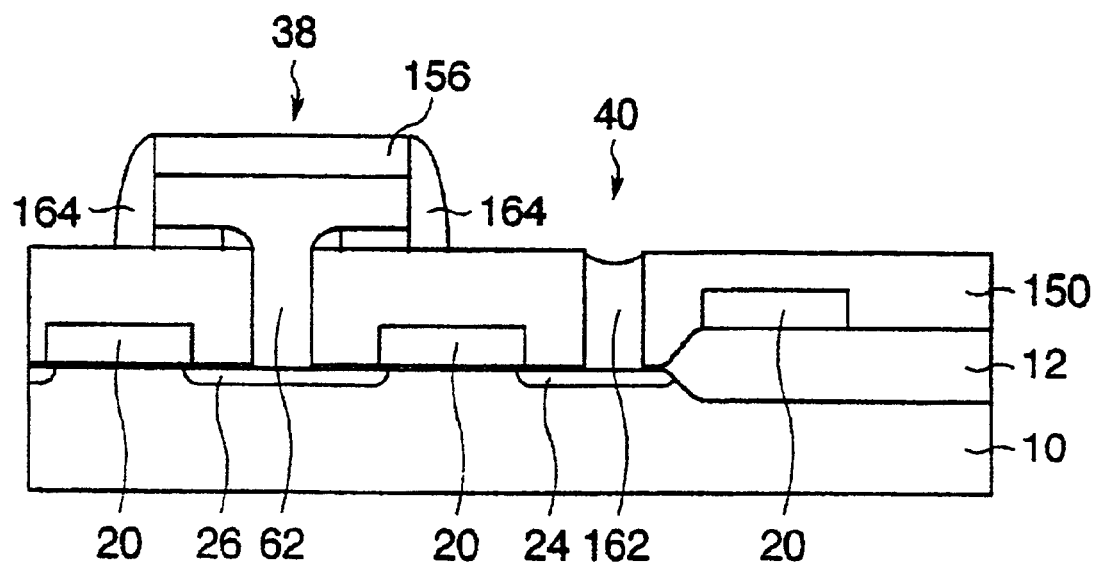
FIGS. 57A and 57B are sectional views of the semiconductor storage device according to the fourteenth embodiment in steps of a method for fabricating the semiconductor storage device (Part 1).

The semiconductor storage device is fabricated up to bit lines 62 and buried conductors 162 by following the same steps as the method for fabricating the semiconductor storage device according to the thirteenth embodiment shown in FIGS. 52A to 53B (FIG. 57A).

Next, an about 300 nm-thick BPSG film is deposited by CVD and then is reflowed or polished to form an inter-layer insulation film 152 having the surface planarized.

Figure 57B:
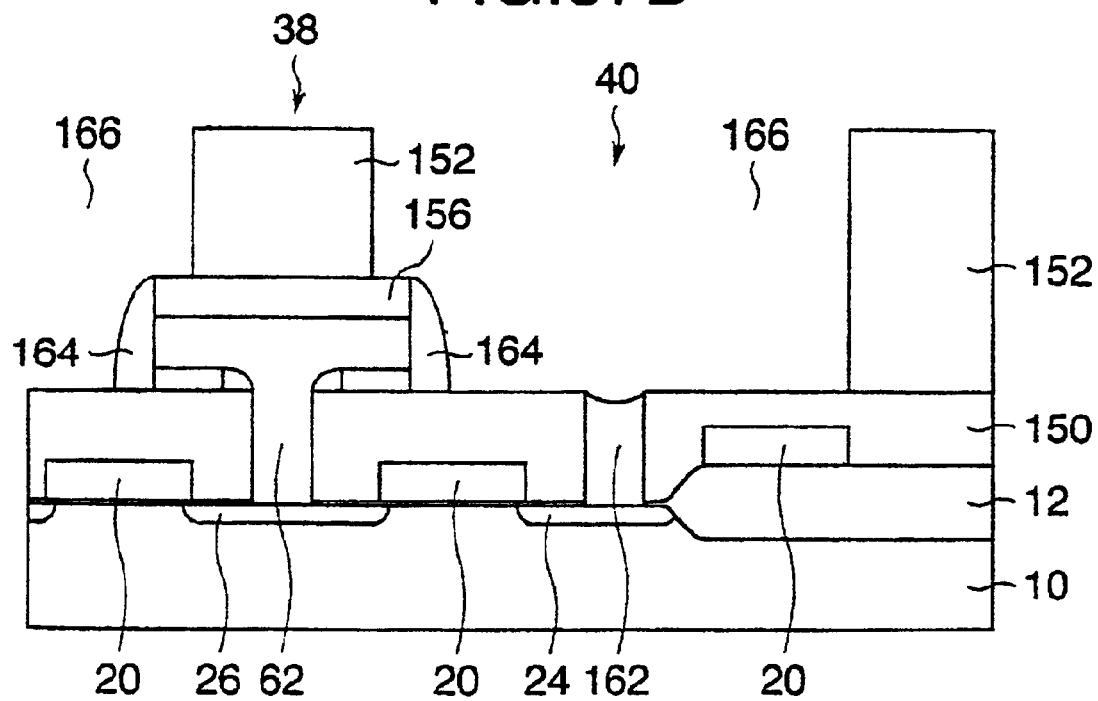

Subsequently, by using the usual lithography, and etching which is stopped at a silicon nitride film, through-holes 166 are formed in the inter-layer insulation film 152, and the buried conductors 162 are exposed with the bit lines 62 covered with the silicon nitride film 156 and sidewalls 164 (FIG. 57B).

Figure 58A:
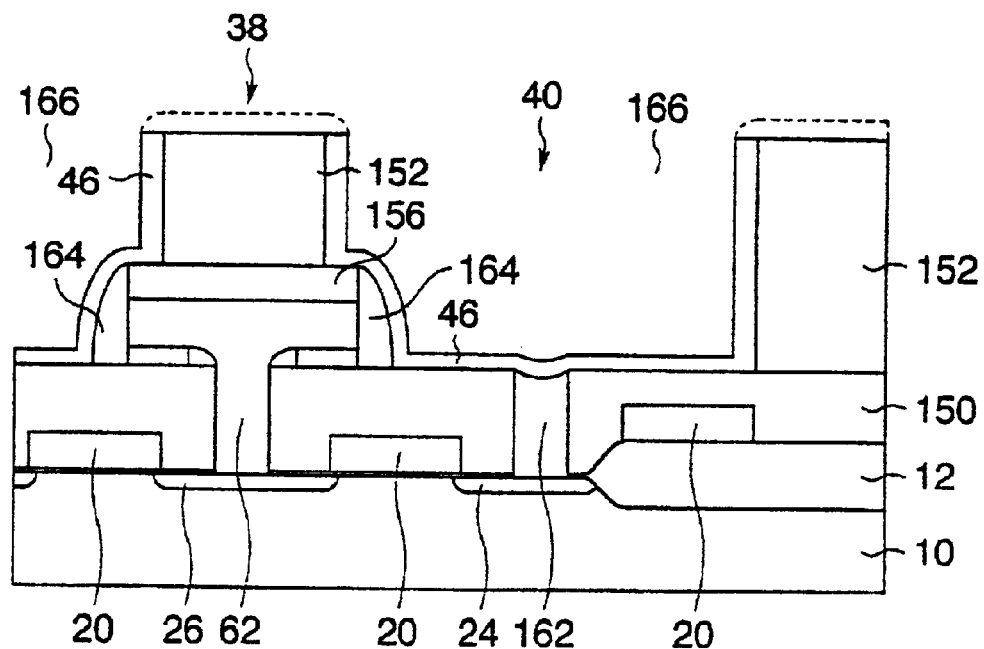
FIGS. 58A and 58B are sectional views of the semiconductor storage device according to the fourteenth embodiment in steps of a method for fabricating the semiconductor storage device (Part 2).
Figure 58B:
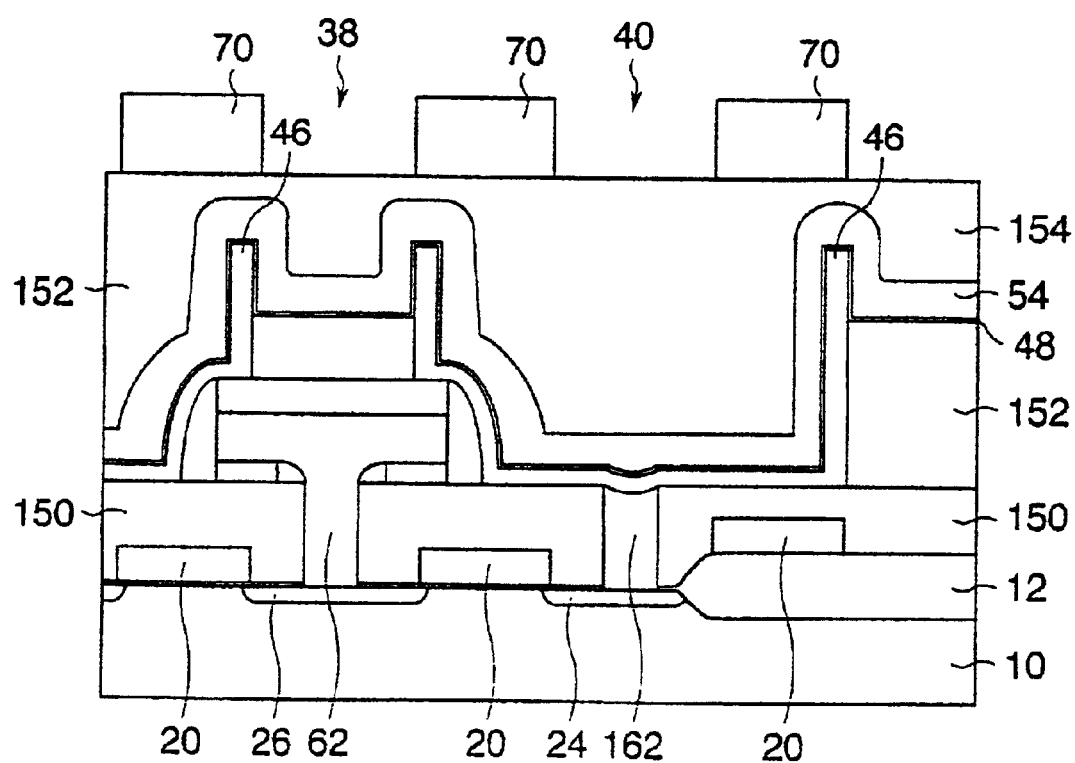

Then, an about 20 nm-thick polycrystalline silicon film is grown by CVD, and the surface is polished to form capacitor storage electrodes 46 in the openings 166. The capacitor storage electrodes 46 are connected to the buried conductors 162 at an upper part in the through-holes 40 (FIG. 58A).

In the polishing the method for fabricating the semiconductor storage device according to the ninth embodiment to the eleventh embodiment may be used so that pulverized objects and a polishing agent do not intrude into the openings 166.

Then, the inter-layer insulation film 152 is etched by 50 nm by wet etching using, e.g., a hydrofluoric acid-based aqueous solution. The thus etching of the top of the inter-layer insulation film 152 exposes a larger area of the capacitor storage electrodes 40, which increases a capacitance but increases a height difference between the memory cell and the peripheral circuit region. It is preferable that the etching is not conducted in a case that the height difference is significant.

Subsequently, the capacitor dielectric films 48, the capacitor-opposed electrodes 54, the inter-layer insulation film 154 and the wiring layers 70 are formed, and a DRAM comprising 1-transistor and 1-capacitor memory cells is constituted.

According to the method for fabricating the semiconductor storage device according to the present embodiment, a height difference in the inter-layer insulation film 154 between the memory cell region and the peripheral circuit region can be made small, which permits the wiring layers 70 to be arranged on a more precise design rule than in the semiconductor storage device according to the thirteenth embodiment.

As described above, according to the present embodiment, a height difference between the peripheral circuit region and the memory cell region can be made small, which allows the design rule of the wiring layers 70 to be micronized without adding to the number of the fabrication steps.

What is claimed:

1. A semiconductor device comprising:

a semiconductor substrate;

an insulating laminate formed over the semiconductor substrate, and including a lower part and a higher part formed over the lower part;

a first conductor formed in the higher part of the insulating laminate;

an insulator, having an etching characteristic different from the lower part and the higher part of the insulating laminate, formed between the lower part of the insulating laminate and the first conductor, a first contact hole formed through the higher part of the insulating laminate, penetrating inside peripheral edges of the first conductor, reaching the insulator; and a second conductor filled in the first contact hole and electrically connected to the first conductor at its side wall exposed in the first contact hole.

2. A semiconductor device according to claim 1, wherein a width of the first contact hole at the higher part and a width of the first contact hole at the first conductor are substantially the same.

3. A semiconductor device according to claim 1, further comprising:

a second contact hole penetrating the insulating laminate; and a third conductor filled in the second contact hole.

4. A semiconductor device according to claim 3, wherein the third conductor is electrically connected to the semiconductor substrate.

5. A semiconductor device according to claim 3, further comprising:

a fourth conductor formed between the semiconductor substrate and the insulating laminate, the fourth conductor being electrically connected to the third conductor.

6. A semiconductor device according to claim 3, wherein the second conductor and the third conductor are formed of the same conducting layer.

7. A semiconductor device comprising:

a first insulator formed over a semiconductor substrate;

a first conductor formed over the first insulator;

a second insulator covering the first conductor;

a third insulator, having an etching characteristic different from the first and the second insulators, formed between the first insulator and the first conductor;

a contact hole formed through the second insulator and inside peripheral edges of the first conductor, the contact hole reaching the third insulator; and a second conductor, filled in the contact hole, wherein the second conductor is electrically connected to the first conductor at its side wall exposed in the contact hole.

8. A semiconductor device according to claim 7, wherein a width of the contact hole at the second insulator and a width of the contact hole at the first conductor are substantially the same.

9. A semiconductor device according to claim 7, wherein an upper face of the first insulator is substantially flat.

10. A semiconductor device according to claim 7, wherein each of the first insulator and the second insulator is formed of silicon oxide film.

11. A semiconductor device according to claim 7, wherein the third insulator is formed of silicon nitride film.

12. A semiconductor device comprising:

a first insulator formed over a semiconductor substrate;

a first conductor formed over the first insulator;

a second insulator covering the first conductor;

a third insulator having an etching characteristic different from the first and the second insulators formed between the first insulator and the first conductor;

a first contact hole formed through the second insulator and inside peripheral edges of the first conductor, the first contact hole reaching the third insulator;

a second conductor, filled in the first contact hole, wherein the second conductor is electrically connected to the first conductor at its side wall exposed in the first contact hole;

a second contact hole exposing a surface of a third conductor through the first and second insulators; and a fourth conductor filled in the second contact hole, wherein the fourth conductor is electrically connected to the third conductor at the surface.

13. A semiconductor device according to claim 12, wherein the second conductor and the fourth conductor are formed of the same conducting layer.

14. A semiconductor device according to claim 1, wherein an upper face of the first insulator is substantially flat.

15. A semiconductor device according to claim 12, further comprising:

a fourth insulator having an etching characteristic different from the first insulator formed between the third conductor and the first insulator.

16. A semiconductor device according to claim 12, wherein each of the first insulator and the second insulator is formed of silicon oxide film.

17. A semiconductor device according to claim 12, wherein the third insulator is formed of silicon nitride film.

18. A semiconductor device according to claim 15, wherein the fourth insulator is formed of silicon nitride film.

19. A semiconductor device comprising:

a semiconductor substrate;

a first wiring formed over the semiconductor substrate;

a first insulator covering the first wiring and having a first planarized surface;

a second wiring formed over the first insulator;

a second insulator covering the second wiring and having a second planarized surface;

a third insulator having an etching characteristic different from the first and the second insulators formed between the first insulator and the second wiring;

a first contact hole extending from the second planarized surface to the first wiring through the second and first insulators;

a second contact hole extending from the second planarized surface through the second insulator, penetrating the second wiring, and reaching the third insulator, the second contact hole being shallower than the first contact hole, wherein a side wall of the second wiring is exposed in the second contact hole;

a first conductor filled in the first contact hole and electrically connected to the surface of the first wiring; and a second conductor filled in the second contact hole, wherein one end of the second conductor is electrically connected to the second wiring via the side wall exposed in the second contact hole.

20. A semiconductor device according to claim 19, wherein the first conductor and the second conductor are formed of the same conducting layer.

21. A semiconductor device according to claim 19, further comprising:

a fourth insulator having an etching characteristic different from the first insulator formed between the first wiring and the first insulator.

22. A semiconductor device according to claim 19, wherein each of the first insulator and the second insulator is formed of silicon oxide film.

23. A semiconductor device according to claim 19, wherein the third insulator is formed of silicon nitride film.

24. A semiconductor device according to claim 21, wherein the fourth insulator is formed of silicon nitride film.

* * * * *